United States Patent
Park et al.

(10) Patent No.: US 10,923,667 B2
(45) Date of Patent: Feb. 16, 2021

(54) ORGANOMETALLIC COMPOUND, COMPOSITION CONTAINING THE ORGANOMETALLIC COMPOUND, AND ORGANIC LIGHT-EMITTING DEVICE INCLUDING THE ORGANOMETALLIC COMPOUND

(71) Applicants: Samsung Electronics Co., Ltd., Suwon-si (KR); Samsung SDI Co., Ltd., Yongin-si (KR)

(72) Inventors: Sangho Park, Anyang-si (KR); Wataru Sotoyama, Yokohama (JP); Wook Kim, Suwon-si (KR); Eunsuk Kwon, Suwon-si (KR); Sangmo Kim, Hwaseong-si (KR); Jaejun Chang, Seoul (KR); Dmitry Kravchuk, Hwaseong-si (KR); Hyejin Bae, Suwon-si (KR); Yeonsook Chung, Seoul (KR); Youngmok Son, Hwaseong-si (KR); Namheon Lee, Suwon-si (KR); Jun Chwae, Seoul (KR); Sunghan Kim, Seongnam-si (KR)

(73) Assignees: SAMSUNG ELECTRONICS CO., LTD., Gyeonggi-do (KR); SAMSUNG SDI CO., LTD., Gyeonggi-do (KR)

(*) Notice: Subject to any disclaimer, the term of this patent is extended or adjusted under 35 U.S.C. 154(b) by 302 days.

(21) Appl. No.: 15/915,131

(22) Filed: Mar. 8, 2018

(65) Prior Publication Data
US 2018/0261780 A1  Sep. 13, 2018

(30) Foreign Application Priority Data

Mar. 8, 2017 (KR) .................. 10-2017-0029608
Mar. 6, 2018 (KR) .................. 10-2018-0026443

(51) Int. Cl.
| H01L 51/00 | (2006.01) |
| C07F 15/00 | (2006.01) |
| H01L 51/50 | (2006.01) |
| C09K 11/06 | (2006.01) |
| H01L 51/52 | (2006.01) |
| H01L 51/56 | (2006.01) |

(52) U.S. Cl.
CPC ...... *H01L 51/0085* (2013.01); *C07F 15/0033* (2013.01); *C09K 11/06* (2013.01); *H01L 51/0067* (2013.01); *H01L 51/0072* (2013.01); *H01L 51/50* (2013.01); *C09K 2211/1059* (2013.01); *C09K 2211/185* (2013.01); *H01L 51/001* (2013.01); *H01L 51/5012* (2013.01); *H01L 51/5072* (2013.01); *H01L 51/5088* (2013.01); *H01L 51/5092* (2013.01); *H01L 51/5096* (2013.01); *H01L 51/5206* (2013.01); *H01L 51/56* (2013.01); *H01L 2251/308* (2013.01); *H01L 2251/558* (2013.01)

(58) Field of Classification Search
CPC .................................................. C07F 15/0033
See application file for complete search history.

(56) References Cited

U.S. PATENT DOCUMENTS

| 7,585,573 | B2 | 9/2009 | Lee et al. |
| 7,846,763 | B2 | 12/2010 | Bold et al. |
| 9,478,757 | B2 | 10/2016 | Feldman et al. |
| 2007/0190359 | A1 | 8/2007 | Knowles et al. |
| 2015/0287936 | A1 | 10/2015 | Inoue et al. |
| 2017/0365802 | A1 | 12/2017 | Bold et al. |
| 2018/0198080 | A1 | 7/2018 | Noh et al. |
| 2018/0261780 | A1 | 9/2018 | Park et al. |

FOREIGN PATENT DOCUMENTS

| EP | 3053986 A1 | 8/2016 |
| JP | 2008-069221 A | 3/2008 |
| JP | 5181448 B2 | 1/2013 |
| JP | 2013-041990 A | 2/2013 |

(Continued)

OTHER PUBLICATIONS

English machine translation of Sugino et al. JP 2014-111549A (Year: 2014).*

(Continued)

*Primary Examiner* — Peter F Godenschwager
(74) *Attorney, Agent, or Firm* — Cantor Colburn LLP

(57) ABSTRACT

An organometallic compound represented by Formula 1:

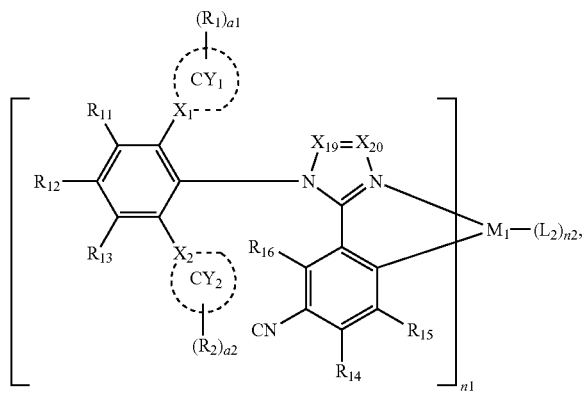

Formula 1 wherein, in Formula 1, groups and variables are the same as described in the specification.

20 Claims, 1 Drawing Sheet

(56) References Cited

FOREIGN PATENT DOCUMENTS

| JP | 2014-111549 A | 6/2014 |
|---|---|---|
| JP | 2014-152151 A | 8/2014 |
| JP | 2014-214127 A | 11/2014 |
| JP | 5742581 B2 | 5/2015 |
| JP | 2008-069221 A | 2/2017 |
| WO | 2002-002714 A2 | 1/2002 |
| WO | 2002-002714 A2 | 2/2002 |
| WO | 0215645 A1 | 2/2002 |
| WO | 2005-019373 A2 | 3/2005 |
| WO | 2005-123873 A1 | 12/2005 |
| WO | 2011-052516 A1 | 5/2011 |
| WO | 2015-130780 A1 | 9/2015 |

OTHER PUBLICATIONS

Sugino, Motoaki et al. "Preparation of (2-phenylimidazole) iridium complexes, organic electroluminescence element materials, and organic electroluminescent devices using these complexes" XP002783040, 5 pp.

Ruben Seifert et al. "Chemical degradation mechanisms of highly efficient blue phosphorescent emitters used for organic light emitting diodes", Organic Electronics 14 (2013) 115-123.

Extended European Search Report issued by the European Patent Office dated Jul. 27, 2018 in the examination of the European Patent Application No. 18160440.6-1109.

Deguang Huang et al., "Fast Carbon Dioxide Fixation by 2,6-Pyridinedicarboxamidatonickel(II)-hydroxide Complexes: Influence of Changes in Reactive Site Environment on Reaction Rates," Inorg. Chem. 2011, 50, 10070-10081.

Krishna Kumar Gnanasekaran et al., "Efficient synthesis of 1,3,4-oxadiazoles promoted by NH4Cl," Tetrahedron Letters 55 (2014) 6776-6778.

N. I. Korotkikh et al., "Recyclization of 1,3,4-Oxadiazoles and Bis-1,3,4-Oxadiazoles Into 1,2,4-Triazole Derivatives. Synthesis of 5-Unsubstituted 1,2,4-Triazoles," Chemistry of Heterocyclic Compounds, vol. 41, No. 7, 2005.

* cited by examiner

10

| 19 |
|----|
| 15 |
| 11 |

ORGANOMETALLIC COMPOUND, COMPOSITION CONTAINING THE ORGANOMETALLIC COMPOUND, AND ORGANIC LIGHT-EMITTING DEVICE INCLUDING THE ORGANOMETALLIC COMPOUND

CROSS-REFERENCE TO RELATED APPLICATION

This application claims priority to Korean Patent Application Nos. 10-2017-0029608, filed on Mar. 8, 2017, and 10-2018-0026443, filed on Mar. 6, 2018, in the Korean Intellectual Property Office, and all the benefits accruing therefrom under 35 U.S.C. § 119, the content of which is incorporated herein in its entirety by reference.

BACKGROUND

1. Field

One or more embodiments relate to an organometallic compound, a composition containing the organometallic compound, and an organic light-emitting device including the organometallic compound.

2. Description of the Related Art

Organic light-emitting devices (OLEDs) are self-emission devices that produce full-color images, and also have wide viewing angles, high contrast ratios, short response times, and excellent characteristics in terms of brightness, driving voltage, and response speed, compared to devices in the art.

A typical organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state, thereby generating light.

Various types of organic light emitting devices are known. However, there still remains a need in OLEDs having low driving voltage, high efficiency, high brightness, and long lifespan.

SUMMARY

One or more embodiments include a novel organometallic compound, a composition containing the organometallic compound, and an organic light-emitting device including the organometallic compound.

Additional aspects will be set forth in part in the description which follows and, in part, will be apparent from the description, or may be learned by practice of the presented embodiments.

According to one or more embodiments, an organometallic compound is represented by Formula 1:

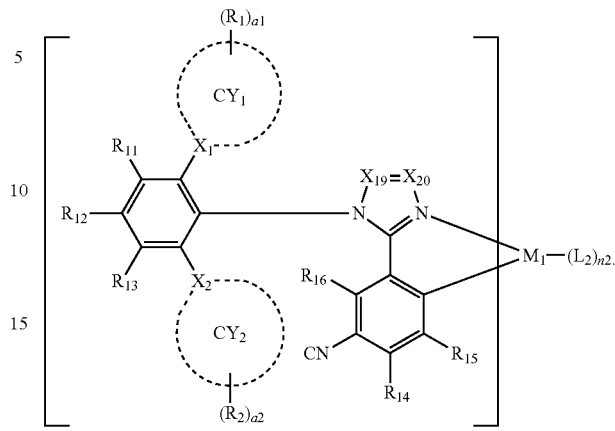

Formula 1

In Formula 1, $M_1$ may be selected from a first-row transition metal of the Periodic Table of Elements, a second-row transition metal of the Periodic Table of Elements, and a third-row transition metal of the Periodic Table of Elements, n1 may be 1, 2, or 3, $L_2$ may be a monodentate ligand or a bidentate ligand, n2 may be 0, 1, 2, 3, or 4, wherein, when n2 is two or more, two or more groups $L_2$ may be identical to or different from each other, $X_1$ and $X_2$ may each independently be carbon or nitrogen, $CY_1$ and $CY_2$ may each independently be a $C_5$-$C_{30}$ carbocyclic group or a $C_2$-$C_{30}$ heterocyclic group, $X_{19}$ may be N or $C(R_{19})$, and $X_{20}$ may be N or $C(R_{20})$, provided that at least one of $X_{19}$ and $X_{20}$ is N, $R_1$, $R_2$, $R_{11}$ to $R_{16}$, $R_{19}$, and $R_{20}$ may each independently be selected from hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, two or more neighboring groups selected from $R_1$, $R_2$, $R_{11}$ to $R_{13}$, $CY_1$, and $CY_2$ may optionally be linked to form a substituted or unsubstituted $C_5$-$C_{30}$ carbocyclic group or a substituted or unsubstituted $C_2$-$C_{30}$ heterocyclic group, a1 and a2 may each independently be an integer from 0 to 5, at least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

According to one or more embodiments, a composition containing the organometallic compound includes a first organometallic compound represented by Formula 1 which includes at least one deuterium and a second organometallic compound represented by Formula 2:

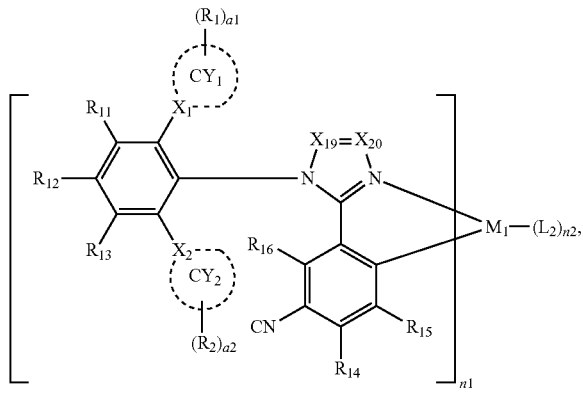

Formula 1

-continued

Formula 2

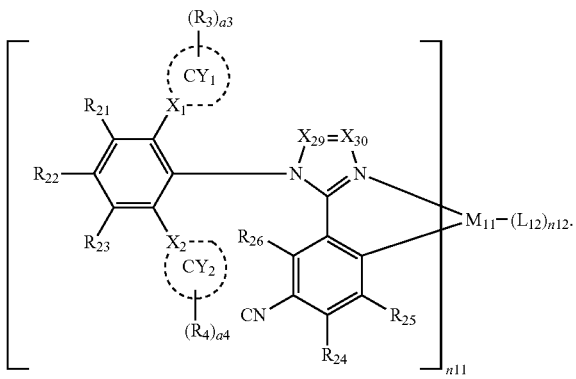

In Formulae 1 and 2, $M_1$ and $M_{11}$ may each independently be selected from a first-row transition metal of the Periodic Table of Elements, a second-row transition metal of the Periodic Table of Elements, and a third-row transition metal of the Periodic Table of Elements, n1 and n11 may each independently be 1, 2, or 3, $L_2$ and $L_{12}$ may each independently be a monodentate ligand or a bidentate ligand, n2 and n12 may each independently be 0, 1, 2, 3, or 4, wherein, when n2 is two or more, two or more groups $L_2$ may be identical to or different from each other, and when n12 is two or more, two or more groups $L_{12}$ may be identical to or different from each other, $X_1$ to $X_4$ may each independently be carbon or nitrogen, $CY_1$ to $CY_4$ may each independently be a $C_5$-$C_{30}$ carbocyclic group or a $C_2$-$C_{30}$ heterocyclic group, $X_{19}$ may be N or $C(R_{19})$, and $X_{20}$ may be N or $C(R_{20})$, provided that at least one of $X_{19}$ and $X_{20}$ is N, $X_{29}$ may be N or $C(R_{29})$, and $X_{30}$ may be N or $C(R_{30})$, provided that at least one of $X_{29}$ and $X_{30}$ is N, $R_1$, $R_2$, $R_{11}$ to $R_{16}$, $R_{19}$, and $R_{20}$ may each independently be selected from hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, two or more neighboring groups selected from $R_1$, $R_2$, $R_{11}$ to $R_{13}$, $CY_1$, and $CY_2$ may optionally be linked to form a substituted or unsubstituted $C_5$-$C_{30}$ carbocyclic group or a substituted or unsubstituted $C_2$-$C_{30}$ heterocyclic group, a1 and a2 may each independently be an integer from 0 to 5, i) $X_{19}$ may be $C(R_{19})$, $X_{20}$ may be N, and at least one of $R_1$, $R_2$, $R_{11}$ to $R_{16}$, and $R_{19}$ may be a deuterium-containing substituent; ii) $X_{19}$ may be N, $X_{20}$ may be $C(R_{20})$, and at least one of $R_1$, $R_2$, $R_{11}$ to $R_{16}$, and $R_{20}$ may be a deuterium-containing substituent; or iii) $X_{19}$ and $X_{20}$ may each be N, and at least one of $R_1$, $R_2$, and $R_{11}$ to $R_{16}$ may be a deuterium-containing substituent, $R_3$, $R_4$, $R_{21}$ to $R_{26}$, $R_{29}$, and $R_{30}$ may each independently be selected from hydrogen, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, two or more neighboring groups selected from $R_3$, $R_4$, $R_{21}$ to $R_{23}$, $CY_3$, and $CY_4$ may optionally be linked to form a substituted or unsubstituted $C_5$-$C_{30}$ carbocyclic group or a substituted or unsubstituted $C_2$-$C_{30}$ heterocyclic group, a3 and a4 may each independently be an integer from 0 to 5, and $R_3$, $R_4$, $R_{21}$ to $R_{26}$, $R_{29}$, and $R_{30}$ may each be a deuterium-free substituent.

According to one or more embodiments, an organic light-emitting device includes:
a first electrode;
a second electrode; and
an organic layer disposed between the first electrode and the second electrode, wherein the organic layer includes an emission layer, and
wherein the organic layer includes at least one organometallic compound or a composition containing the organometallic compound.

The organometallic compound may act as dopant in the organic layer.

BRIEF DESCRIPTION OF THE DRAWING

These and/or other aspects will become apparent and more readily appreciated from the following description of the embodiments, taken in conjunction with the FIGURE, which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An organometallic compound according to an embodiment is represented by Formula 1 below:

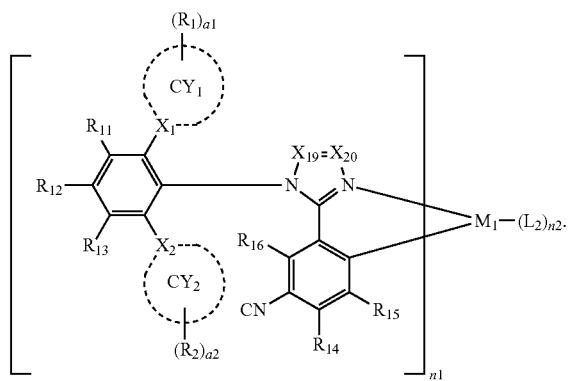

Formula 1

$M_1$ in Formula 1 may be selected from a first-row transition metal of the Periodic Table of Elements, a second-row transition metal of the Periodic Table of Elements, and a third-row transition metal of the Periodic Table of Elements.

For example, $M_1$ may be selected from iridium (Ir), platinum (Pt), osmium (Os), titanium (Ti), zirconium (Zr), hafnium (Hf), europium (Eu), terbium (Tb), thulium (Tm), and rhodium (Rh).

In an embodiment, $M_1$ may be iridium, but embodiments of the present disclosure are not limited thereto.

n1 in Formula 1 may be 1, 2, or 3, wherein, when n1 is two or more, two or more ligands represented by

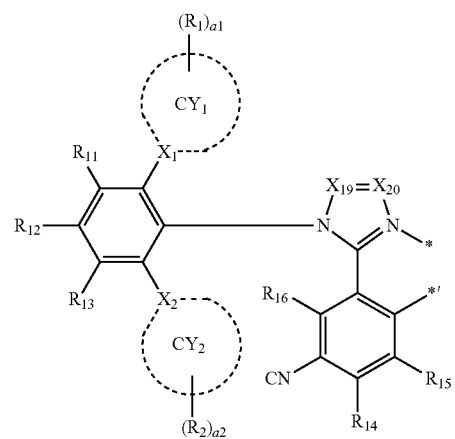

in Formula 1 (wherein * and *' each indicate a binding site to $M_1$ in Formula 1) may be identical to or different from each other, $L_2$ may be a monodentate ligand or a bidentate ligand, and n2 may be 0, 1, 2, 3, or 4, wherein, when n2 is two or more, two or more groups $L_2$ may be identical to or different from each other. $L_2$ is the same as described below.

In an embodiment, in Formula 1, $M_1$ may be Ir or Os, and the sum of n1 and n2 may be 3 or 4; or $M_1$ may be Pt, and the sum of n1 and n2 may be 2.

In an embodiment, in Formula 1, $M_1$ may be Ir, n1 may be 3, and n2 may be 0, but embodiments of the present disclosure are not limited thereto.

In an embodiment, in Formula 1, $M_1$ may be Ir, n1 may be 3, n2 may be 0, and three ligands represented by

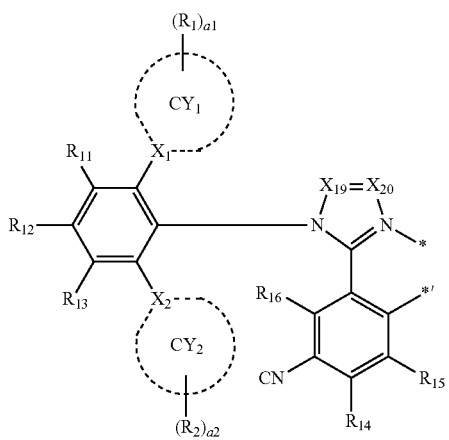

may be identical to or different from one another.

$X_1$ and $X_2$ in Formula 1 may each independently be carbon or nitrogen.

In an embodiment, $X_1$ and $X_2$ may each be carbon, but embodiments of the present disclosure are not limited thereto.

$CY_1$ and $CY_2$ in Formula 1 may each independently be a $C_5$-$C_{30}$ carbocyclic group or a $C_2$-$C_{30}$ heterocyclic group.

For example, $CY_1$ and $CY_2$ may each independently be selected from a cyclopentene group, a cyclohexene group, a benzene group, a pyridine group, a pyrimidine group, a pyridazine group, a pyrazine group, a triazine group, a pyrrole group, a pyrazole group, an imidazole group, a triazole group, an oxazole group, an isoxazole group, an oxadiazole group, a thiazole group, an isothiazole group, and a thiadiazole group.

In an embodiment, $CY_1$ and $CY_2$ may each independently be a benzene group, a pyridine group, or a pyrimidine group.

In one or more embodiments, $CY_1$ and $CY_2$ may each be a benzene group, but embodiments of the present disclosure are not limited thereto.

In Formula 1, $X_{19}$ may be N or $C(R_{19})$, and $X_{20}$ may be N or $C(R_{20})$, provided that at least one of $X_{19}$ and $X_{20}$ is N.

In an embodiment, one of $X_{19}$ and $X_{20}$ may be N.

In one or more embodiments, both $X_{19}$ and $X_{20}$ may be N at the same time.

For example, in Formula 1, $X_{19}$ may be $C(R_{19})$, and $X_{20}$ may be N.

In an embodiment, in Formula 1, $X_{19}$ may be N, and $X_{20}$ may be $C(R_{20})$.

$R_1$, $R_2$, $R_{11}$ to $R_{16}$, $R_{19}$, and $R_{20}$ in Formula 1 may each independently be selected from hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —B(Q$_6$)(Q$_7$), and —P(=O)(Q$_8$)(Q$_9$). $Q_1$ to $Q_9$ are each independently the same as described herein.

For example, $R_1$, $R_2$, $R_{11}$ to $R_{16}$, $R_{19}$, and $R_{20}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and
—N(Q$_1$)(Q$_2$), —Si(Q$_3$)(Q$_4$)(Q$_5$), —B(Q$_6$)(Q$_7$), and —P(=O)(Q$_8$)(Q$_9$), and
Q$_1$ to Q$_9$ may each independently be selected from:
—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;
an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and
an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments of the present disclosure are not limited thereto.
In an embodiment, R$_1$, R$_2$, R$_{11}$ to R$_{16}$, R$_{19}$, and R$_{20}$ may each independently be selected from:

hydrogen, deuterium, —F, a cyano group, a nitro group, —SF$_5$, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group;
a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group, each substituted with at least one selected from deuterium, —F, —CD$_3$, —CD$_2$H, —CDH$_2$, —CF$_3$, —CF$_2$H, —CFH$_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group; and
—N(Q$_1$)(Q$_2$), —Si(Q$_3$)(Q$_4$)(Q$_5$), —B(Q$_6$)(Q$_7$), and —P(=O)(Q$_8$)(Q$_9$), and
Q$_1$ to Q$_9$ are each independently the same as described herein.
In Formula 1, two or more neighboring groups selected from R$_1$, R$_2$, R$_{11}$ to R$_{13}$, CY$_1$, and CY$_2$ may optionally be linked to form a $C_5$-$C_{30}$ carbocyclic group unsubstituted or substituted with at least one R$_{101}$ (for example, a 5-membered or 6-membered carbocyclic group unsubstituted or substituted with at least one R$_{101}$) or a $C_2$-$C_{30}$ heterocyclic group unsubstituted or substituted with at least one R$_{101}$ (for example, a 5-membered or 6-membered heterocyclic group unsubstituted or substituted with at least one R$_{101}$). R$_{101}$ is the same as described in connection with R$_1$.
a1 and a2 in Formula 1 respectively indicate the number of groups R$_1$ and the number of groups R$_2$ and may each independently be an integer from 0 to 5.

For example, a1 and a2 may each independently be 0, 1, or 2, but embodiments of the present disclosure are not limited thereto.

In an embodiment, $R_1$, $R_2$, $R_{11}$ to $R_{16}$, $R_{19}$, and $R_{20}$ in Formula 1 may each independently be selected from hydrogen, deuterium, —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, —CD$_2$CDH$_2$, —CF$_3$, —CF$_2$H, —CFH$_2$, groups represented by Formulae 9-1 to 9-24, groups represented by Formulae 10-1 to 10-62, and —Si(Q$_3$)(Q$_4$)(Q$_5$), but embodiments of the present disclosure are not limited thereto:

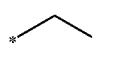

Formula 9-1

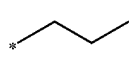

Formula 9-2

Formula 9-3

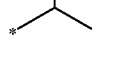

Formula 9-4

Formula 9-5

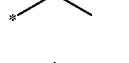

Formula 9-6

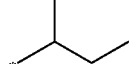

Formula 9-7

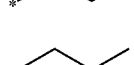

Formula 9-8

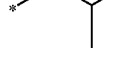

Formula 9-9

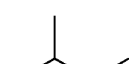

Formula 9-10

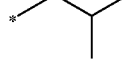

Formula 9-11

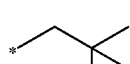

Formula 9-12

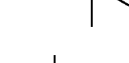

Formula 9-13

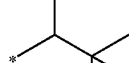

Formula 9-14

-continued

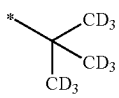

Formula 9-15

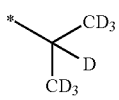

Formula 9-16

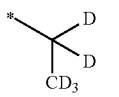

Formula 9-17

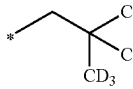

Formula 9-18

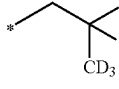

Formula 9-19

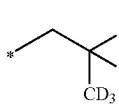

Formula 9-20

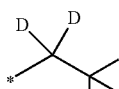

Formula 9-21

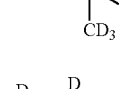

Formula 9-22

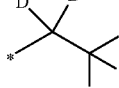

Formula 9-23

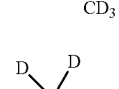

Formula 9-24

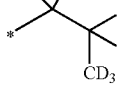

Formula 10-1

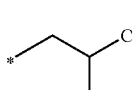

Formula 10-2

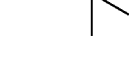

Formula 10-3

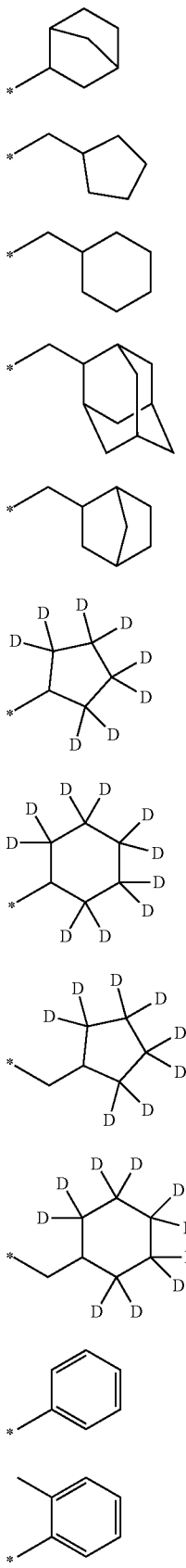
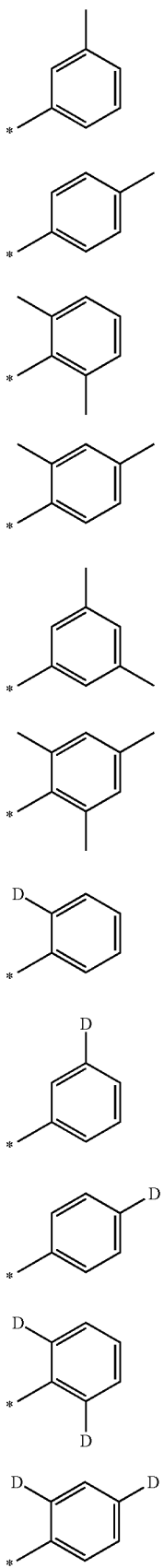
Formula 10-4
Formula 10-5
Formula 10-6
Formula 10-7
Formula 10-8
Formula 10-9
Formula 10-10
Formula 10-11
Formula 10-12
Formula 10-13
Formula 10-14
Formula 10-15
Formula 10-16
Formula 10-17
Formula 10-18
Formula 10-19
Formula 10-20
Formula 10-21
Formula 10-22
Formula 10-23
Formula 10-24
Formula 10-25

| | |
|---|---|
| Formula 10-26 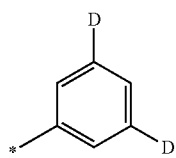 | Formula 10-36 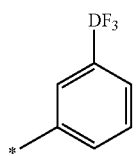 |
| Formula 10-27 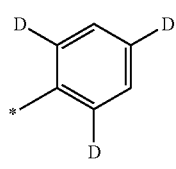 | Formula 10-37 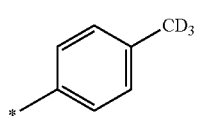 |
| Formula 10-28 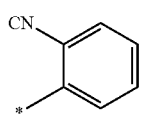 | Formula 10-38 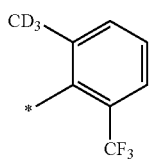 |
| Formula 10-29 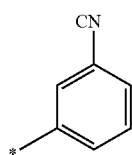 | Formula 10-39 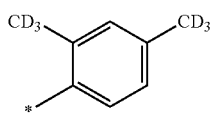 |
| Formula 10-30 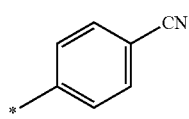 | Formula 10-40 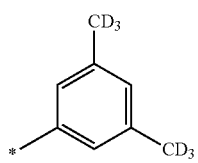 |
| Formula 10-31 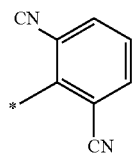 | Formula 10-41 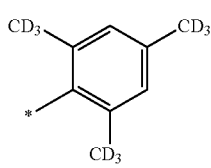 |
| Formula 10-32 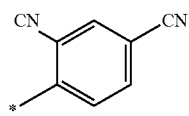 | Formula 10-42 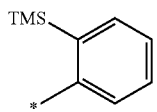 |
| Formula 10-33 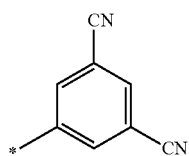 | Formula 10-43 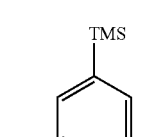 |
| Formula 10-34 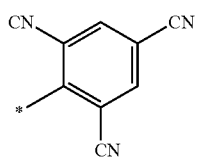 | Formula 10-44 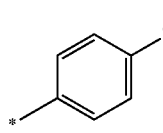 |
| Formula 10-35 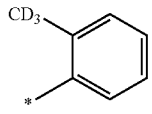 | Formula 10-45 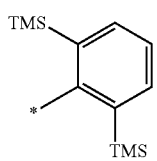 |

-continued
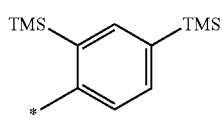
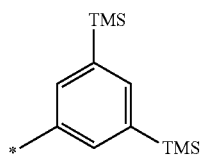
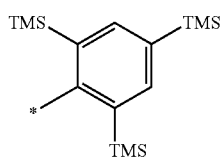
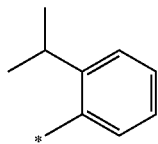
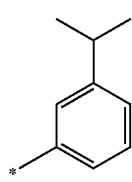
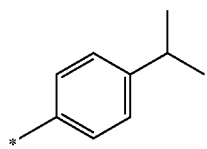
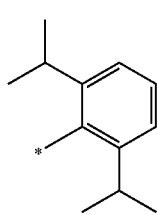
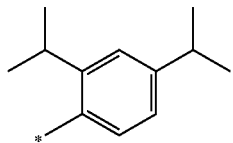
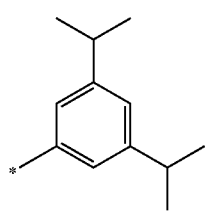
-continued
Formula 10-46
Formula 10-47
Formula 10-48
Formula 10-49
Formula 10-50
Formula 10-51
Formula 10-52
Formula 10-53
Formula 10-54
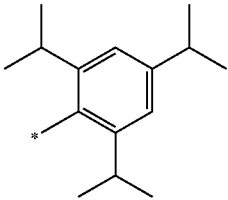
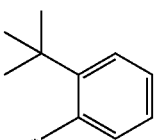
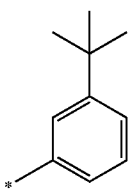
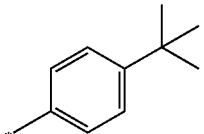
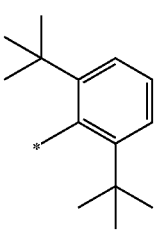
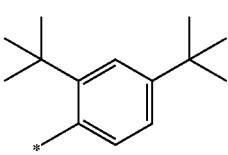
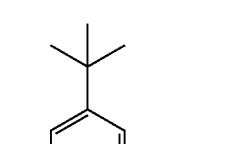
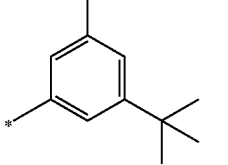
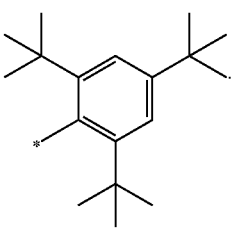
Formula 10-55
Formula 10-56
Formula 10-57
Formula 10-58
Formula 10-59
Formula 10-60
Formula 10-61
Formula 10-62

* in Formulae 9-1 to 9-24 and 10-1 to 10-62 indicates a binding site to a neighboring atom.

In an embodiment, in Formula 1, i) $X_{19}$ may be $C(R_{19})$, $X_{20}$ may be N, and at least one of $R_1$, $R_2$, $R_{11}$ to $R_{16}$, and $R_{19}$ may be a deuterium-containing substituent;

ii) $X_{19}$ may be N, $X_{20}$ may be $C(R_{20})$, and at least one of $R_1$, $R_2$, $R_{11}$ to $R_{16}$, and $R_{20}$ may be a deuterium-containing substituent; or iii) $X_{19}$ and $X_{20}$ may each be N, and at least one of $R_1$, $R_2$, and $R_{11}$ to $R_{16}$ may be a deuterium-containing substituent, and the deuterium-containing substituent may be selected from:

deuterium; and a $C_1$-$C_{20}$ alkyl group, a $C_1$-$C_{20}$ alkoxy group, and a phenyl group, each substituted with at least one deuterium.

For example, the deuterium-containing substituent may be selected from:

deuterium; and a methyl group, an ethyl group, an n-propyl group, an iso-propyl group, an n-butyl group, a sec-butyl group, an iso-butyl group, a tert-butyl group, an n-pentyl group, an iso-pentyl group, a 1-methylbutyl group, a 2-methylbutyl group, a neo-pentyl group, a 1,2-dimethylpropyl group, and a tert-pentyl group, each substituted with at least one deuterium.

In an embodiment, the deuterium-containing substituent may be selected from:

deuterium; and a methyl group, an ethyl group, an n-propyl group, an iso-propyl group, an n-butyl group, a sec-butyl group, an iso-butyl group, and a tert-butyl group, each substituted with at least one deuterium, but embodiments of the present disclosure are not limited thereto.

In an embodiment, the deuterium-containing substituent may be selected from:

—D, —CH$_2$D, —CHD$_2$, —CD$_3$, —CH$_2$CH$_2$D, —CH$_2$CHD$_2$, —CH$_2$CD$_3$, —CHDCH$_3$, —CHDCH$_2$D, —CHDCHD$_2$, —CHDCD$_3$, —CD$_2$CH$_3$, —CD$_2$CH$_2$D, —CD$_2$CHD$_2$, —CD$_2$CD$_3$, —CH$_2$CH$_2$CH$_2$D, —CH$_2$CH$_2$CHD$_2$, —CH$_2$CH$_2$CD$_3$, —CH$_2$CHDCH$_3$, —CH$_2$CHDCH$_2$D, —CH$_2$CHDCHD$_2$, —CH$_2$CHDCD$_3$, —CH$_2$CD$_2$CH$_3$, —CH$_2$CD$_2$CH$_2$D, —CH$_2$CD$_2$CHD$_2$, —CH$_2$CD$_2$CD$_3$, —CHDCH$_2$CH$_3$, —CHDCH$_2$CH$_2$D, —CHDCH$_2$CHD$_2$, —CHDCH$_2$CD$_3$, —CHDCHDCH$_3$, —CHDCHDCH$_2$D, —CHDCHDCHD$_2$, —CHDCHDCD$_3$, —CHDCD$_2$CH$_3$, —CHDCD$_2$CH$_2$D, —CHDCD$_2$CHD$_2$, —CHDCD$_2$CD$_3$, —CD$_2$CH$_2$CH$_3$, —CD$_2$CH$_2$CH$_2$D, —CD$_2$CH$_2$CHD$_2$, —CD$_2$CH$_2$CD$_3$, —CD$_2$CHDCH$_3$, —CD$_2$CHDCH$_2$D, —CD$_2$CHDCHD$_2$, —CD$_2$CHDCD$_3$, —CD$_2$CD$_2$CH$_3$, —CD$_2$CD$_2$CH$_2$D, —CD$_2$CD$_2$CHD$_2$, —CD$_2$CD$_2$CD$_3$, —CH(CH$_3$)(CH$_2$D), —CH(CH$_3$)(CHD$_2$), —CH(CH$_2$D)(CH$_2$D), —CH(CH$_3$)(CD$_3$), —CH(CHD$_2$)(CHD$_2$), —CH(CH$_2$D)(CD$_3$), —CH(CHD$_2$)(CD$_3$), —CH(CD$_3$)$_2$, —CD(CH$_3$)$_2$, —CD(CH$_3$)(CH$_2$D), —CD(CH$_3$)(CHD$_2$), —CD(CH$_2$D)(CH$_2$D), —CD(CH$_3$)(CD$_3$), —CD(CHD$_2$)(CHD$_2$), —CD(CH$_2$D)(CD$_3$), —CD(CHD$_2$)(CD$_3$), —CD(CD$_3$)$_2$, and —C(CD$_3$)$_3$, but embodiments of the present disclosure are not limited thereto.

In an embodiment, the deuterium-containing substituent may be selected from deuterium, —CD$_3$, —CD$_2$H, —CDH$_2$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, —CD$_2$CDH$_2$, and groups represented by Formulae 9-14 to 9-24, but embodiments of the present disclosure are not limited thereto.

In an embodiment, a ligand represented by

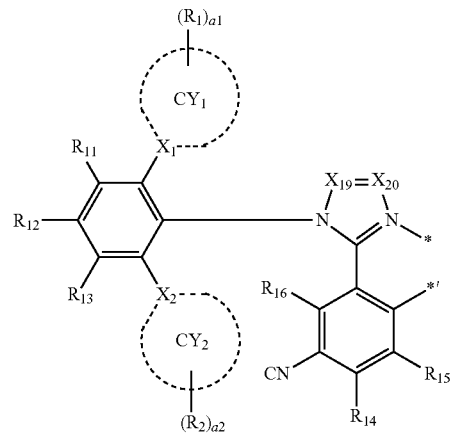

in Formula 1 (wherein * and *' each indicate a binding site to $M_1$ in Formula 1) may include at least one deuterium. Whether the ligand represented by

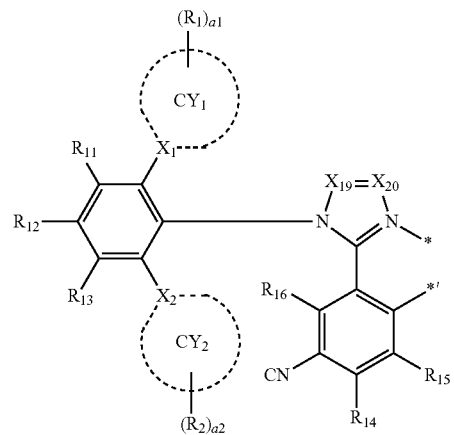

includes deuterium may be confirmed by analyzing the organometallic compound represented by Formula 1 through a $^1$H NMR spectrum or analyzing a molecular weight of the organometallic compound by using a molecular weight measurement apparatus such as matrix-assisted laser desorption/ionization (MALDI) apparatus.

A compound, which has the same backbone as the organometallic compound represented by Formula 1 but does not include deuterium (hereinafter, referred to as a "first standard compound"), is prepared. A $^1$H NMR spectrum of the first standard compound and a $^1$H NMR spectrum of the organometallic compound represented by Formula 1 are obtained. Then, the number of hydrogens that are substituted with deuterium among hydrogens bonded at a specific position (specific carbon) of the organometallic compound represented by Formula 1 may be calculated by comparing integral values of signals of specific chemical shift (parts per million, ppm) selected from the measured spectrum.

Alternatively, a compound, which has the same backbone as the organometallic compound represented by Formula 1 and in which all hydrogens of the organometallic compound represented by Formula 1 are substituted with deuterium (hereinafter, referred to as a "second standard compound"), is assumed. The number of hydrogens that are substituted with deuterium among hydrogens of the organometallic compound represented by Formula 1 may be calculated by comparing a calculated molecular weight of the second standard compound with a molecular weight of the organometallic compound represented by Formula 1.

In one or more embodiments, in Formula 1, i) $X_{19}$ may be $C(R_{19})$, $X_{20}$ may be N, and at least one of $R_{12}$, $R_{14}$, and $R_{19}$ may be a deuterium-containing substituent; ii) $X_{19}$ may be N, $X_{20}$ may be $C(R_{20})$, and at least one of $R_{12}$, $R_{14}$, and $R_{20}$ may be a deuterium-containing substituent; or iii) $X_{19}$ and $X_{20}$ may each be N, and at least one of $R_{12}$ and $R_{14}$ may be a deuterium-containing substituent, wherein the deuterium-containing substituent is the same as described herein.

In an embodiment, the organometallic compound represented by Formula 1 may be represented by one of Formulae 1-1 to 1-3:

Formula 1-1

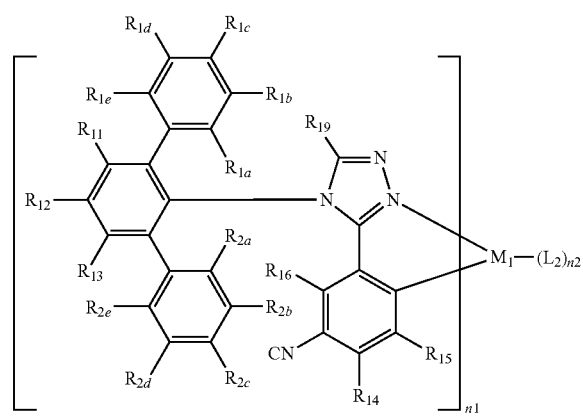

Formula 1-2

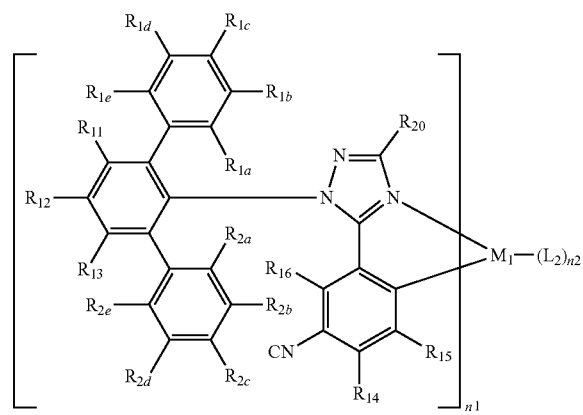

Formula 1-3

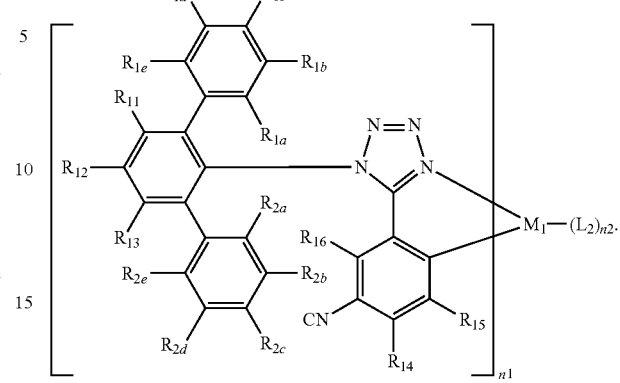

In Formulae 1-1 to 1-3, $M_1$, n1, $L_2$, n2, $R_{11}$ to $R_{16}$, $R_{19}$, and $R_{20}$ are each independently the same as described herein, $R_{1a}$ to $R_{1e}$ are each independently the same as described in connection with $R_1$, and $R_{2a}$ to $R_{2e}$ are each independently the same as described in connection with $R_2$.

In an embodiment, the organometallic compound represented by Formula 1 may be represented by one of Formulae 1(1) to 1(3):

Formula 1(1)

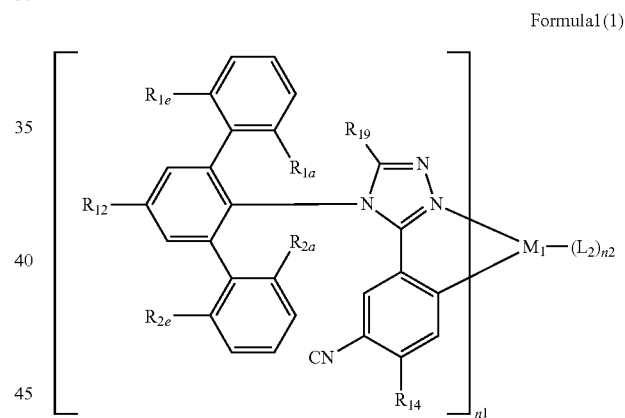

Formula 1(2)

Formula 1(3)

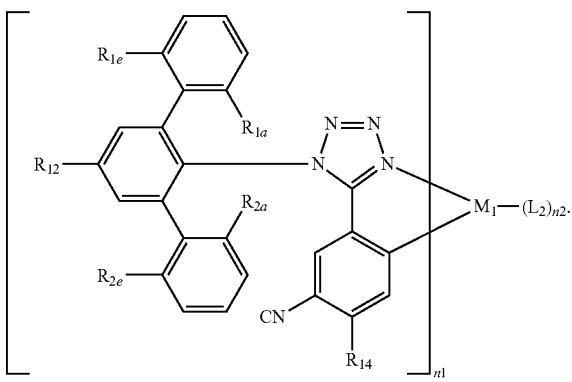

In Formulae 1(1) to 1(3), $M_1$, n1, $L_2$, n2, $R_{12}$, $R_{14}$, $R_{19}$, and $R_{20}$ are each independently the same as described herein, $R_{1a}$ and $R_{1e}$ are each independently the same as described in connection with $R_1$, and $R_{2a}$ and $R_{2e}$ are each independently the same as described in connection with $R_2$.

$L_2$ in Formula 1 may be a monodentate ligand or a bidentate ligand.

For example, in Formula 1, $L_2$ may be a monodentate ligand, and $L_2$ may be selected from I⁻, Br⁻, Cl⁻, sulfide, nitrate, azide, hydroxide, cyanate, isocyanate, thiocyanate, water, acetonitrile, pyridine, ammonia, carbon monoxide, $P(Ph)_3$, $P(Ph)_2CH_3$, $PPh(CH_3)_2$, and $P(CH_3)_3$, but embodiments of the present disclosure are not limited thereto.

In an embodiment, in Formula 1, $L_2$ may be a bidentate ligand, and $L_2$ may be selected from oxalate, acetylacetonate, a picolinic acid, 1,2-bis(diphenylphosphino)ethane, 1,1-bis(diphenylphosphino)methane, glycinate, and ethylenediamine, but embodiments of the present disclosure are not limited thereto.

In an embodiment, $L_2$ in Formula 1 may be selected from ligands represented by Formulae 3A to 3F:

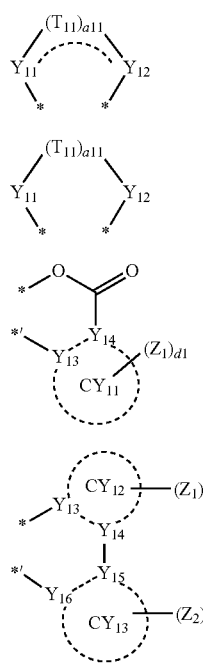

Formula 3A

Formula 3B

Formula 3C

Formula 3D

Formula 3E

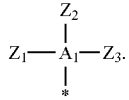

Formula 3F

In Formulae 3A to 3F, $Y_{11}$ may be selected from O, N, $N(Z_1)$, $P(Z_1)(Z_2)$, and $As(Z_1)(Z_2)$, $Y_{12}$ may be selected from O, N, $N(Z_3)$, $P(Z_3)(Z_4)$, and $As(Z_3)(Z_4)$, $CY_{11}$ may be a $C_2$-$C_{30}$ heterocyclic group (for example, a pyridine group, a pyrimidine group, a quinoline group, an isoquinoline group, a quinoxaline group, a carbazole group, or the like), $T_{11}$ may each independently be selected from a single bond, a double bond, *—$C(Z_{11})(Z_{12})$—*', *—$C(Z_{11})$=$C(Z_{12})$—*', *=$C(Z_{11})$—*', *—$C(Z_{11})$=*', *=$C(Z_{11})$—$C(Z_{12})$=$C(Z_{13})$—*', *—$C(Z_{11})$=$C(Z_{12})$—$C(Z_{13})$=*', *—$N(Z_{11})$—*', and a substituted or unsubstituted $C_5$-$C_{30}$ carbocyclic group, a11 may be an integer from 1 to 10, $Y_{13}$ to $Y_{16}$ may each independently be carbon (C) or nitrogen (N), $Y_{13}$ and $Y_{14}$ may be linked via a single bond or a double bond, and $Y_{15}$ and $Y_{16}$ may be linked via a single bond or a double bond, $CY_{12}$ and $CY_{13}$ may each independently be a $C_5$-$C_{30}$ carbocyclic group or a $C_2$-$C_{30}$ heterocyclic group (for example, a benzene group, a naphthalene group, a fluorene group, a dibenzofuran group, a dibenzothiophene group, a pyrazole group, an imidazole group, a triazole group, a tetrazole group, a pyridine group, a pyrimidine group, a quinoline group, an isoquinoline group, a quinoxaline group, a carbazole group, or the like), $A_1$ may be P or As, $Z_1$ to $Z_4$ and $Z_{11}$ to $Z_{13}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, $Q_1$ to $Q_9$ may each be independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, d1 and d2 may each independently be an integer from 0 to 10, and

* and *' each indicate a binding site to $M_1$ in Formula 1.

In an embodiment, $L_2$ in Formula 1 may be represented by one of Formulae 5-1 to 5-119, but embodiments of the present disclosure are not limited thereto:

5-1
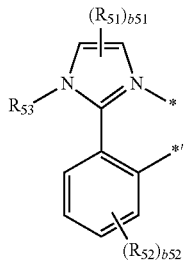

5-2
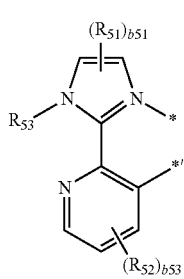

5-3
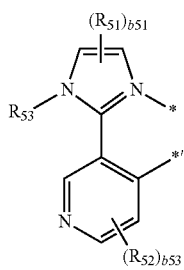

-continued 5-4
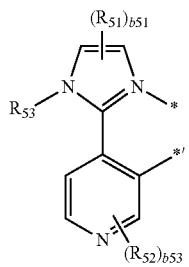

5-5
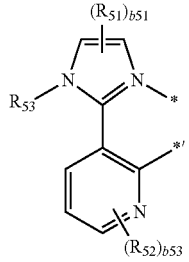

5-6
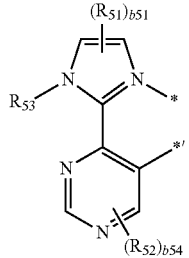

5-7
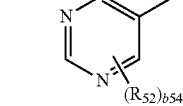
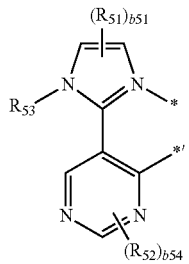

5-8
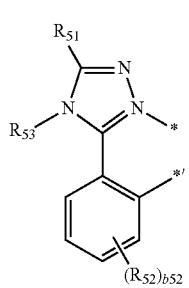

5-9
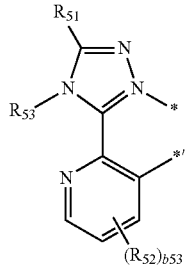

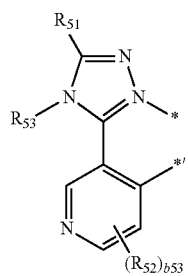 5-10
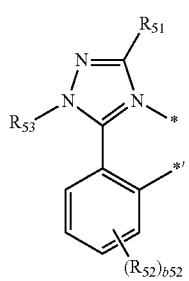 5-15
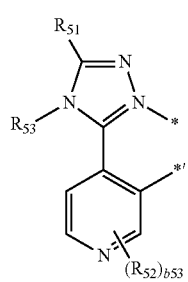 5-11
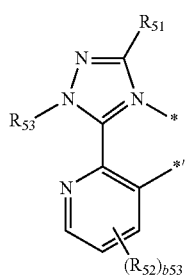 5-16
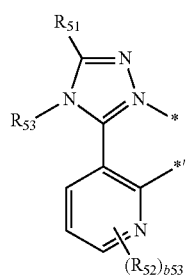 5-12
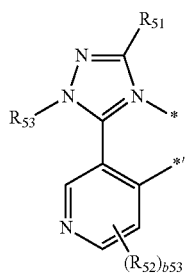 5-17
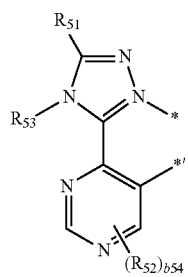 5-13
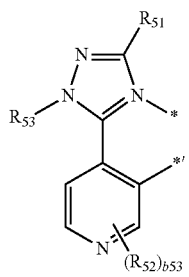 5-18
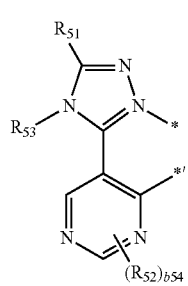 5-14
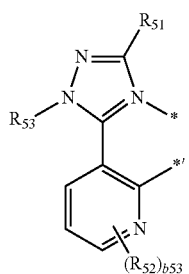 5-19

5-20 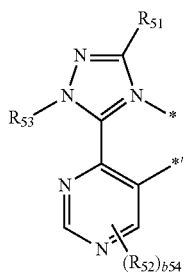
5-21 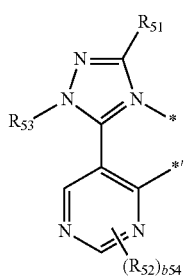
5-22 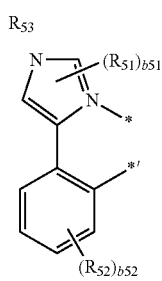
5-23 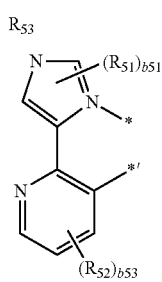
5-24 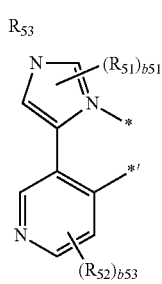
5-25 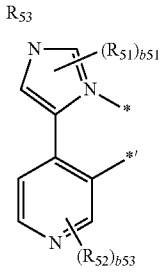
5-26 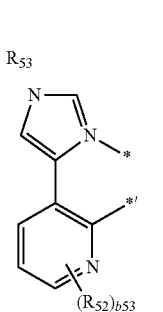
5-27 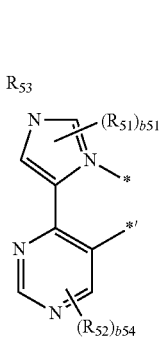
5-28 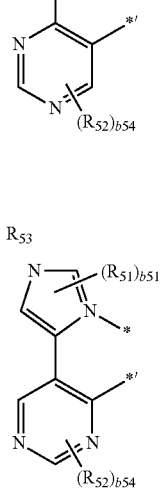
5-29 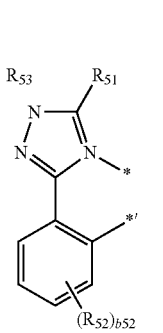

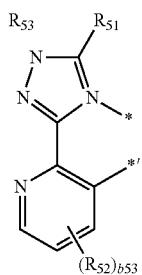 5-30
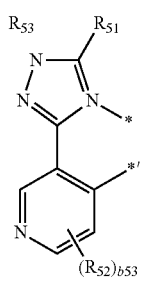 5-31
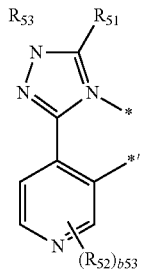 5-32
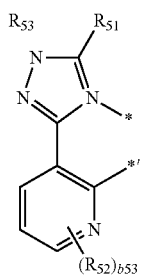 5-33
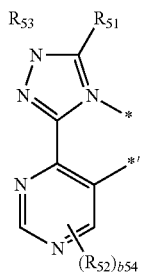 5-34
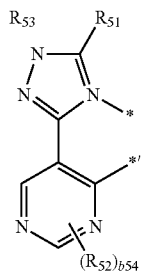 5-35
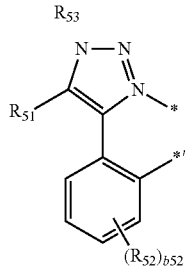 5-36
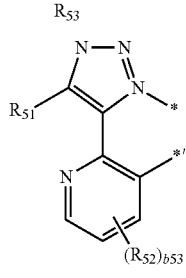 5-37
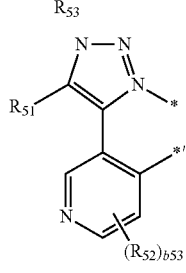 5-38
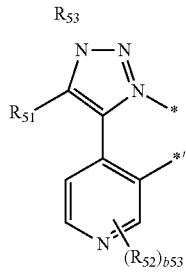 5-39

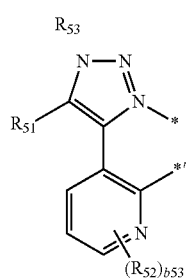
5-40
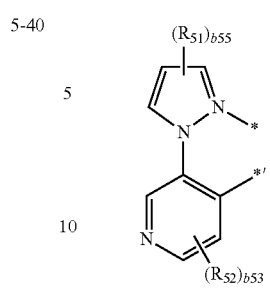
5-45
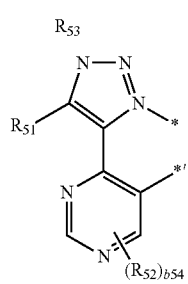
5-41
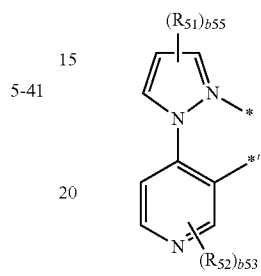
5-46
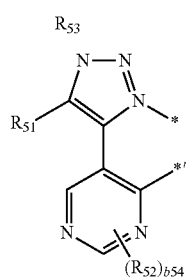
5-42
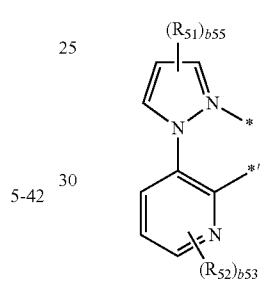
5-47
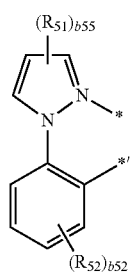
5-43
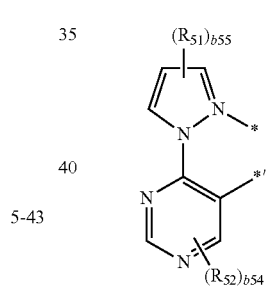
5-48
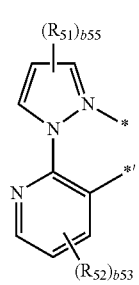
5-44
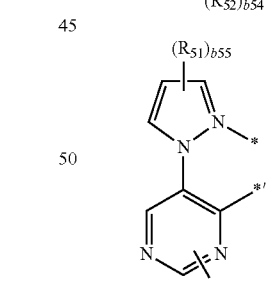
5-49
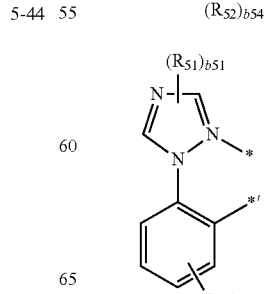
5-50

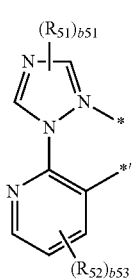
5-51
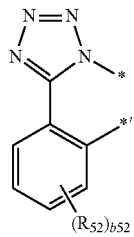
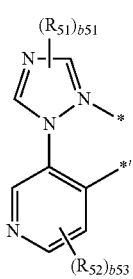
5-52
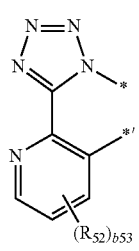
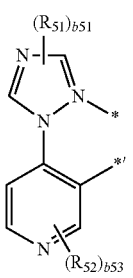
5-53
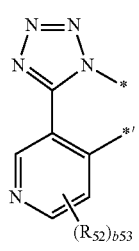
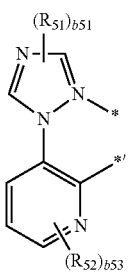
5-54
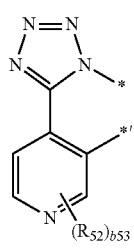
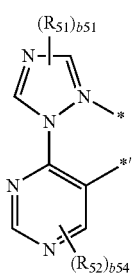
5-55
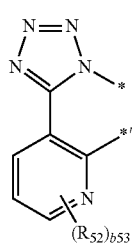
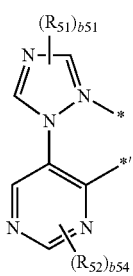
5-56
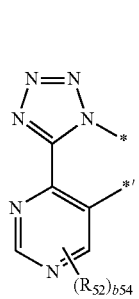
5-57
5-58
5-59
5-60
5-61
5-62

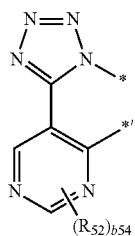
5-63
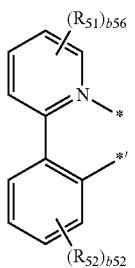
5-64
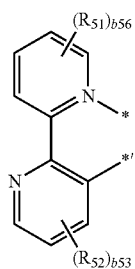
5-65
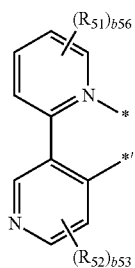
5-66
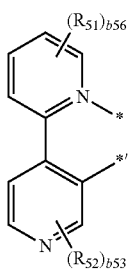
5-67
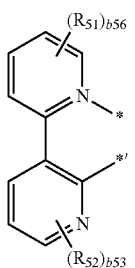
5-68
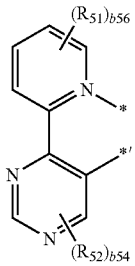
5-69
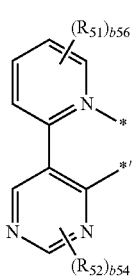
5-70
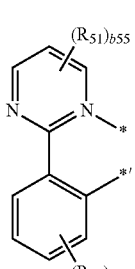
5-71
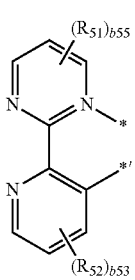
5-72
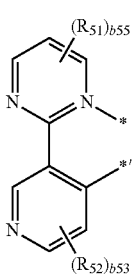
5-73
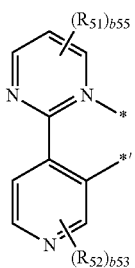
5-74

5-75 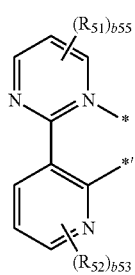
5-76 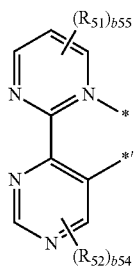
5-77 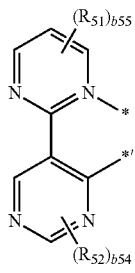
5-78 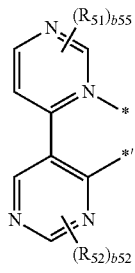
5-79 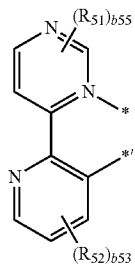
5-80 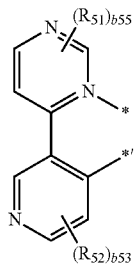
5-81 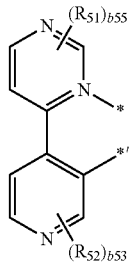
5-82 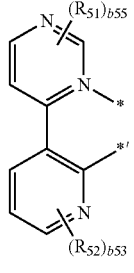
5-83 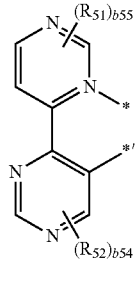
5-84 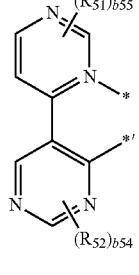
5-85 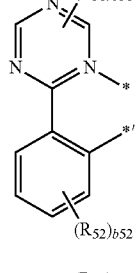
5-86 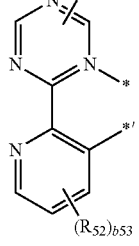

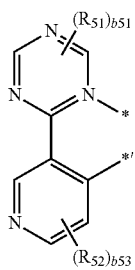
5-87
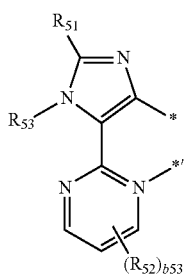
5-93
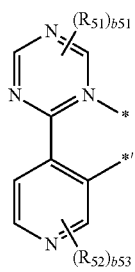
5-88
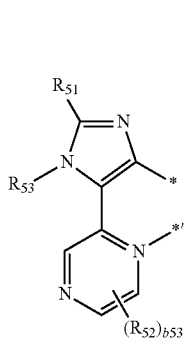
5-94
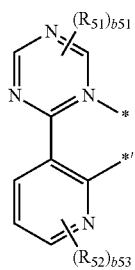
5-89
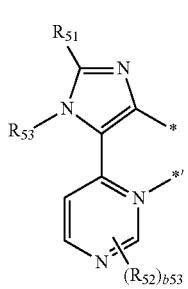
5-95
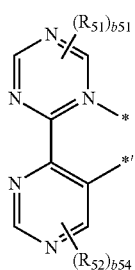
5-90
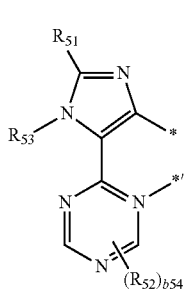
5-96
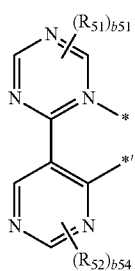
5-91
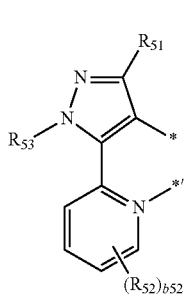
5-97
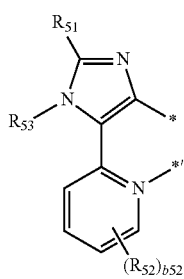
5-92

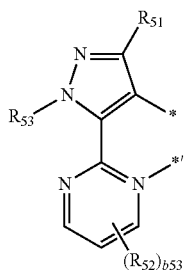 5-98
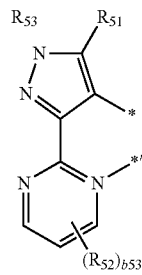 5-103
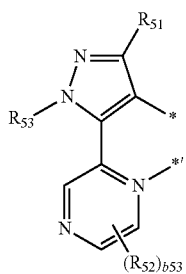 5-99
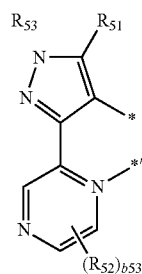 5-104
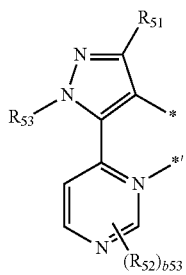 5-100
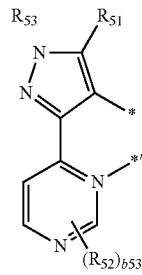 5-105
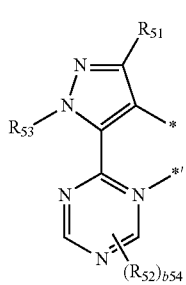 5-101
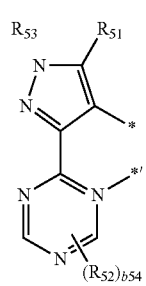 5-106
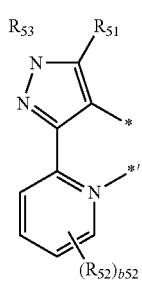 5-102
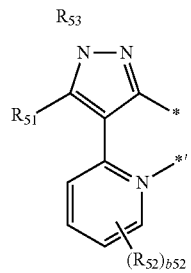 5-107

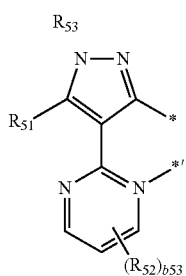 5-108
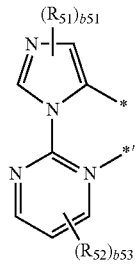 5-113
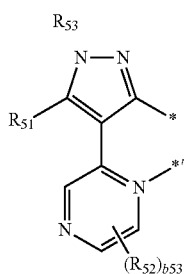 5-109
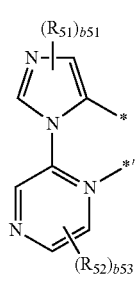 5-114
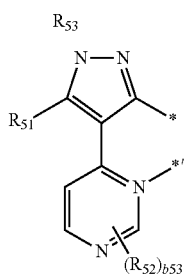 5-110
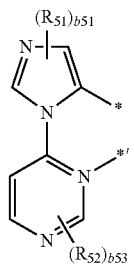 5-115
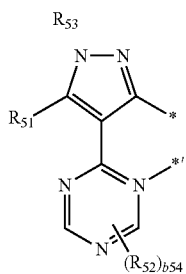 5-111
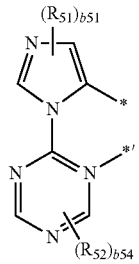 5-116
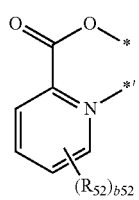 5-117
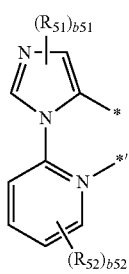 5-112
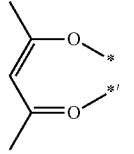 5-118

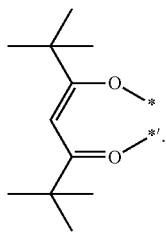

5-119

In Formulae 5-1 to 5-119, $R_{51}$ to $R_{53}$ may each independently be selected from:

hydrogen, —F, a cyano group, a nitro group, a methyl group, an ethyl group, a propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decanyl group, an iso-decanyl group, a sec-decanyl group, a tert-decanyl group, a methoxy group, an ethoxy group, a propoxy group, a butoxy group, a pentoxy group, a phenyl group, a naphthyl group, a pyridinyl group, a pyrimidinyl group, a triazinyl group, a dibenzofuranyl group, and a dibenzothiophenyl group; and a methyl group, an ethyl group, a propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decanyl group, an iso-decanyl group, a sec-decanyl group, a tert-decanyl group, a methoxy group, an ethoxy group, a propoxy group, a butoxy group, a pentoxy group, a phenyl group, a naphthyl group, a pyridinyl group, a pyrimidinyl group, a triazinyl group, a dibenzofuranyl group, and a dibenzothiophenyl group, each substituted with at least one selected from —F, a cyano group, and a nitro group, b51 and b54 may each independently be 1 or 2, b53 and b55 may each independently be an integer from 1 to 3, b52 may be an integer from 1 to 4, and

* and *' each indicate a binding site to $M_1$ in Formula 1.

The organometallic compound represented by Formula 1 is neutral and may not have a salt form including an anion and a cation.

The organometallic compound represented by Formula 1 may be selected from Compounds 1 to 10, but embodiments of the present disclosure are not limited thereto:

1

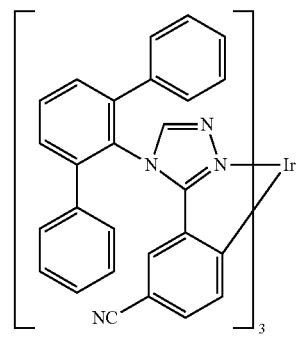

2

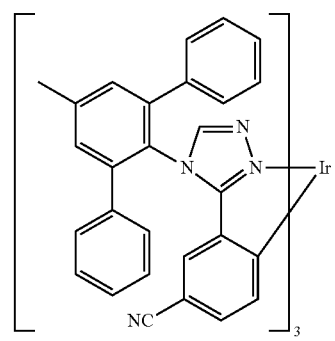

3

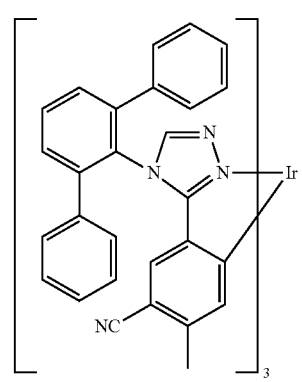

4

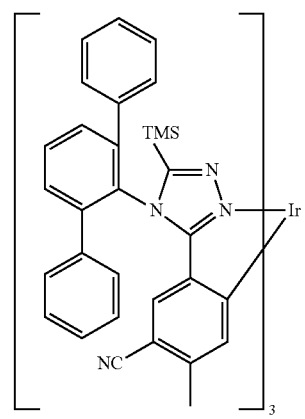

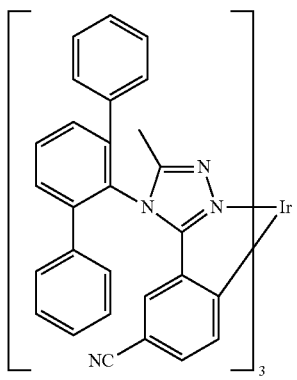
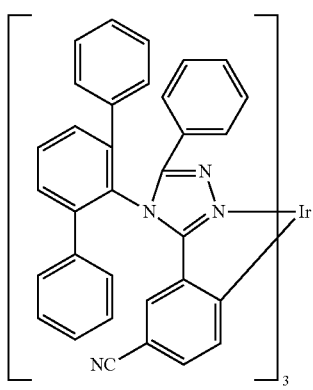
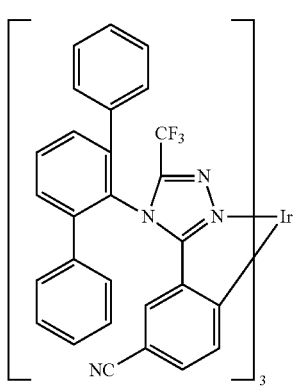
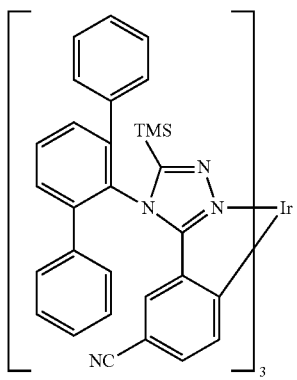
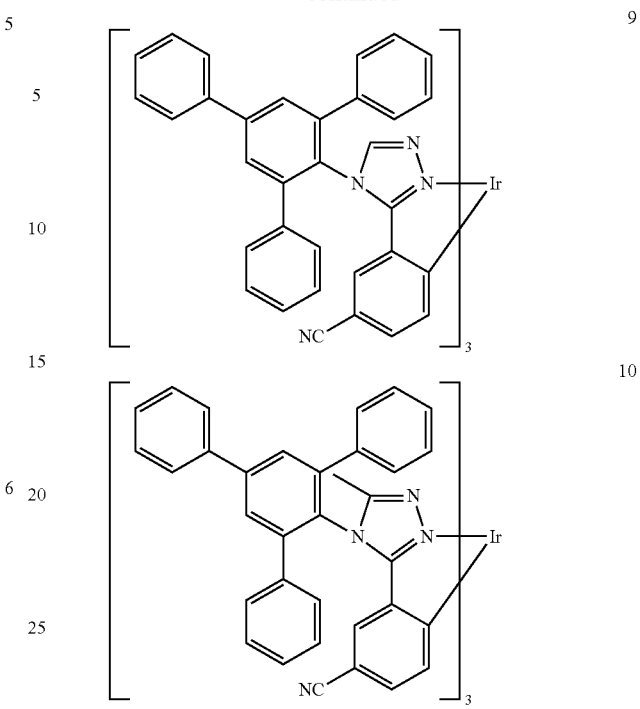

A maximum emission wavelength (experimental value) of the organometallic compound may be in a range of about 440 nanometers (nm) to about 465 nm, for example, about 440 nm to about 460 nm. When the maximum emission wavelength is in a range of about 440 nm to about 465 nm, an organic light-emitting device emitting deep blue light may be provided.

The organometallic compound represented by Formula 1 essentially includes $CY_1$ and $CY_2$ at positions defined herein.

Thus, the organometallic compound may have a natural population analysis (NPA) charge value of about 0.6 or less, for example, about 0.4 to about 0.55. The NPA charge value is evaluated by a density functional theory (DFT) method using a Gaussian program that is structurally optimized at a level of B3LYP/6-31G(d,p), and NPA charge values of Compounds 1 to 10 are shown in Table 1:

TABLE 1

| Compound No. | NPA charge value |
|---|---|
| 1 | 0.48 |
| 2 | 0.45 |
| 3 | 0.47 |
| 4 | 0.51 |
| 5 | 0.47 |
| 6 | 0.47 |
| 7 | 0.48 |
| 8 | 0.51 |
| 9 | 0.46 |
| 10 | 0.47 |

Since the organometallic compound having the NPA charge value in the above-described range has excellent heat resistance and/or decomposition resistance, an electronic device, for example, an organic light-emitting device, which includes the organometallic compound, may have a long lifespan.

On the other hand, a "carbon atom C" in Formula 1 is essentially bonded to a cyano group (see Formula 1'). Thus, since the organometallic compound represented by Formula 1 has a deep highest occupied molecular orbital (HOMO) energy level (that is, a low HOMO energy level or a large absolute value of a HOMO energy level), the organometallic compound may have a high triplet energy level. Therefore, the use of the organometallic compound represented by Formula 1 may make it possible to emit deep blue light having excellent color purity.

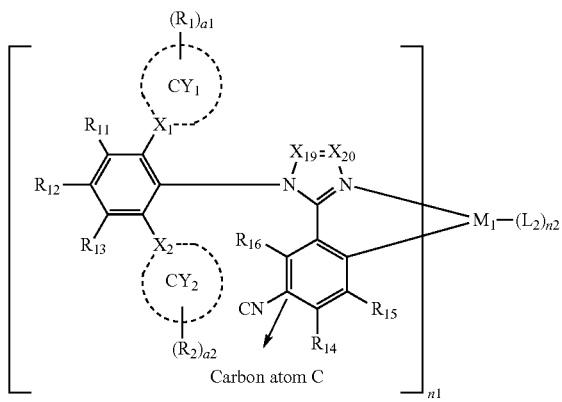

Formula 1'

Also, in one or more embodiments, the organometallic compound represented by Formula 1 may include at least one deuterium. Compared with a single bond between carbon and hydrogen, a single bond between carbon and deuterium has a stronger bond strength and a shorter bond length. Thus, the deuterium-containing organometallic compound may have higher thermal stability than the deuterium-free organometallic compound. Therefore, radicalization of the organometallic compound represented by Formula 1 slowly progresses due to heat and/or electric field generated when the organic light-emitting device is kept and/or driven, and thus, an organic light-emitting device including the organometallic compound may have a longer lifespan.

Furthermore, in one or more embodiments, $R_{14}$ in Formula 1 may not be hydrogen, or may be, for example, a deuterium-containing substituent. The organometallic compound represented by Formula 1 may have a high lowest unoccupied molecular orbital (LUMO) energy level and a high triplet ($T_1$) energy level. Thus, the use of the organometallic compound represented by Formula 1 may make it possible to emit blue light having excellent color purity.

HOMO energy levels, LUMO energy levels, $T_1$ energy levels, emission wavelengths and maximum emission wavelengths ($\lambda_{max}$) of some of the organometallic compounds represented by Formula 1 were evaluated by using a Gaussian 09 program for optimizing a molecular structure through DFT based on B3LYP. Evaluation results thereof are shown in Table 2.

TABLE 2

| Compound No. | HOMO (eV) | LUMO (eV) | $T_1$ (eV) | Emission wavelength (s) (nm) |
|---|---|---|---|---|
| 1 | −5.40 | −1.40 | 2.73 | 467 ($\lambda_{max}$), 492 |
| 2 | −5.35 | −1.31 | 2.74 | 465 ($\lambda_{max}$), 492 |

TABLE 2-continued

| Compound No. | HOMO (eV) | LUMO (eV) | $T_1$ (eV) | Emission wavelength (s) (nm) |
|---|---|---|---|---|
| 3 | −5.30 | −1.31 | 2.77 | 460 ($\lambda_{max}$), 484 |
| 4 | −5.28 | −1.25 | 2.78 | 453 ($\lambda_{max}$), 480 |
| 5 | −5.28 | −1.33 | 2.70 | 470 ($\lambda_{max}$), 497 |
| 6 | −5.36 | −1.52 | 2.63 | 478 ($\lambda_{max}$), 509 |
| 7 | −5.81 | −1.77 | 2.75 | 458 ($\lambda_{max}$) |
| 8 | −5.38 | −1.34 | 2.75 | 457 ($\lambda_{max}$), 486 |
| 9 | −5.37 | −1.50 | 2.73 | 468 ($\lambda_{max}$), 492 |
| 10 | −5.25 | −1.45 | 2.70 | 471 ($\lambda_{max}$), 497 |

On the other hand, in synthesizing an organometallic compound that is represented by Formula 1 but includes at least one deuterium, if at least one of the organometallic compound is deuterated, an organometallic compound in which hydrogen is not substituted with deuterium (that is, an organometallic compound represented by Formula 2 as follows) may also be synthesized, simultaneously. Thus, a composition containing the organometallic compound, which includes organometallic compound represented by Formula 1 and includes at least one deuterium (hereinafter, a "first organometallic compound") and further includes an organometallic compound represented by Formula 2 (hereinafter, a "second organometallic compound"), may be provided:

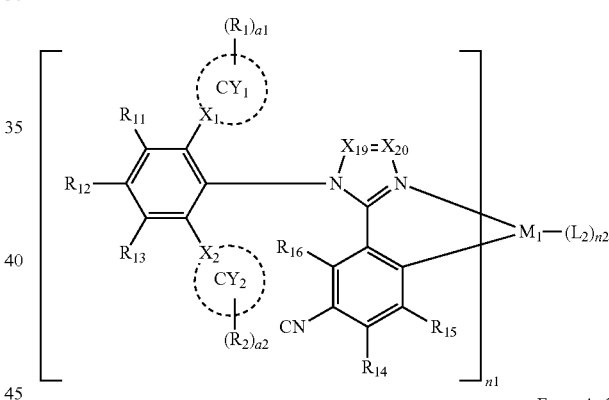

Formula 1

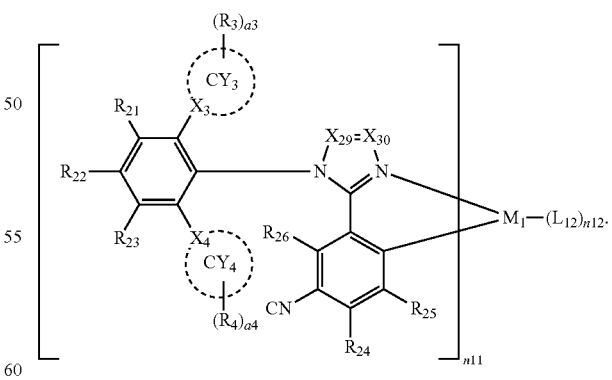

Formula 2

In Formulae 1 and 2, $M_1$ and $M_{11}$ may each independently be selected from a first-row transition metal of the Periodic Table of Elements, a second-row transition metal of the Periodic Table of Elements, and a third-row transition metal of the Periodic Table of Elements, n1 and n11 may each independently be 1, 2, or 3, $L_2$ and $L_{12}$ may each independently be a monodentate ligand or a bidentate ligand, n2 and n12 may each independently be 0, 1, 2, 3, or 4, wherein, when n2 is two or more, two or more groups $L_2$ may be identical to or different from each other, and when n12 is two or more, two or more groups $L_{12}$ may be identical to or different from each other, $X_1$ to $X_4$ may each independently be carbon or nitrogen, $CY_1$ to $CY_4$ may each independently be a $C_5$-$C_{30}$ carbocyclic group or a $C_2$-$C_{30}$ heterocyclic group, $X_{19}$ may be N or $C(R_{19})$, and $X_{20}$ may be N or $C(R_{20})$, provided that at least one of $X_{19}$ and $X_{20}$ is N, $X_{29}$ may be N or $C(R_{29})$, and $X_{30}$ may be N or $C(R_{30})$, provided that at least one of $X_{29}$ and $X_{30}$ is N, $R_1$, $R_2$, $R_{11}$ to $R_{16}$, $R_{19}$, and $R_{20}$ may each independently be selected from hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —B(Q$_6$)(Q$_7$), and —P(=O)(Q$_8$)(Q$_9$), two or more neighboring groups selected from $R_1$, $R_2$, $R_{11}$ to $R_{13}$, $CY_1$, and $CY_2$ may optionally be linked to form a substituted or unsubstituted $C_5$-$C_{30}$ carbocyclic group or a substituted or unsubstituted $C_2$-$C_{30}$ heterocyclic group, a1 and a2 may each independently be an integer from 0 to 5, i) $X_{19}$ may be $C(R_{19})$, $X_{20}$ may be N, and at least one of $R_1$, $R_2$, $R_{11}$ to $R_{16}$, and $R_{19}$ may be a deuterium-containing substituent; ii) $X_{19}$ may be N, $X_{20}$ may be $C(R_{20})$, and at least one of $R_1$, $R_2$, $R_{11}$ to $R_{16}$, and $R_{20}$ may be a deuterium-containing substituent; or iii) $X_{19}$ and $X_{20}$ may each be N, and at least one of $R_1$, $R_2$, and $R_{11}$ to $R_{16}$ may be a deuterium-containing substituent, $R_3$, $R_4$, $R_{21}$ to $R_{26}$, $R_{29}$, and $R_{30}$ may each independently be selected from hydrogen, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —B(Q$_6$)(Q$_7$), and —P(=O)(Q$_8$)(Q$_9$), two or more neighboring groups selected from $R_3$, $R_4$, $R_{21}$ to $R_{23}$, $CY_3$, and $CY_4$ may optionally be linked to form a substituted or unsubstituted $C_5$-$C_{30}$ carbocyclic group or a substituted or unsubstituted $C_2$-$C_{30}$ heterocyclic group, a3 and a4 may each independently be an integer from 0 to 5, and $R_3$, $R_4$, $R_{21}$ to $R_{26}$, $R_{29}$, and $R_{30}$ may each be a deuterium-free substituent.

Descriptions for the first organometallic compound are the same as described in Formula 1, except that at least one deuterium is included therein and descriptions for the second organometallic compound are the same as described in Formula 1, except that deuterium is not included therein.

A deuteration rate of the composition containing the organometallic compound may be about 50% or more. The deuteration rate may be calculated by using Equation 2:

$$\text{deuteration rate (\%)} = n_{D2}/(n_{H2} + n_{D2}) \times 100. \qquad \text{Equation 2}$$

In Equation 2, $n_{H2}$ represents the sum of a total number of hydrogens included in the deuterium-containing substituents in the first organometallic compound and a total number of hydrogens included in the deuterium-free substituent of the second organometallic compound corresponding to the deuterium-containing substituent in the first organometallic compound, and $n_{D2}$ represents a total number of deuterium atoms included in the deuterium-containing substituents in the first organometallic compound.

When a substituent indicated by a dashed box in the left compound of the following compounds is a deuterium-containing substituent, a deuterium-free substituent corresponding to the deuterium-containing substituent in the right compound may mean a substituent indicated by a dashed box in the right compound. That is, in the present disclosure, substituents bonded to carbon at the same position in two compounds that differ from each other only in terms of the presence or absence of isotope are defined as "corresponding" substituents.

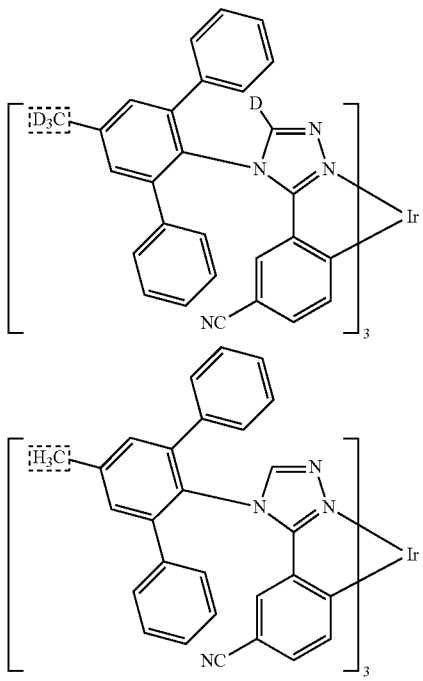

For example, if the first organometallic compound includes two deuterium-containing substituents, $n_{D2}$ means the total number of deuterium atoms included in the two deuterium-containing substituents. Also, $n_{H2}$ means the sum of the number of hydrogens included in the two deuterium-containing substituents and the number of hydrogens included in the deuterium-free substituent of the second organometallic compound corresponding to the two deuterium-containing substituents.

In an embodiment, the deuteration rate may be about 70% or more, about 90% or more, about 95% or more, about 96% or more, about 97% or more, about 98% or more, or about 99% or more, but embodiments of the present disclosure are not limited thereto.

Synthesis methods of the organometallic compound represented by Formula 1 may be recognizable by one of ordinary skill in the art by referring to Synthesis Examples provided below. The composition containing the organometallic compound including the first organometallic compound and the second organometallic compound may be obtained by an incomplete deuteration in synthesizing the first organometallic compound, not by mixing the first organometallic compound and the second organometallic compound.

Synthesis methods of the organometallic compound represented by Formula 1 may be recognizable by one of ordinary skill in the art by referring to Synthesis Examples provided below.

The organometallic compound represented by Formula 1 or a composition including the organometallic compound may be suitable for use in an organic layer of an organic light-emitting device, for example, for use as a dopant in an emission layer of the organic layer. Thus, another aspect of the present description provides an organic light-emitting device that includes:
a first electrode;
a second electrode; and
an organic layer disposed between the first electrode and the second electrode, wherein the organic layer includes an emission layer and at least one of the organometallic compound represented by Formula 1.

The organic light-emitting device may have, due to the inclusion of an organic layer including the organometallic compound represented by Formula 1 or the composition including the organometallic compound, high efficiency, a long lifespan, and a high color purity.

The organometallic compound of Formula 1 or the composition including the organometallic compound may be used between a pair of electrodes of an organic light-emitting device. For example, the organometallic compound represented by Formula 1 or the composition including the organometallic compound may be included in the emission layer. In this embodiment, the organometallic compound or the composition including the organometallic compound may act as a dopant, and the emission layer may further include a host (that is, an amount of the organometallic compound represented by Formula 1 or the composition including the organometallic compound is smaller than an amount of the host). In this embodiment, the dopant may emit blue light.

The expression "(an organic layer) includes at least one of organometallic compounds" as used herein may include an embodiment in which "(an organic layer) includes identical organometallic compounds represented by Formula 1" and an embodiment in which "(an organic layer) includes two or more different organometallic compounds represented by Formula 1."

For example, the organic layer may include, as the organometallic compound, only Compound 1. In this regard, Compound 1 may be included in an emission layer of the organic light-emitting device. In one or more embodiments, the organic layer may include, as the organometallic compound, Compound 1 and Compound 2. In this embodiment, Compound 1 and Compound 2 may be included in an identical layer (for example, Compound 1 and Compound 2 may both be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, and the hole transport region includes a hole injection layer, a hole transport layer, an electron blocking layer, a buffer layer or any combination thereof and the electron transport region includes a hole blocking layer, an electron transport layer, an electron injection layer or any combination thereof.

The term "organic layer" as used herein refers to a single layer and/or a plurality of layers disposed between the first electrode and the second electrode of the organic light-emitting device. The "organic layer" may include, in addition to an organic compound, an organometallic complex including metal.

The FIGURE is a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include at least one selected from a hole injection layer, a hole transport layer, an electron blocking layer, and a buffer layer.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, p-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

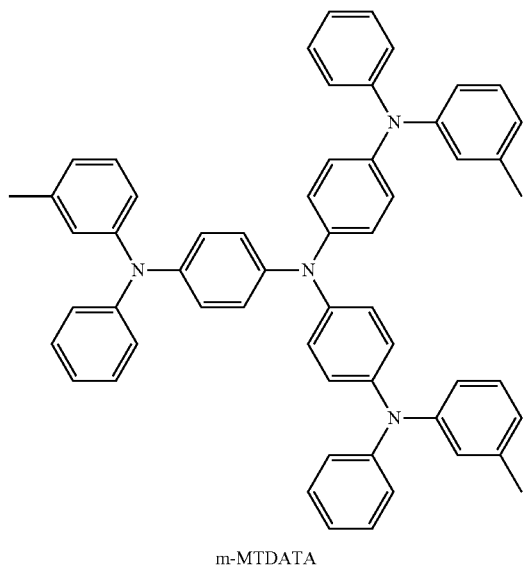

m-MTDATA

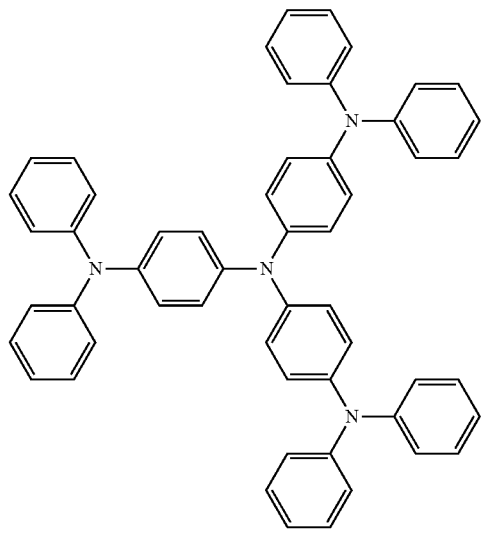

TDATA

-continued
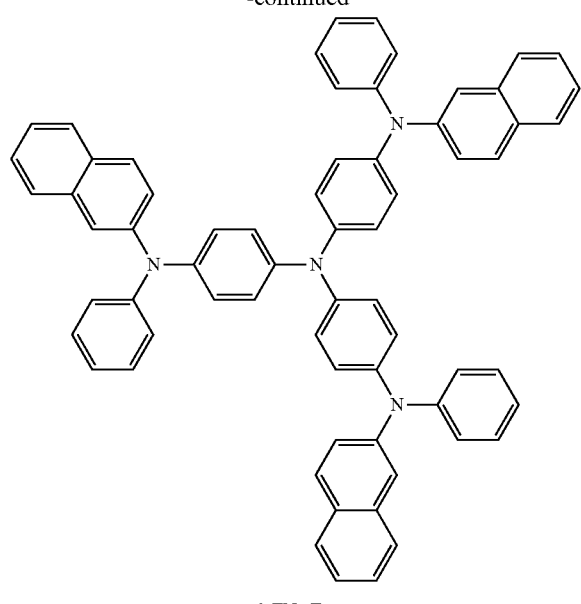
2-TNATA
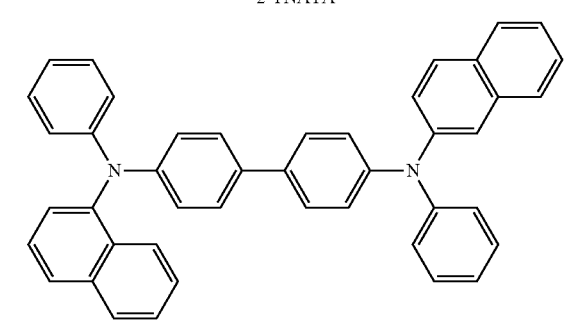
NPB
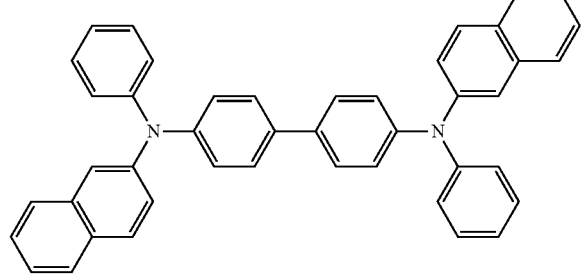
β-NPB
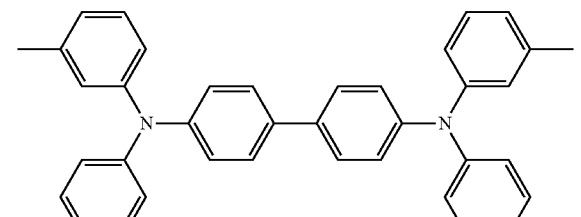
TPD
-continued
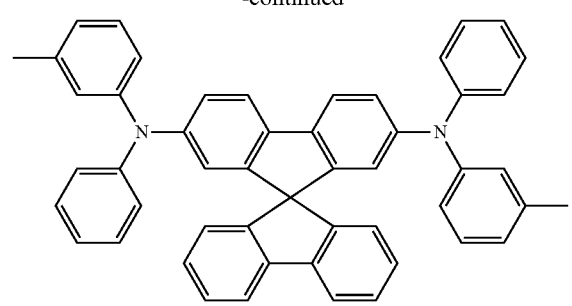
Spiro-TPD
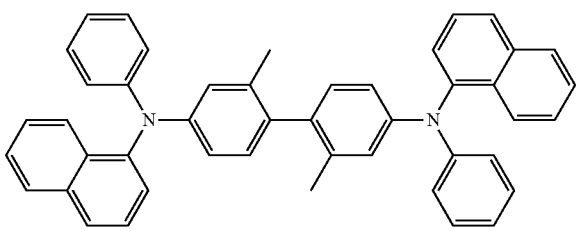
Spiro-NPB
methylated NPB
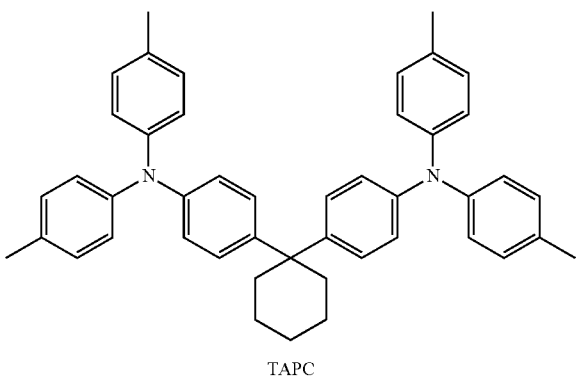
TAPC
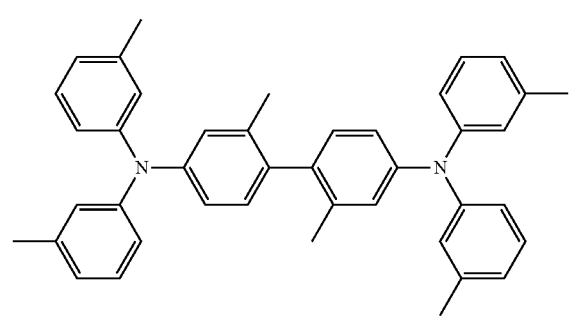
HMTPD Formula 201

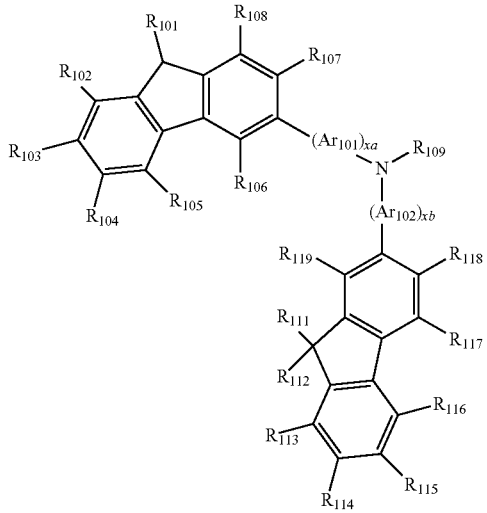

Formula 202

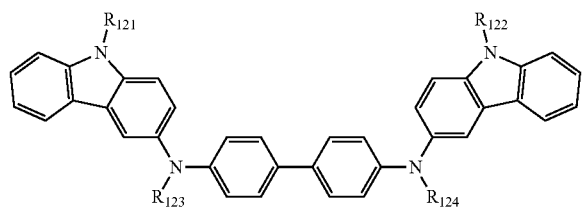

$Ar_{101}$ and $Ar_{102}$ in Formula 201 may each independently be selected from:
- a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and
- a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

In Formula 201, xa and xb may each independently be an integer from 0 to 5, or 0, 1, or 2. For example, xa may be 1, and xb may be 0, but embodiments of the present disclosure are not limited thereto.

In Formulae 201 and 202, $R_{101}$ to $R_{108}$, $R_{111}$ to $R_{119}$, and $R_{121}$ to $R_{124}$ may each independently be selected from:
- hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, and a hexyl group), and $C_1$-$C_{10}$ alkoxy group (for example, a methoxy group, an ethoxy group, a propoxy group, a butoxy group, and a pentoxy group);
- a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;
- a phenyl group, a naphthyl group, an anthracenyl group, a fluorenyl group, and a pyrenyl group; and
- a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{100}$ alkyl group, and a $C_1$-$C_{10}$ alkoxy group, but embodiments of the present disclosure are not limited thereto.

In Formula 201, $R_{109}$ may be selected from:
- a phenyl group, a naphthyl group, an anthracenyl group, and a pyridinyl group; and
- a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A, but embodiments of the present disclosure are not limited thereto:

Formula 201A

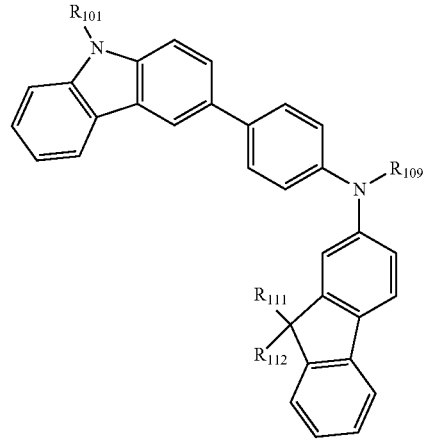

$R_{101}$, $R_{111}$, $R_{112}$, and $R_{109}$ in Formula 201A may be understood by referring to the description provided herein.
For example, the compound represented by Formula 201, and the compound represented by Formula 202 may include compounds HT1 to HT20 illustrated below, but are not limited thereto.
HT1
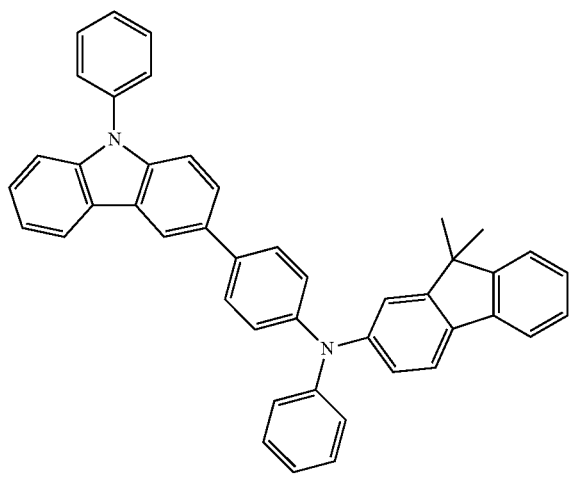
HT2
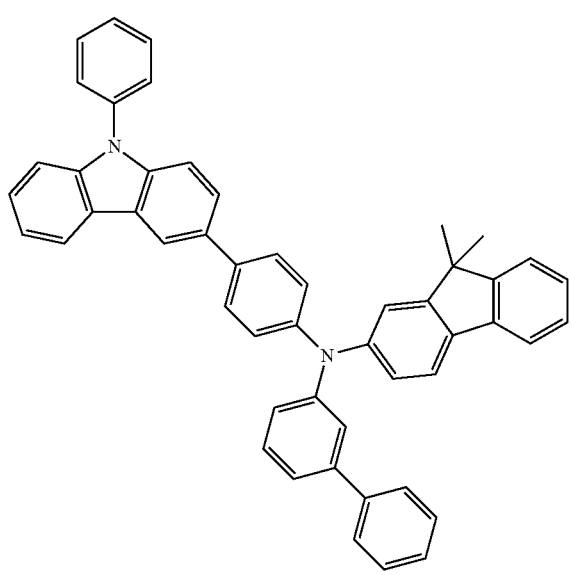
HT3
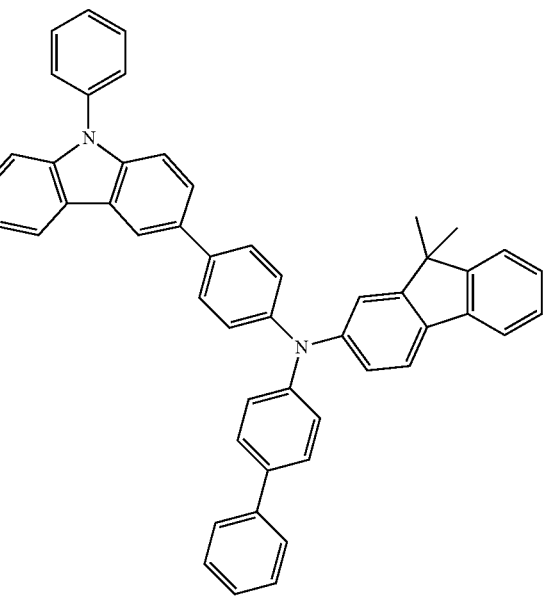
HT4
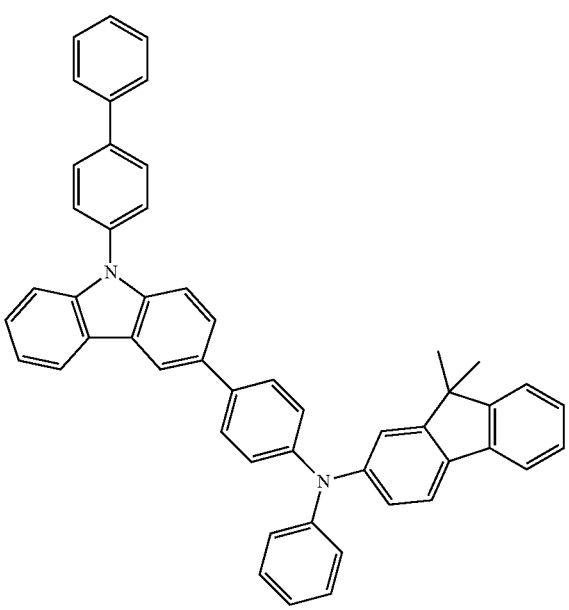

HT5
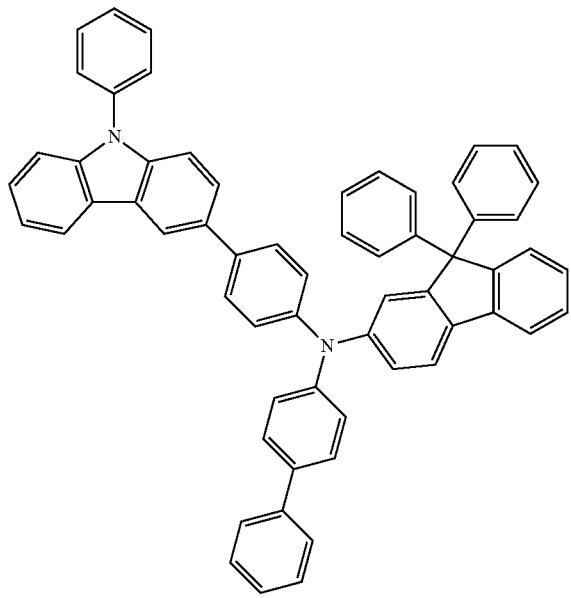
HT6
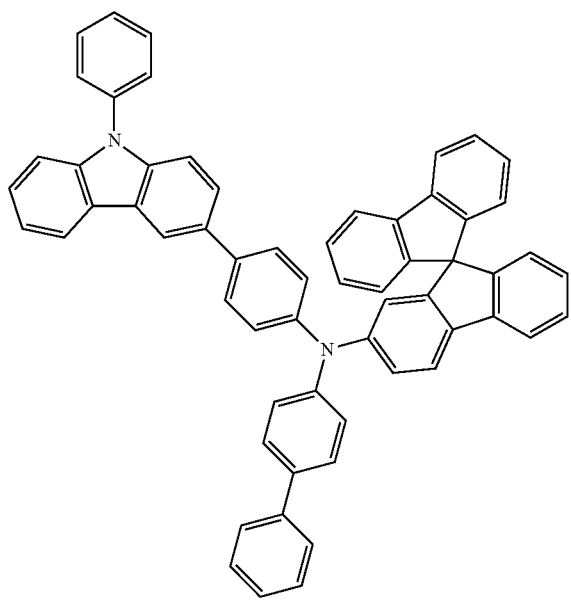
HT7
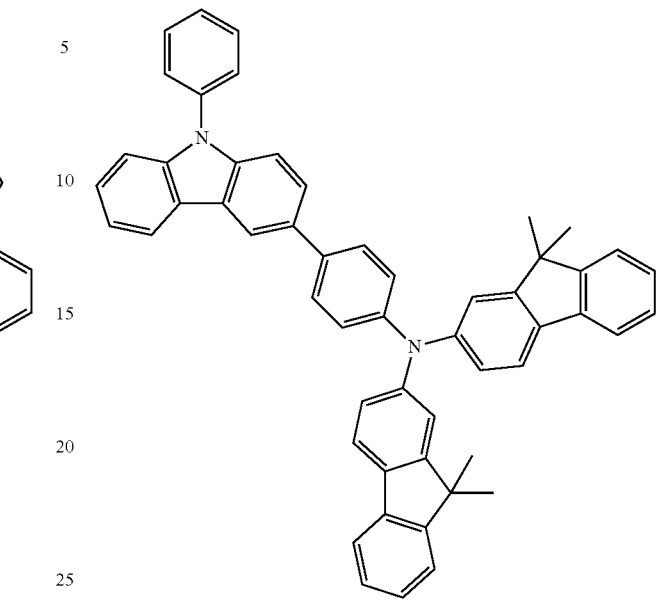
HT8
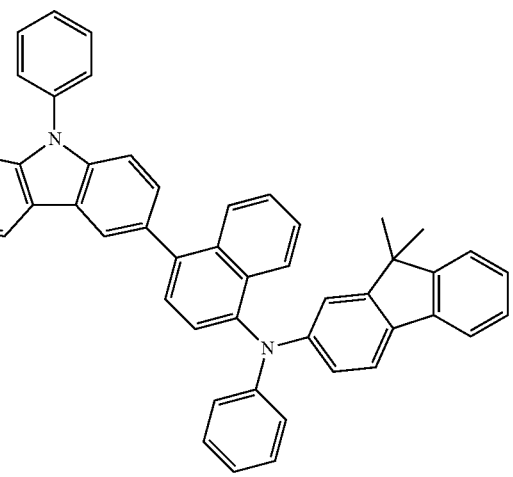
HT9
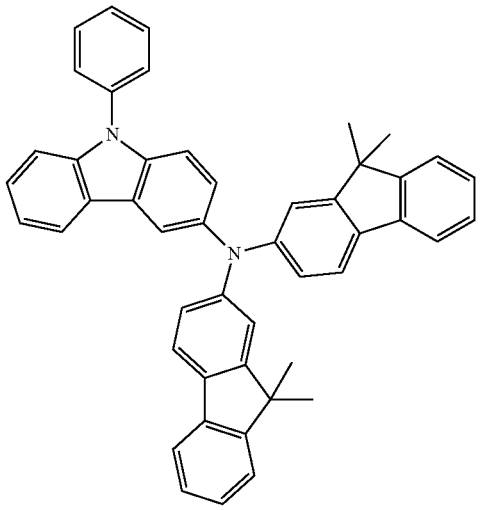

HT10
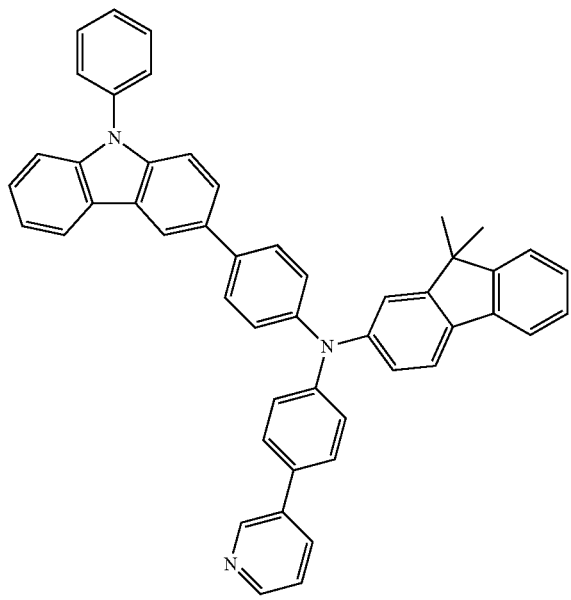
HT11
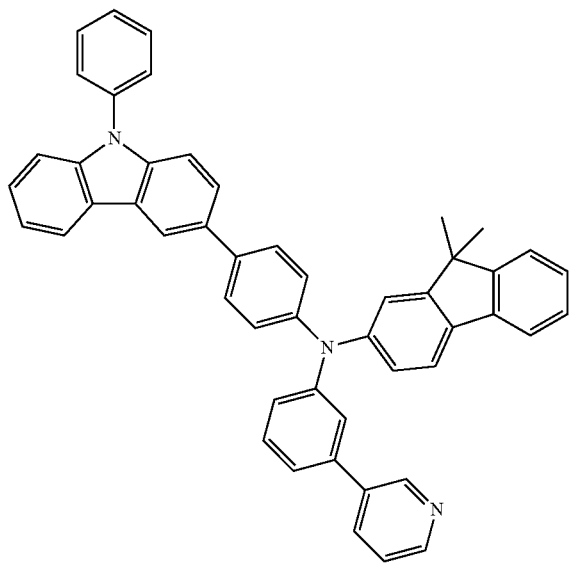
HT12
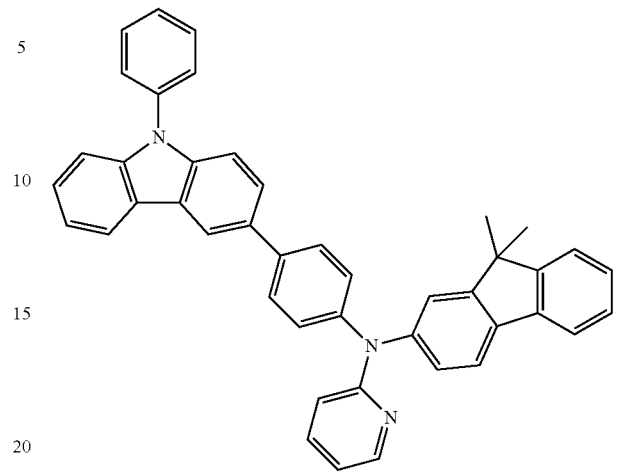
HT13
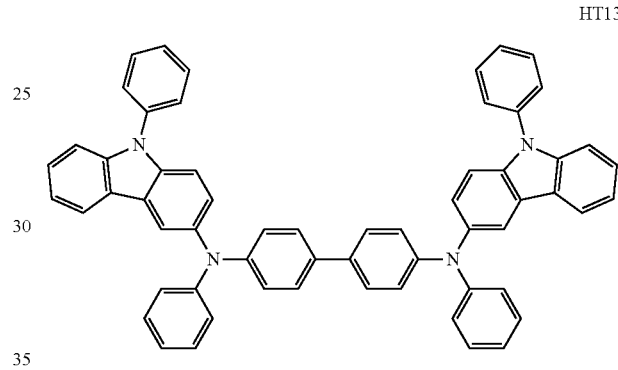
HT14
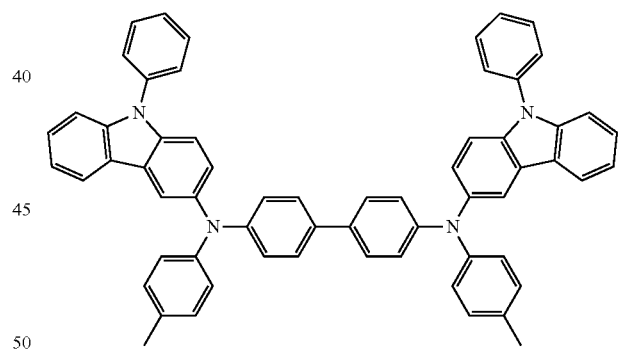
HT15
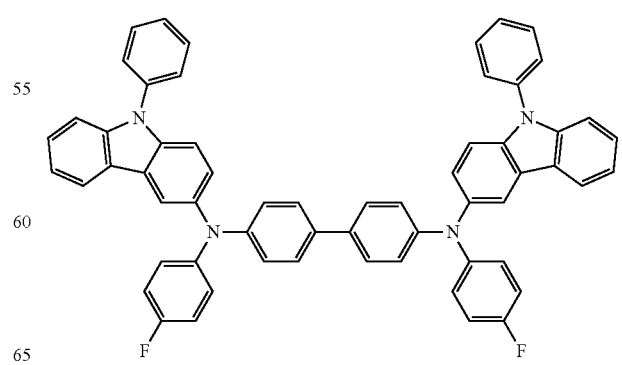

HT16

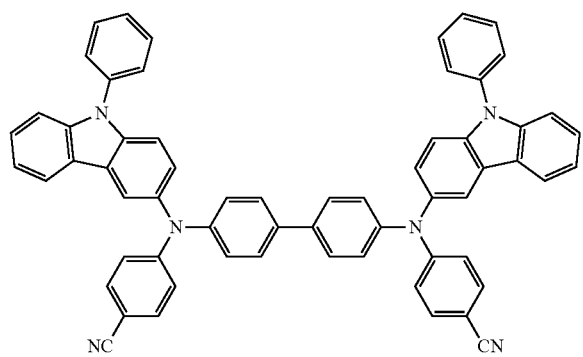

HT17

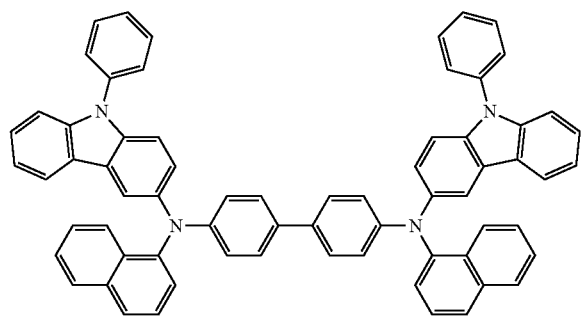

HT18

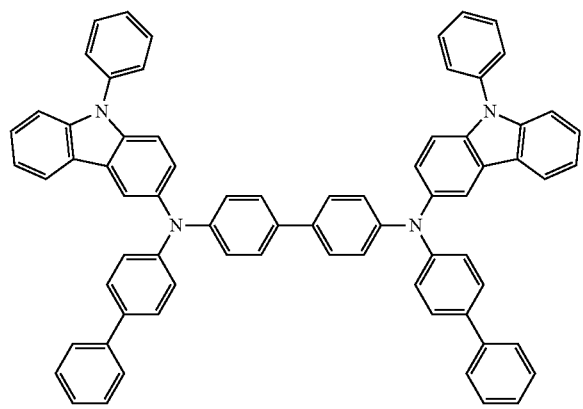

HT19

HT20

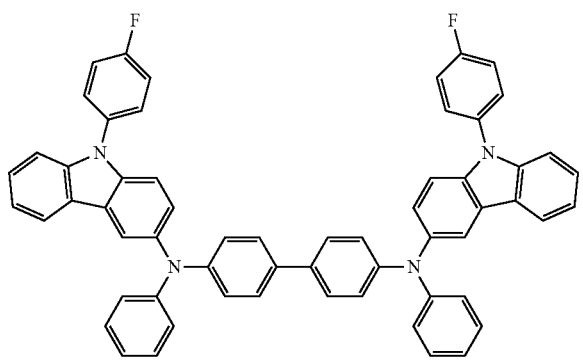

A thickness of the hole transport region may be in a range of about 100 Å to about 10,000 Å, for example, about 100 Å to about 1,000 Å. When the hole transport region includes a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 or Compound HT-D2 below, but are not limited thereto.

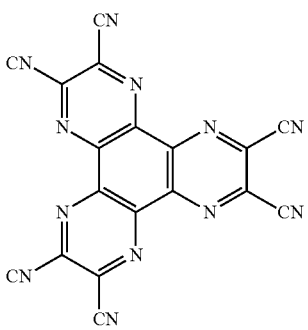

HT-D1

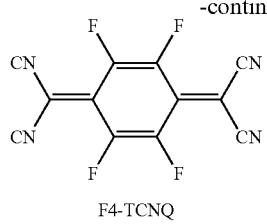

F4-TCNQ

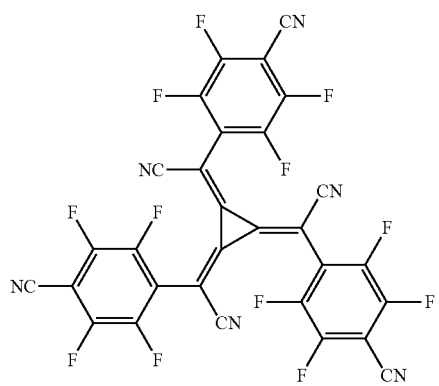

HT-D2

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1 or a composition containing the organometallic compound.

The host may include at least one selected from TPBi, TBADN, ADN (also referred to as "DNA"), CBP, CDBP, TCP, mCP, Compound H50, Compound H51 and Compound 52:

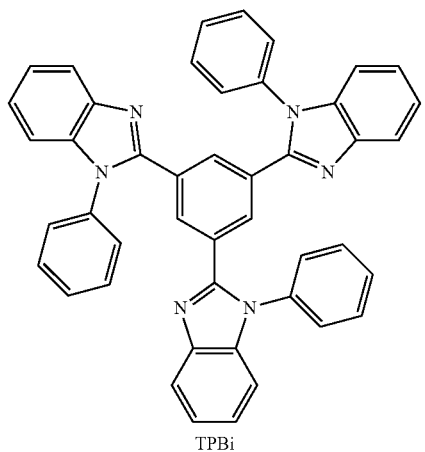

TPBi

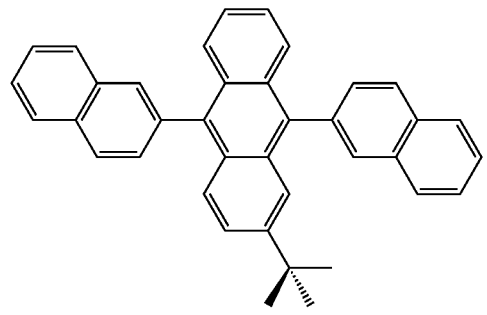

TBADN

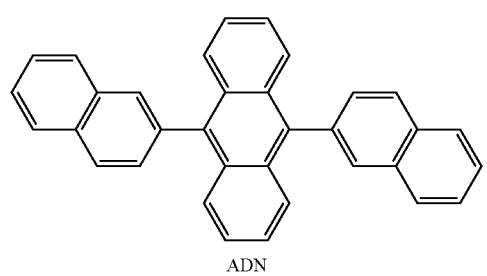

ADN

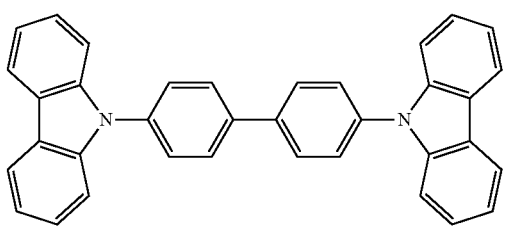

CBP

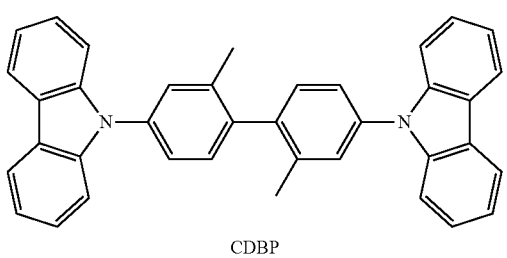

CDBP

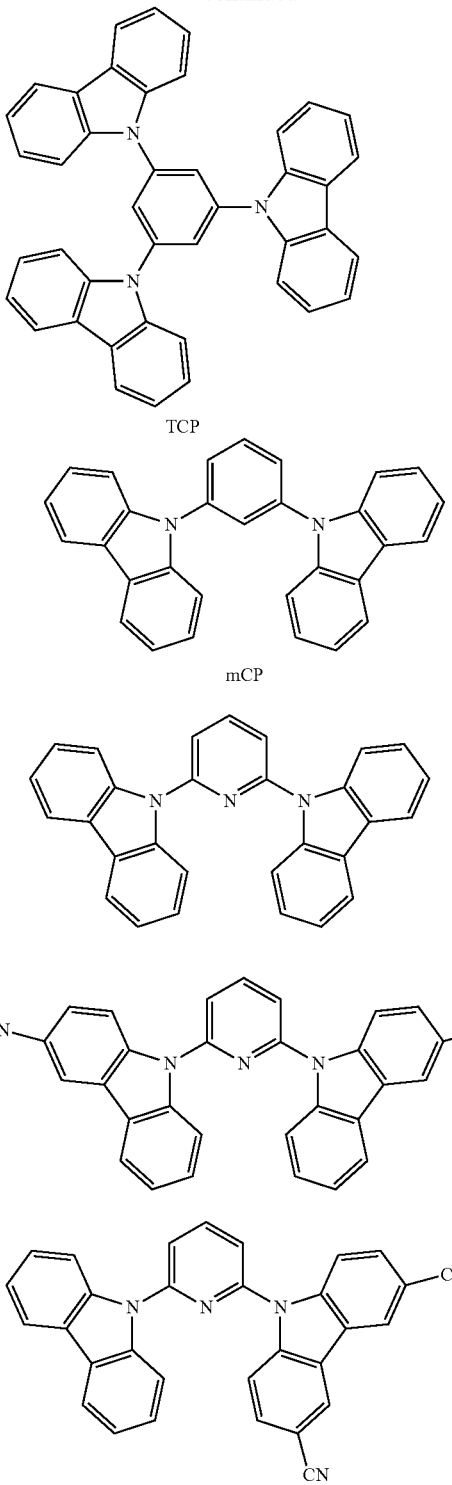

TCP mCP

H50

H51

H52

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

The dopant may include at least one organometallic compounds represented by Formula 1 or the composition containing the organometallic compound described above.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include at least one selected from a hole blocking layer, an electron transport layer, and an electron injection layer.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto.

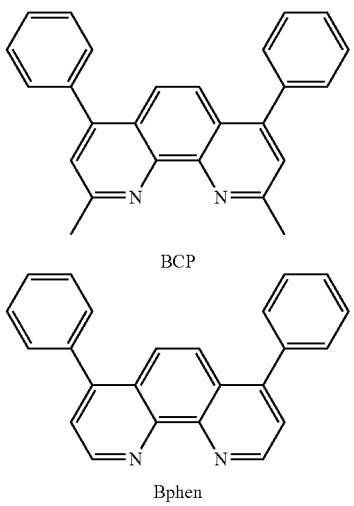

BCP

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may include at least one selected from BCP, Bphen, Alq$_3$, BAlq, TAZ, and NTAZ.

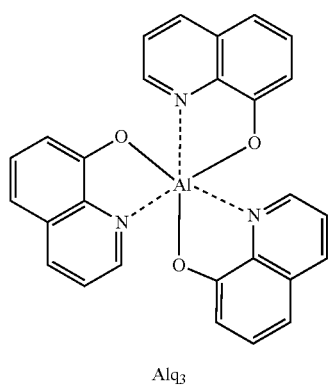
Alq₃
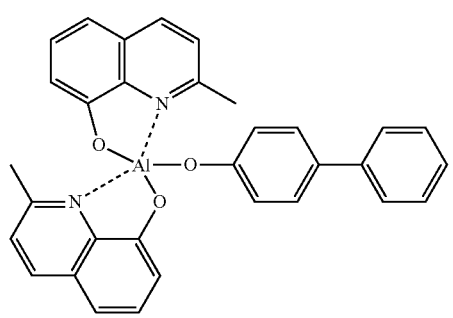
BAlq
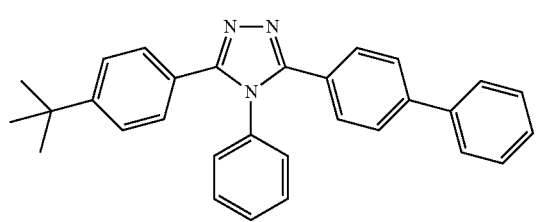
TAZ
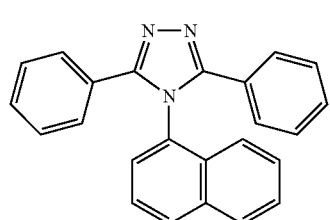
NTAZ
In one or more embodiments, the electron transport layer may include at least one of ET1 to ET25, but are not limited thereto:
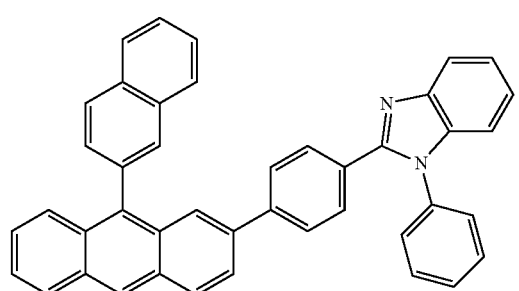
ET1
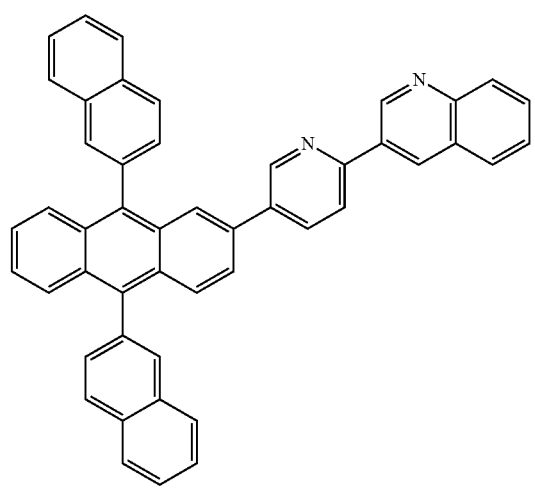
ET2
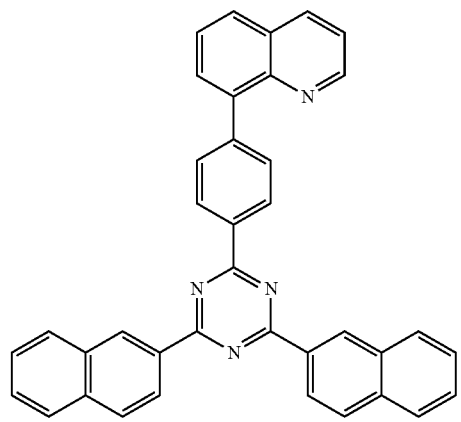
ET3

-continued
ET4
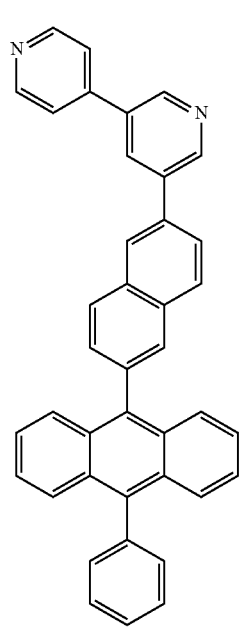
ET5
ET6
-continued
ET7
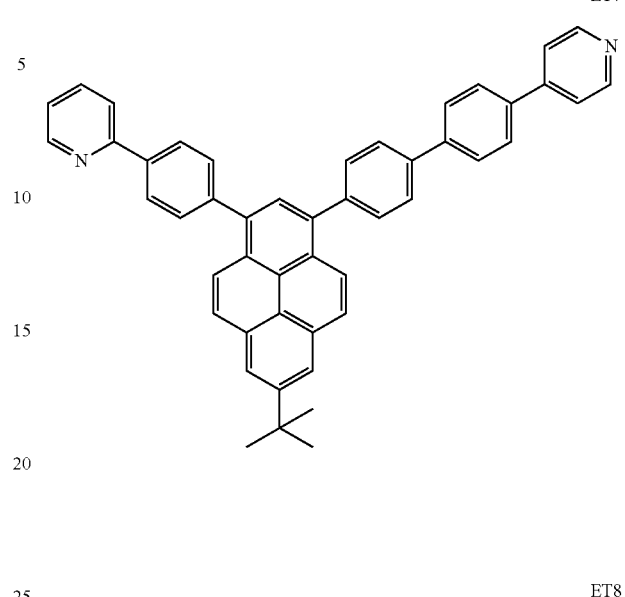
ET8
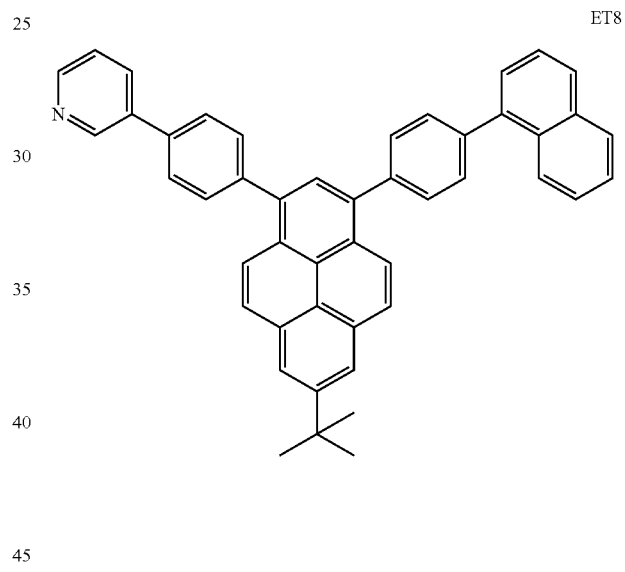
ET9
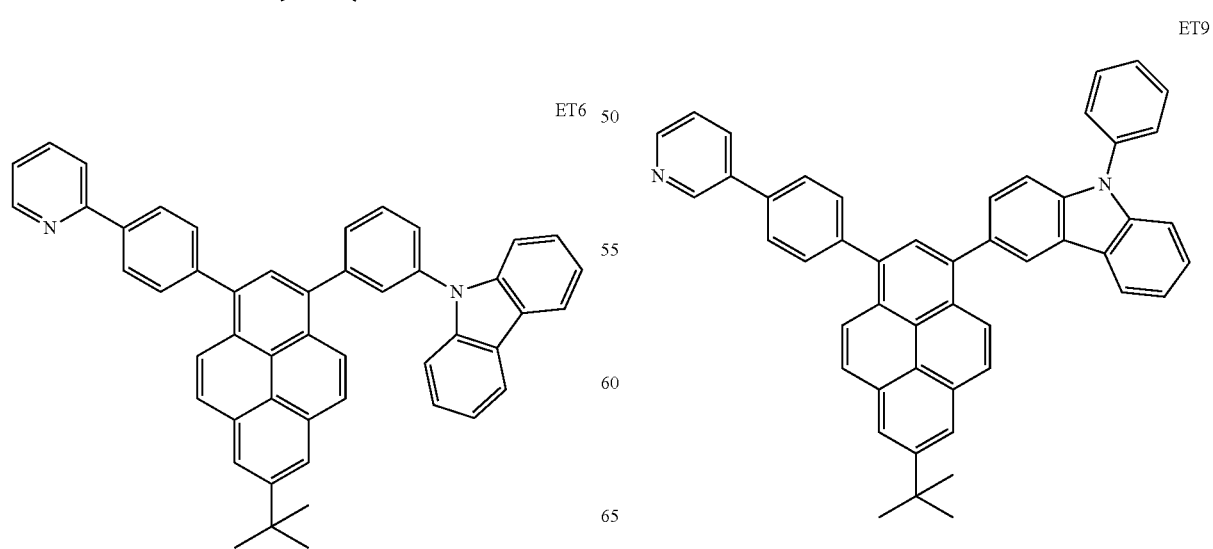

ET10
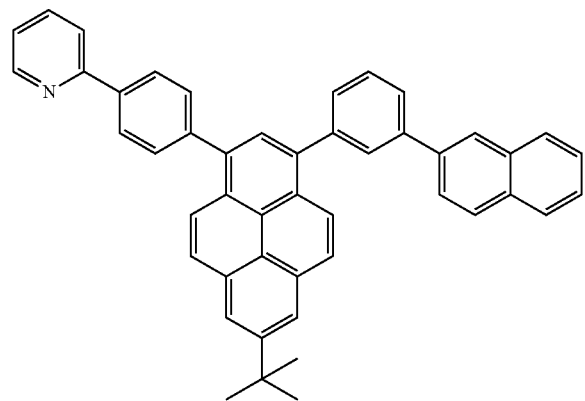
ET11
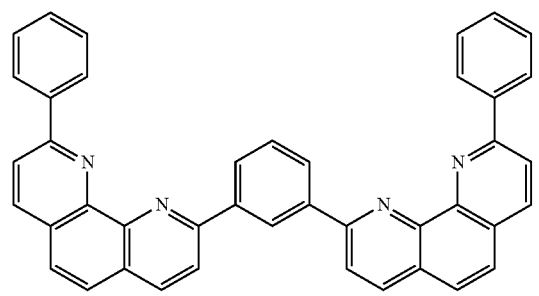
ET12
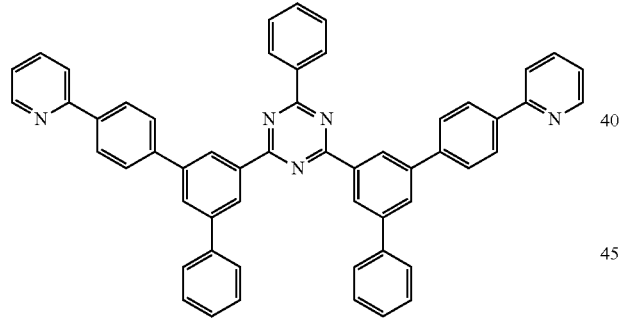
ET13
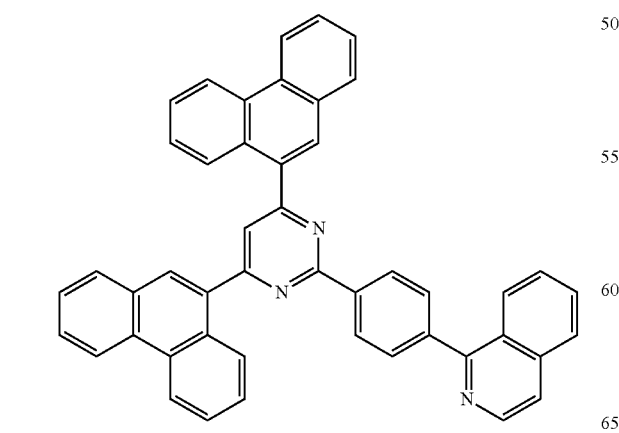
ET14
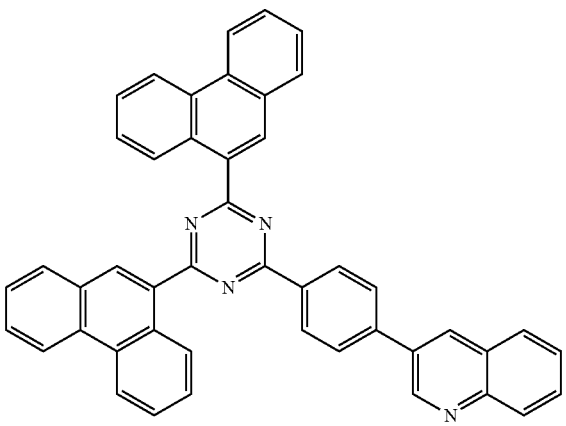
ET15
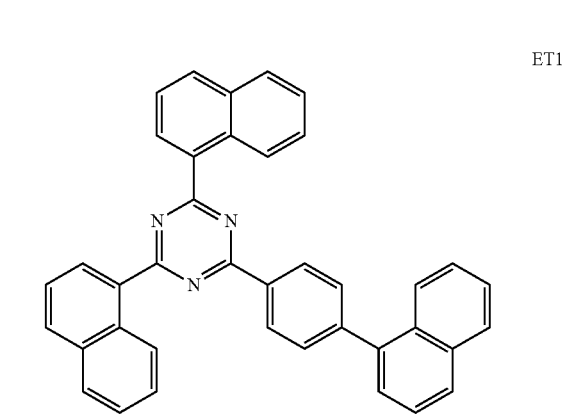
ET16
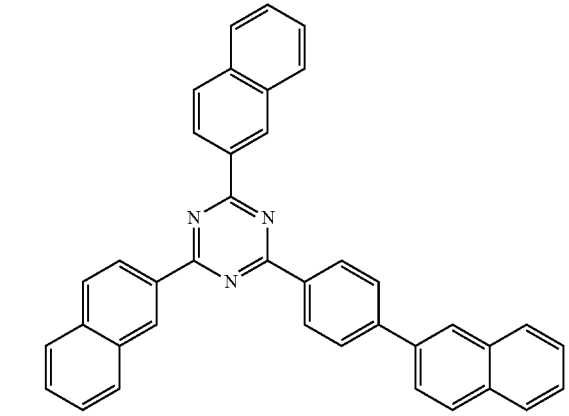

ET17
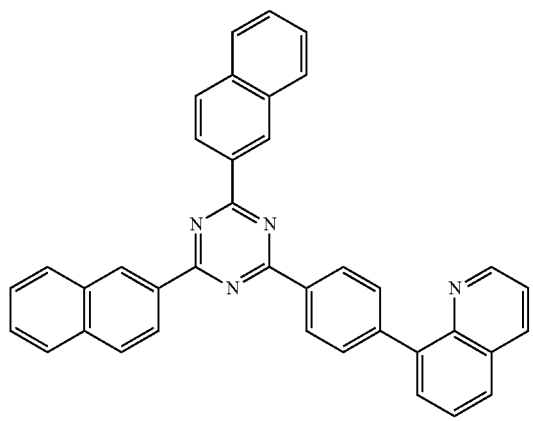
ET20
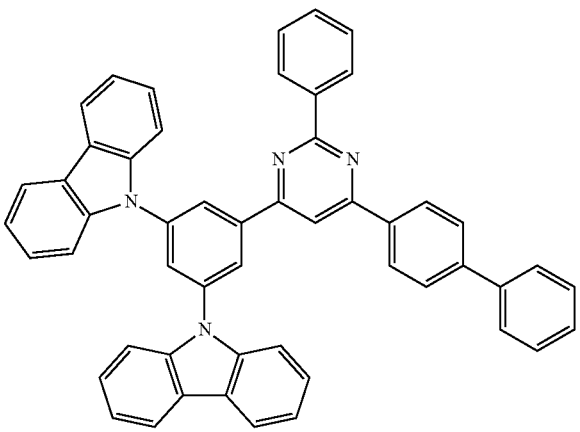
ET18
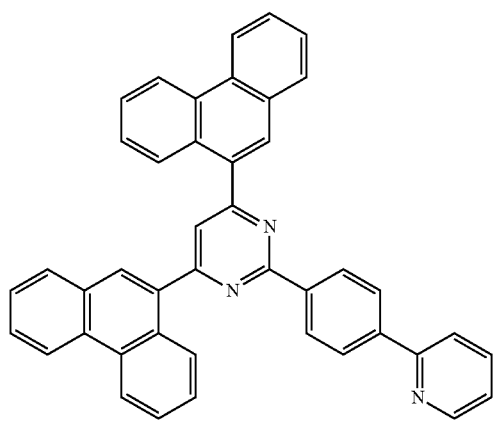
ET21
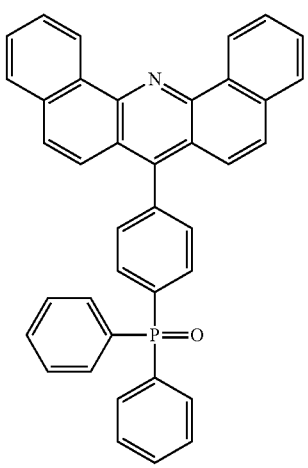
ET19
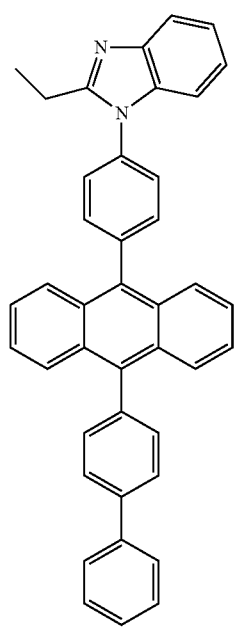
ET22
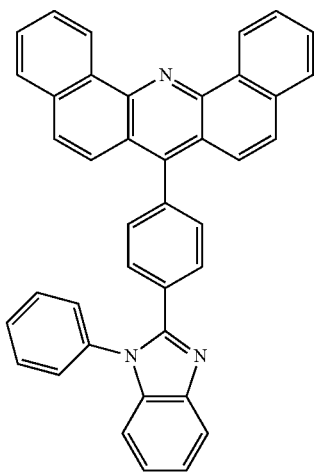

ET23

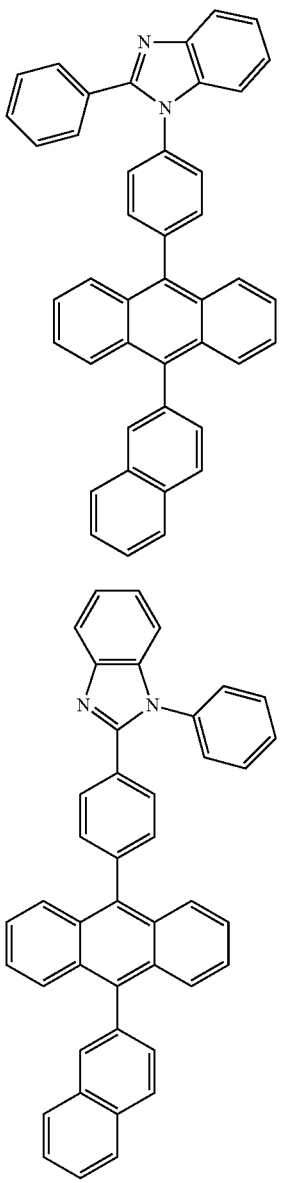

ET24

ET25

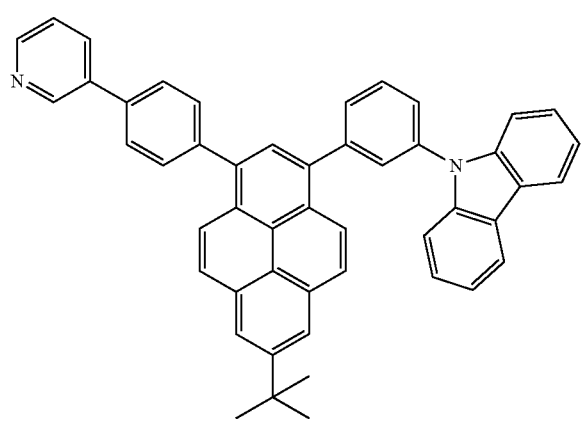

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or ET-D2.

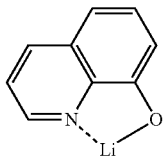

ET-D1

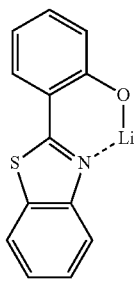

ET-D2

The electron transport region may include an electron injection layer that promotes injection of electrons from the second electrode 19 thereinto.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an iso-propyloxy group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic hydrocarbon group that has 3 to 10 carbon atoms and at least one carbon-carbon double bond in the ring thereof and that has no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one double bond in its ring. Examples of the $C_1$-$C_{10}$ heterocycloalkenyl group are a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and a $C_6$-$C_{60}$ arylene group as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has at least one heteroatom selected from N, O, P, Si, and S as a ring-forming atom, and 1 to 60 carbon atoms. The term "$C_1$-$C_{60}$ heteroarylene group," as used herein refers to a divalent group having a heterocyclic aromatic system that has at least one heteroatom selected from N, O, P, Si, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, wherein the rings may be fused to each other.

The term "$C_6$-$C_{60}$ aryloxy group" as used herein indicates —$OA_{102}$ (wherein $A_{102}$ is the $C_6$-$C_{60}$ aryl group), the term "$C_6$-$C_{60}$ arylthio group" as used herein indicates —$SA_{103}$ (wherein $A_{103}$ is the $C_6$-$C_{60}$ aryl group), and the term "$C_7$-$C_{60}$ arylalkyl group" as used herein indicates -$A_{104}A_{105}$ (wherein $A_{104}$ is the $C_6$-$C_{59}$ aryl group and $A_{105}$ is the $C_1$-$C_{53}$ alkyl group).

The term "$C_2$-$C_{60}$ heteroaryloxy group" as used herein refers to —$OA_{106}$ (wherein $A_{106}$ is the $C_2$-$C_{60}$ heteroaryl group), and the term "$C_2$-$C_{60}$ heteroarylthio group" as used herein indicates —$SA_{107}$ (wherein $A_{107}$ is the $C_2$-$C_{60}$ heteroaryl group).

The term "$C_3$-$C_{60}$ heteroarylalkyl group" as used herein refers to -$A_{108}A_{109}$ ($A_{109}$ is a $C_2$-$C_{59}$ heteroaryl group, and $A_{108}$ is a $C_1$-$C_{58}$ alkylene group).

The term "monovalent non-aromatic condensed polycyclic group" as used herein refers to a monovalent group (for example, having 8 to 60 carbon atoms) having two or more rings condensed to each other, only carbon atoms as ring-forming atoms, and having no aromaticity in its entire molecular structure. Examples of the monovalent non-aromatic condensed polycyclic group include a fluorenyl group. The term "divalent non-aromatic condensed polycyclic group," as used herein, refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and having no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The term "$C_5$-$C_{30}$ carbocyclic group" as used herein refers to a monocyclic group or a polycyclic group, and, according to its chemical structure, a monovalent, divalent, trivalent, tetravalent, pentavalent, or hexavalent group.

The term "$C_2$-$C_{30}$ heterocyclic group" as used herein refers to a saturated or unsaturated cyclic group having, as a ring-forming atom, at least one heteroatom selected from N, O, Si, P, and S other than 2 to 30 carbon atoms. The term "$C_2$-$C_{30}$ heterocyclic group" as used herein refers to a monocyclic group or a polycyclic group, and, according to its chemical structure, a monovalent, divalent, trivalent, tetravalent, pentavalent, or hexavalent group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_1$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of molar equivalents.

EXAMPLES

Synthesis Example 1: Synthesis of Compound 1

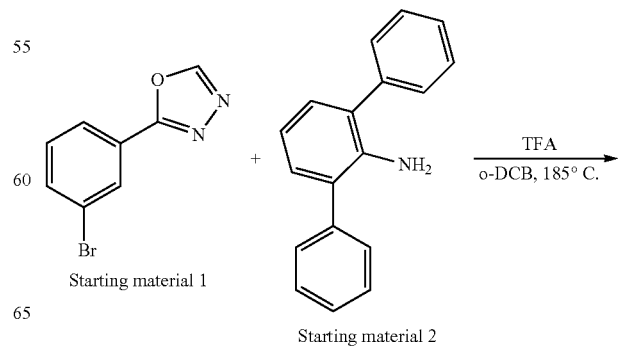

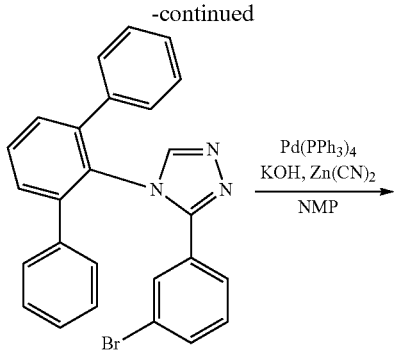

Intermediate 1-1

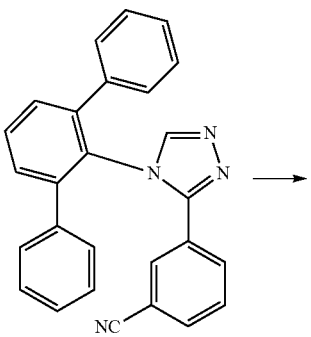

Ligand 1-1

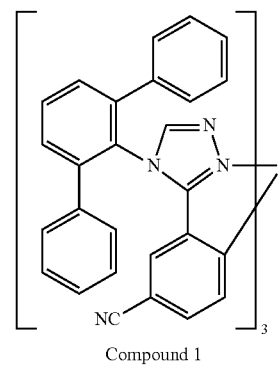

Compound 1

Synthesis of Intermediate 1-1

0.5 grams (g) (1.56 millimoles, mmol) of a starting material 1, 0.49 g (2.18 mmol) of a starting material 2, and 1.3 milliliters (mL) of o-dichlorobenzene (o-DCB) were mixed, and 0.25 g (2.18 mmol) of trifluoroacetic acid (TFA) were added thereto. The resultant mixture was heated and stirred at a temperature of 185° C. overnight. The resultant mixture was then cooled to room temperature, and an excess amount of water was added thereto. The pH of the resultant mixture was adjusted to about 9 by using 10% $Na_2CO_3$ aqueous solution, and an organic layer was extracted by using ethyl acetate. The extracted organic layer was washed by using brine and dried by using anhydrous $MgSO_4$, and a solvent was removed therefrom under reduced pressure. The product obtained therefrom was purified by silica gel column chromatography to obtain 0.35 g (yield: 50%) of Intermediate 1-1.

Synthesis of Ligand 1-1

0.9 g (2 mmol) of Intermediate 1-1 and 10 mL of N-methyl pyrrolidone (NMP) were mixed, and 0.29 g (2.5 mmol) of $Zn(CN)_2$, 0.19 g (3.4 mmol) of KOH, and 0.7 g (0.63 mmol) of $Pd(PPh_3)_4$ were added thereto. The resultant mixture was heated at a temperature of 100° C. for 10 hours. The resultant obtained therefrom was cooled to room temperature, and water is added thereto. An organic layer was extracted by using $CHCl_3$ and washed by using 1 molar (M) NaOH aqueous solution and brine, dried by using anhydrous $MgSO_4$, and a solvent was removed therefrom. The product obtained therefrom was purified by silica gel column chromatography to obtain 0.56 g (yield: 70%) of Ligand 1-1.

Synthesis of Compound 1

3.98 g (10 mmol) of Ligand 1-1 and 1.24 g (2.5 mmol) of $Ir(COD)_2BF_4$ were mixed with 40 mL of NMP, and the resultant mixture underwent a reaction at a temperature of 200° C. for 48 hours. 200 mL of dichloromethane (DCM) was added thereto, and the resultant mixture was washed by using 200 mL of 10% $NH_4OH$ aqueous solution, 200 mL of saturated $NaHCO_3$ aqueous solution, and 200 mL of brine (saturated NaCl aqueous solution). An organic layer obtained therefrom was dried by using anhydrous $MgSO_4$, filtered, and a solvent was removed therefrom under reduced pressure. The product was purified by silica gel column chromatography (DCM 100%—EtOAc (1% in DCM)) to obtain 0.17 g (0.125 mol, yield: 5%) of Compound 1.

M/Z 1384.264 $^1$H NMR ($CD_2Cl_2$, 500 MHz) δ=7.82 (t, 3H), 7.67 (dd, 3H), 7.64 (dd, 3H), 7.58 (s, 3H), 7.10 (t, 6H), 7.05 (tt, 3H), 6.95-7.02 (m, 9H), 6.77-6.85 (m, 9H), 6.73-6.79 (m, 9H), 6.33 (d, 3H).

Synthesis Example 2: Synthesis of Compound 5

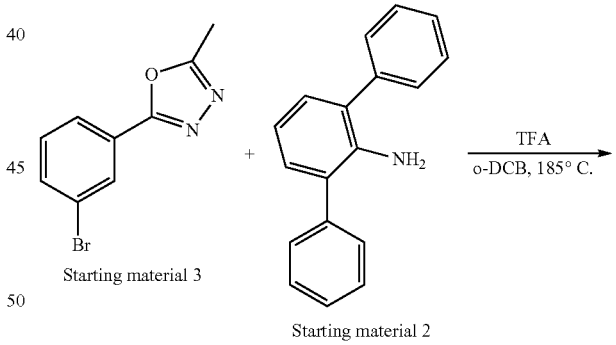

Starting material 3      Starting material 2

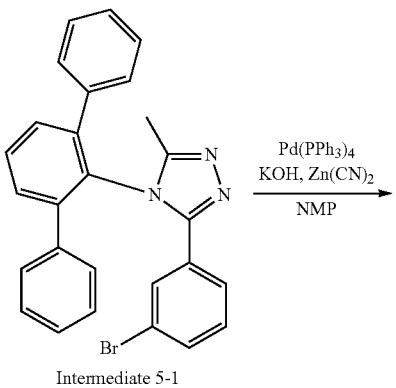

Intermediate 5-1

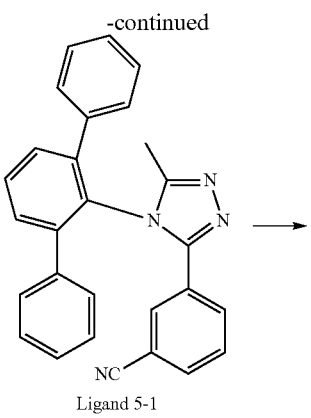

Ligand 5-1

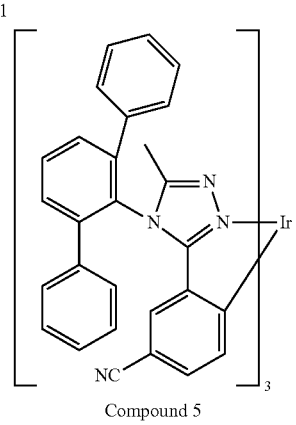

Compound 5

Synthesis of Intermediate 5-1

Intermediate 5-1 was synthesized in the same manner as Intermediate 1-1 in Synthesis Example 1, except that a starting material 3 was used instead of the starting material 1.

Synthesis of Ligand 5-1

Ligand 5-1 was synthesized in the same manner as Ligand 1-1 in Synthesis Example 1, except that Intermediate 5-1 was used instead of Intermediate 1-1.

Synthesis of Compound 5

Compound 5 (yield: 7%) was synthesized in the same manner as in Synthesis Example 1, except that Ligand 5-1 was used instead of Ligand 1-1.

$^1$H NMR (CD$_2$Cl$_2$, 500 MHz) δ=7.85 (t, 3H), 7.69 (td, 6H), 6.95-7.05 (m, 9H), 6.95 (d, 6H), 6.91 (t, 3H), 6.85 (dd, 3H), 6.81 (d, 6H), 6.72 (t, 9H), 6.39 (d, 3H), 1.92 (s, 9H).

Synthesis Example 3: Synthesis of Compound 9

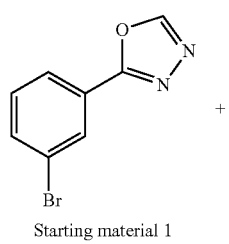

Starting material 1

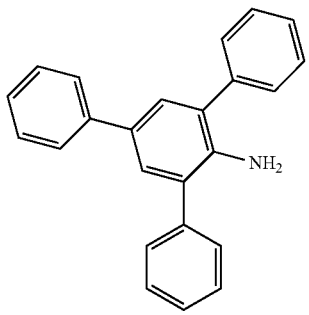

Starting material 4

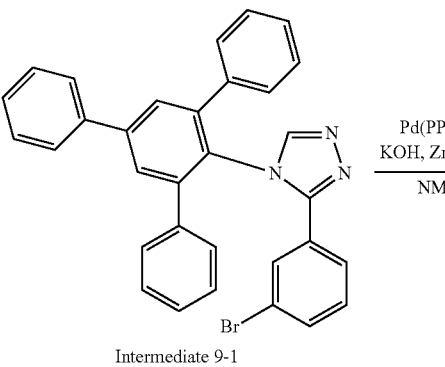

Intermediate 9-1

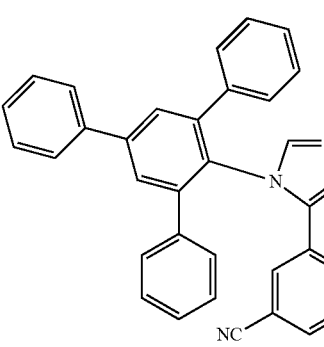

Ligand 9-1

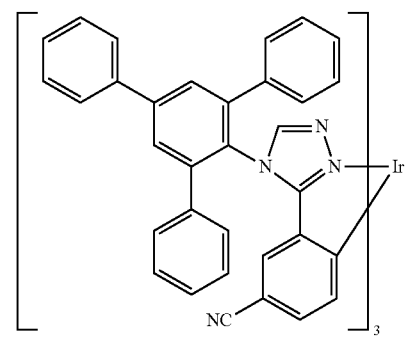

Compound 9

Synthesis of Intermediate 9-1

Intermediate 9-1 was synthesized in the same manner as Intermediate 1-1 in Synthesis Example 1, except that a starting material 4 was used instead of the starting material 2.

Synthesis of Ligand 9-1

Ligand 9-1 was synthesized in the same manner as Ligand 1-1 in Synthesis Example 1, except that Intermediate 9-1 was used instead of Intermediate 1-1.

Synthesis of Compound 9

Compound 9 (yield: 6%) was synthesized in the same manner as in Synthesis Example 1, except that Ligand 9-1 was used instead of Ligand 1-1.

M/Z 1613.872 NMR data (CD$_2$Cl$_2$, 300 MHz) δ=7.9 (d, 6H), 7.82 (d, 6H), 7.62 (s, 3H), 7.4-7.6 (m, 9H), 7.0-7.2 (m, 18H), 6.98 (s, 3H), 6.76-6.94 (m, 15H), 6.38 (d, 3H).

Evaluation Example 1: Evaluation of HOMO, LUMO, and Triplet (T$_1$) Energy Levels HOMO, LUMO, and T$_1$ energy levels of Compounds 1, 5, and 9 were evaluated by using the methods provided in Table 3. Results thereof are shown in Table 4.

TABLE 3

| | |
|---|---|
| HOMO energy level evaluation method | A voltage-current (V-A) graph of each Compound was obtained by using a cyclic voltammetry (CV) (electrolyte: 0.1M Bu$_4$NClO$_4$/solvent: CH$_2$Cl$_2$/electrode: 3-electrode system (working electrode: GC, reference electrode: Ag/AgCl, auxiliary electrode: Pt)), and then, a HOMO energy level of each Compound was calculated from an onset oxidation potential of the V-A graph. |
| LUMO energy level evaluation method | Each Compound was diluted at a concentration of 1 × 10$^{-5}$M in CHCl$_3$, an UV absorption spectrum thereof was measured at room temperature by using a Shimadzu UV-350 Spectrometer, and then, a LUMO energy level thereof was calculated by using an optical band gap (Eg) from an edge of the absorption spectrum. |
| T$_1$ energy level evaluation method | After a mixture of toluene and each Compound (1 milligram (mg) of each Compound was dissolved in 3 cubic centimeters (cc) of toluene) was added to a quartz cell and then added to liquid nitrogen (77 Kelvins, K), a photoluminescence spectrum was measured by using a photoluminescence measurement apparatus. The T$_1$ energy level was calculated by analyzing peaks observed only at a low temperature through comparison between the photoluminescence spectrum and a general room-temperature photoluminescence spectrum. |

TABLE 4

| Compound No. | HOMO (eV) | LUMO (eV) | T$_1$ (eV) |
|---|---|---|---|
| 1 | −5.49 | −2.76 | 2.73 |
| 5 | −5.43 | −2.72 | 2.71 |
| 9 | −5.49 | −2.76 | 2.73 |

Referring to Table 4, it is confirmed that Compounds 1, 5, and 9 have electrical characteristics suitable for use as materials for an organic light-emitting device.

Evaluation Example 2: Evaluation of Thermal Characteristics

A thermal analysis (N$_2$ atmosphere, temperature range: room temperature to 600° C. (10° C./min), pan type: Pt pan in disposable Al pan) was performed on Compounds 1, 5, and 9 by using thermo gravimetric analysis (TGA). Results thereof are shown in Table 5.

TABLE 5

| Compound No. | Td (1%, ° C.) |
|---|---|
| 1 | 310 |
| 5 | 230 |
| 9 | 245 |

Referring to Table 5, it has been determined that Compounds 1, 5, and 9 have excellent thermal stability.

Evaluation Example 3: Evaluation of Photoluminescence (PL) Spectrum

Light emission characteristics of each Compound were evaluated by evaluating PL spectra of Compounds 1, 5, and 9. Compound 1 was diluted at a concentration of 10 millimolar (mM) in CHCl$_3$, and a PL spectrum was measured at room temperature by using an ICS PC1 Spectrofluorometer equipped with a xenon lamp. This process was repeated on Compounds 5 and 9.

Emission wavelengths and maximum emission wavelengths ($\lambda_{max}$) of the PL spectra of Compounds 1, 5, and 9 are shown in Table 6.

TABLE 6

| Compound No. | Emission wavelengths (nm) |
|---|---|
| 1 | 454 ($\lambda_{max}$), 482 |
| 5 | 457 ($\lambda_{max}$), 487 |
| 9 | 454 ($\lambda_{max}$), 483 |

Referring to Table 6, it is confirmed that Compounds 1, 5, and 9 have PL emission characteristics suitable for deep blue light emission.

Example 1

A glass substrate, on which an ITO electrode (first electrode, anode) having a thickness of 1,500 Å was formed, was sonicated with distilled water. After the sonicating with distilled water was completed, the glass substrate was ultrasonically cleaned by sequentially using iso-propyl alcohol, acetone, and methanol, was dried, and then transferred to a plasma cleaner. The glass substrate was cleaned for 5 minutes by using oxygen plasma and was provided to a vacuum deposition apparatus.

Compound HT3 was vacuum-deposited on the ITO electrode of the glass substrate to form a first hole injection layer having a thickness of 3,500 Å, Compound HT-D1 was vacuum-deposited on the first hole injection layer to form a second hole injection layer having a thickness of 300 Å, and TAPC was vacuum-deposited on the second hole injection layer to form an electron blocking layer having a thickness of 100 Å, thereby forming a hole transport region.

Compound H52 and Compound 1 (dopant, 10 wt %) were co-deposited on the hole transport region to form an emission layer having a thickness of 300 Å.

Compound ET3 was vacuum-deposited on the emission layer to form an electron transport layer having a thickness of 250 Å, ET-D1 (LiQ) was deposited on the electron transport layer to form an electron injection layer having a thickness of 5 Å, and Al was deposited on the electron injection layer to form a second electrode (cathode) having a thickness of 1,000 Å, thereby completing the manufacture of an organic light-emitting device.

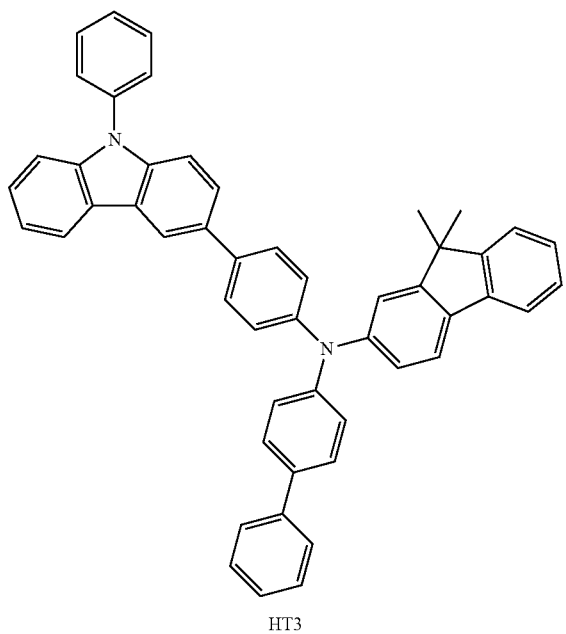
HT3

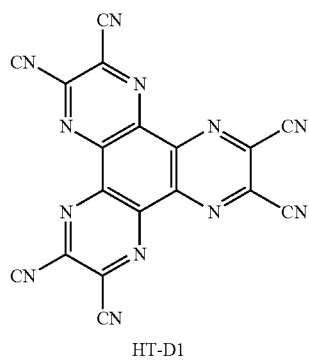
HT-D1

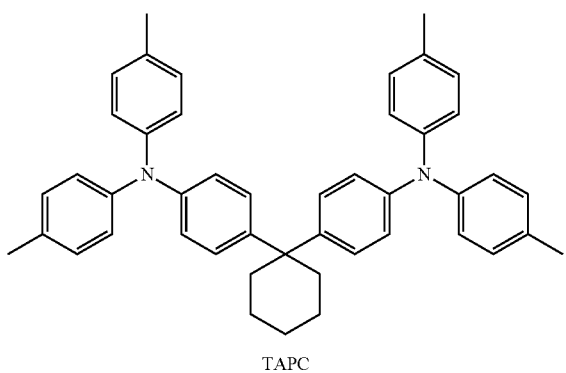
TAPC

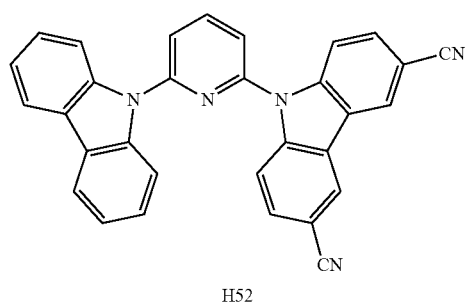
H52

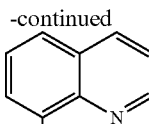

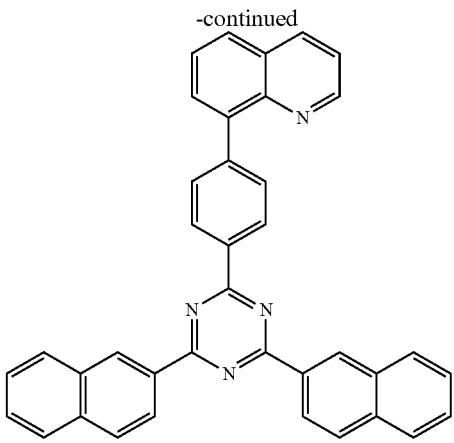
ET3

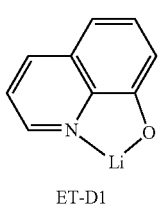
ET-D1

Examples 2 and 3

Organic light-emitting devices were manufactured in the same manner as in Example 1, except that Compounds shown in Table 7 were each used instead of Compound 1 as a dopant in forming an emission layer.

Evaluation Example 4: Evaluation of Characteristics of Organic Light-Emitting Device An EL spectrum, a change in current density according to voltage, a change in luminance according to voltage, efficiency, conversion efficiency, external quantum emission efficiency, lifespan, and CIE color coordinates were measured with respect to the organic light-emitting devices manufactured according to Examples 1 to 3. Specific measurement methods are as follows, and results thereof are shown in Table 7.

(1) Measurement of EL Spectrum

EL spectra of the manufactured organic light-emitting devices were measured by using a luminance meter (Minolta Cs-1000A) at a luminance of 500 candelas per square meter ($cd/m^2$).

(2) Measurement of Change in Current Density According to Voltage

A current value flowing through the manufactured organic light-emitting devices was measured by using a current-voltage meter (Keithley 2400) with respect to the manufactured organic light-emitting devices while increasing a voltage from 0 volts (V) to 10 V, and a current density was obtained by dividing the measured current value by an area.

(3) Measurement of Change in Luminance According to Voltage

Luminance was measured by using a luminance meter (Minolta Cs-1000A) with respect to the manufactured organic light-emitting devices while increasing a voltage from 0 V to 10 V, and results thereof were obtained.

(4) Measurement of Conversion Efficiency

Current efficiency (cd/A) of the same current density (10 milliamperes per square centimeter, mA/cm$^2$) was calculated by using the luminance and the current density measured from (2) and (3) and the voltage. Then, conversion efficiency was calculated by dividing the current efficiency by a y value of CIE color coordinates measured in (6).

(5) Measurement of Lifespan

An amount of time ($T_{95}$) that lapsed when luminance measured from (3) was 95% of initial luminance (100%) was calculated.

(6) Measurement of CIE Color Coordinates

CIE color coordinates were obtained by measuring EL spectra of the manufactured organic light-emitting devices at a luminance of 500 cd/m$^2$ by using a luminance meter (Minolta Cs-1000A).

Referring to Table 7, it is confirmed that the organic light-emitting devices of Examples 1 to 3 have excellent efficiency, external quantum emission efficiency, and lifespan characteristics and can also emit deep blue light.

As described above, the organometallic compounds according to embodiments of the present disclosure have excellent electrical characteristics and thermal stability, and accordingly, organic light-emitting devices including such organometallic compounds may have excellent driving voltage, current density, efficiency, power, color purity, and lifespan characteristics.

It should be understood that embodiments described herein should be considered in a descriptive sense only and not for purposes of limitation. Descriptions of features or

TABLE 7

| Example | Dopant | Current density (mA/cm$^2$) | Luminance (cd/m$^2$) | Efficiency (cd/A) | Conversion Efficiency | EQE (%) | $\lambda_{max}$ in EL spectrum (nm) | $T_{95}$ (hr) | Color coordinates (x, y) |
|---|---|---|---|---|---|---|---|---|---|
| 1 | 1 | 3.97 | 1000 | 25.24 | 110.1 | 14.6 | 455 | 3.03 | 0.166, 0.229 |
| 2 | 5 | 3.58 | 1000 | 28.09 | 108.2 | 15.0 | 458 | 0.96 | 0.171, 0.259 |
| 3 | 9 | 3.55 | 1000 | 28.23 | 120.4 | 16.2 | 457 | 2.85 | 0.169, 0.235 |

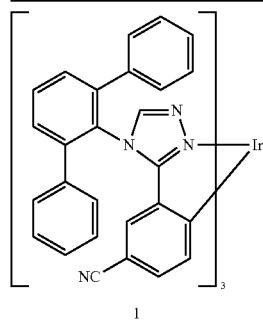

1

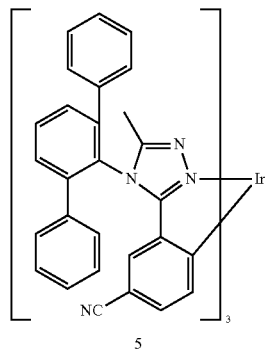

5

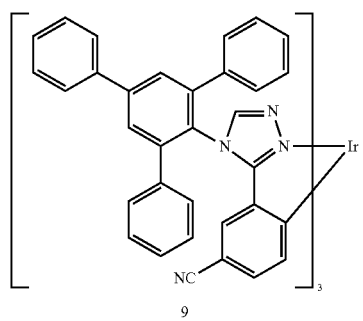

9 aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. An organometallic compound represented by Formula 1:

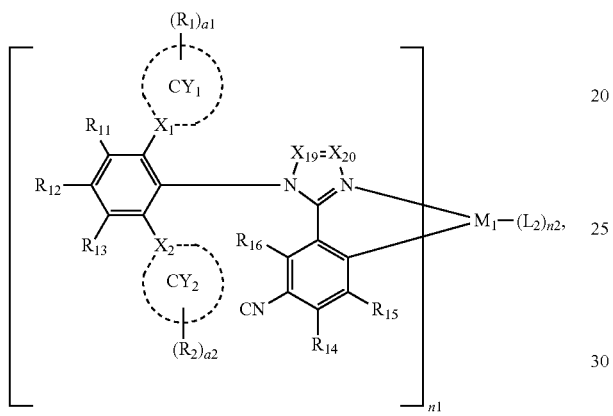

Formula 1 wherein, in Formula 1, $M_1$ is selected from a first-row transition metal of the Periodic Table of Elements, a second-row transition metal of the Periodic Table of Elements, and a third-row transition metal of the Periodic Table of Elements, n1 is 1, 2, or 3, n2 is 0, 1, 2, 3, or 4, wherein, when n2 is two or more, two or more groups $L_2$ are identical to or different from each other, $X_1$ and $X_2$ are each independently carbon or nitrogen, $CY_1$ and $CY_2$ are each independently a $C_5$-$C_{30}$ carbocyclic group or a $C_2$-$C_{30}$ heterocyclic group, $X_{19}$ is N or $C(R_{19})$, and $X_{20}$ is N or $C(R_{20})$, provided that at least one of $X_{19}$ and $X_{20}$ is N, $L_2$ in Formula 1 is selected form ligands represented by Formulae 3A to 3C and 3E to 3F:

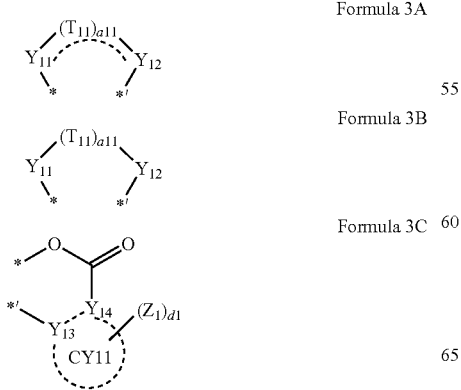

Formula 3A

Formula 3B

Formula 3C

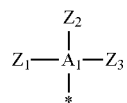

Formula 3E

Formula 3F $R_1$, $R_2$, $R_{11}$ to $R_{16}$, $R_{19}$, and $R_{20}$ are each independently selected from hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_1$-$C_{60}$ aryl group, a substituted or unsubstituted $C_1$-$C_{60}$ aryloxy group, a substituted or unsubstituted $C_1$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), two or more neighboring groups selected from $R_1$, $R_2$, $R_{11}$ to $R_{13}$, $CY_1$, and $CY_2$ are optionally linked to form a substituted or unsubstituted $C_5$-$C_{30}$ carbocyclic group or a substituted or unsubstituted $C_2$-$C_{30}$ heterocyclic group, a1 and a2 are each independently an integer from 0 to 5, at least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_1$-$C_{60}$ aryl group, the substituted $C_1$-$C_{60}$ aryloxy group, the substituted $C_1$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group is selected from:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —B(Q$_{16}$)(Q$_{17}$), and —P(=O)(Q$_{18}$)(Q$_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_1$-$C_{60}$ aryl group, a $C_1$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_1$-$C_{60}$ aryl group, a $C_1$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_1$-$C_{60}$ aryl group, a $C_1$-$C_{60}$ aryloxy group, a $C_1$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —B(Q$_{26}$)(Q$_{27}$), and —P(=O)(Q$_{28}$)(Q$_{29}$); and —N(Q$_{31}$)(Q$_{32}$), —Si(Q$_{33}$)(Q$_{34}$)(Q$_{35}$), —B(Q$_{36}$)(Q$_{37}$), and —P(=O)(Q$_{38}$)(Q$_{39}$), and $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_1$-$C_{60}$ aryl group, a $C_1$-$C_{60}$ aryl group substituted with at least one selected from a $C_1$-$C_{60}$ alkyl group and a $C_1$-$C_{60}$ aryl group, a $C_1$-$C_{60}$ aryloxy group, a $C_1$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, wherein, in Formulae 3A so 3C and 3E to 3F, $Y_{11}$ is selected from O, N, N(Z$_1$), P(Z$_1$)(Z$_2$), and As(Z$_1$)(Z$_2$), $Y_{12}$ is selected from O, N, N(Z$_3$), P(Z$_3$)(Z$_4$), and As(Z$_3$)(Z$_4$), $CY_{11}$ is a $C_2$-$C_{30}$ heterocyclic group, $T_{11}$ is selected from a single bond, a double bond, *—C(Z$_{11}$)(Z$_{12}$)—*', *—C(Z$_{11}$)=C(Z$_{12}$)—*', *=C(Z$_{11}$)—*', *—C(Z$_{11}$)=*', *=C(Z$_{11}$)—C(Z$_{12}$)=C(Z$_{13}$)—*', *—C(Z$_{11}$)=C(Z$_{12}$)—C(Z$_{13}$)=*', *—N(Z$_{11}$)—*', and a substituted or unsubstituted $C_5$-$C_{30}$ carbocylic group, a11 is an integer from 1 to 10, $Y_{13}$ to $Y_{14}$ are each independently carbon (C) or nitrogen (N), $Y_{13}$ and $Y_{14}$ are linked via a single bond or a double bond, $CY_{12}$ and $CY_{13}$ are each independently a $C_5$-$C_{30}$ carbocyclic group or a $C_2$-$C_{30}$ heterocyclic group, $A_1$ is P or As, $Z_1$ to $Z_4$ and $Z_{11}$ to $Z_{13}$ are each independently selected from hydrogen, deuterium, —F, —Cl, —Br, —I, a hydroxyl group, a cyano group, a nitro group an amino group, an amidino group, a hydrazine group, a hydrazone group, a carboxylic acid group or a salt thereof, a sulfonic acid group or a salt thereof, a phosphoric acid croup or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a subsumed or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —B(Q$_6$)(Q$_7$), and —P(=O)(Q$_8$)(Q$_9$), $Q_1$ to $Q_9$ are each independently selected from hydrogen, deuterium, —F, —Cl, —Br, —I, a hydroxyl group, a cyano group, a nitro group an amino group, an amidino group, a hydrazine group, a hydrazone group, a carboxylic acid group or a salt thereof, a sulfonic acid group or a salt thereof a phosphoric acid group or a salt thereof a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkyenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$, heteroaryl group, a $C_1$-$C_{60}$ heteroaryloxy group, a $C_1$-$C_{60}$ heteroarylthio group, a $C_2$-$C_{60}$ heteroaralkyl group, a monovalent non-aromatic condensed polycyclic group, and a monovalent non-aromatic condensed heteropolycyclic group, d1 and d2 are each independently an integer from 0 to 10, and

* and *' each indicate a binding site to $M_1$ in Formula 1.

2. The organometallic compound of claim 1, wherein
$M_1$ is Ir or Os, and the sum of n1 and n2 is 3 or 4; or
$M_1$ is Pt, and the sum of n1 and n2 is 2.

3. The organometallic compound of claim 1, wherein $CY_1$ and $CY_2$ are each independently selected from a cyclopentene group, a cyclohexene group, a benzene group, a pyridine group, a pyrimidine group, a pyridazine group, a pyrazine group, a triazine group, a pyrrole group, a pyrazole group, an imidazole group, a triazole group, an oxazole group, an isoxazole group, an oxadiazole group, a thiazole group, an isothiazole group, and a thiadiazole group.

4. The organometallic compound of claim 1, wherein
$X_{19}$ is $C(R_{19})$, and $X_{20}$ is N; or
$X_{19}$ is N, and $X_{20}$ is $C(R_{20})$.

5. The organometallic compound of claim 1, wherein $R_1$, $R_2$, $R_{11}$ to $R_{16}$, $R_{19}$, and $R_{20}$ are each independently selected from:

hydrogen, deuterium, —F, a cyano group, a nitro group, —$SF_5$, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbomanyl group, a norbomenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group;

a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbomanyl group, a norbomenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group, each substituted with at least one selected from deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbomanyl group, a norbomenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group; and —$N(Q_1)(Q_2)$, —$Si(Q_3)(Q_4)(Q_5)$, —$B(Q_6)(Q_7)$, and —$P(=O)(Q_8)(Q_9)$, and $Q_1$ to $Q_9$ are each independently selected from:
—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and -$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

6. The organometallic compound of claim 1, wherein $R_1$, $R_2$, $R_{11}$ to $R_{16}$, $R_{19}$, and $R_{20}$ are each independently selected from hydrogen, deuterium, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, groups represented by Formulae 9-1 to 9-24, groups represented by Formulae 10-1 to 10-62, and —$Si(Q_3)(Q_4)(Q_5)$:

Formula 9-1

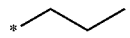

Formula 9-2

Formula 9-3

Formula 9-4

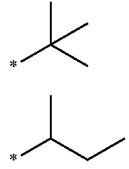

Formula 9-5

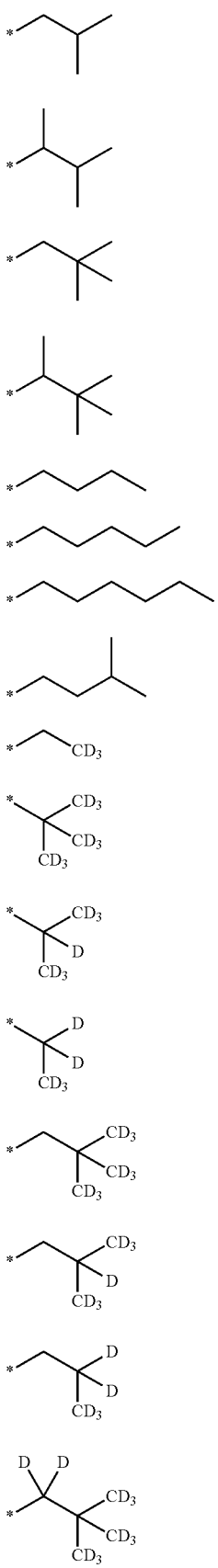
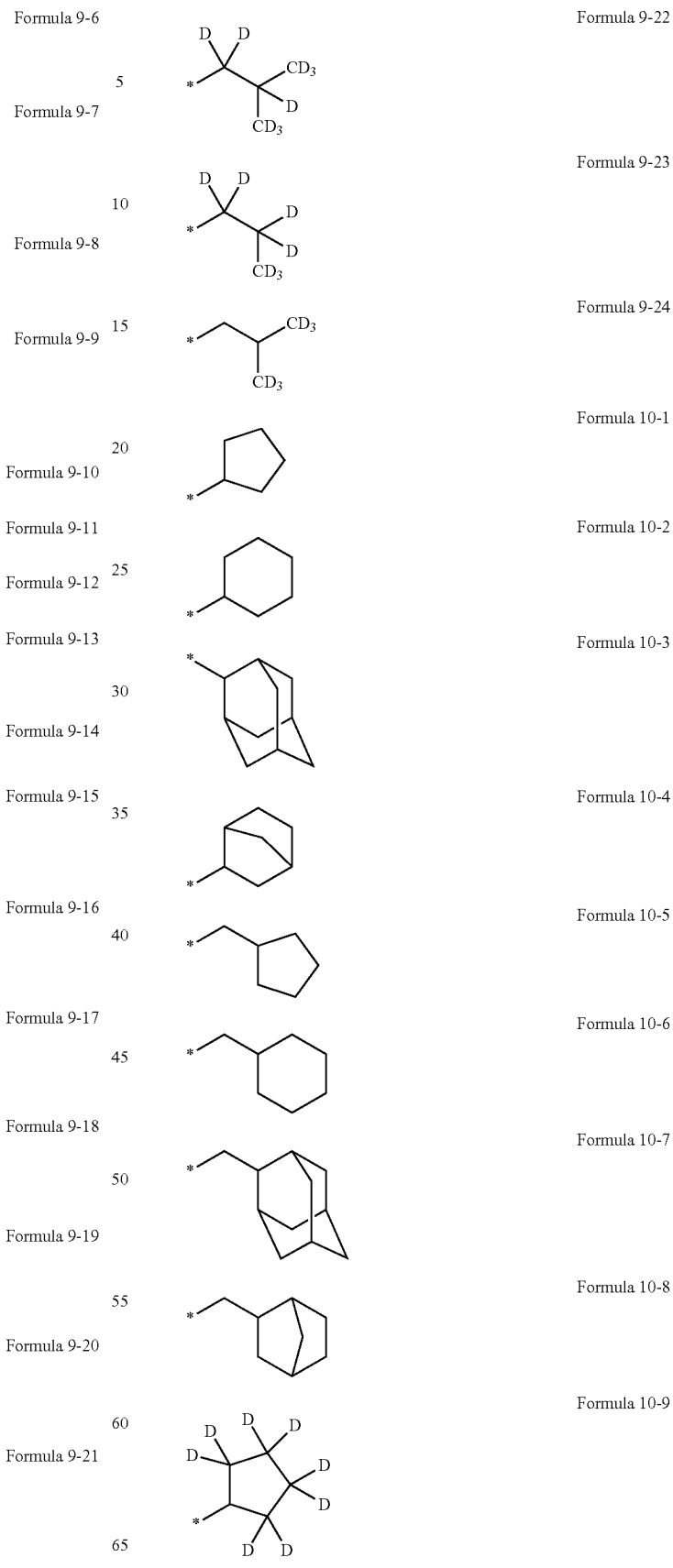

Formula 10-10
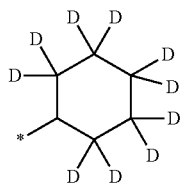
Formula 10-11
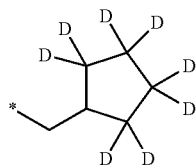
Formula 10-12
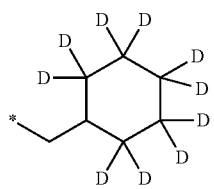
Formula 10-13
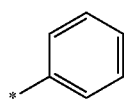
Formula 10-14
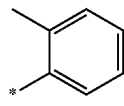
Formula 10-15
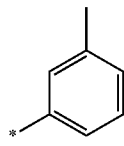
Formula 10-16
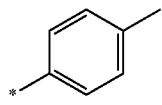
Formula 10-17
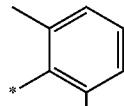
Formula 10-18
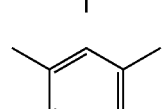
Formula 10-19
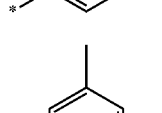
Formula 10-20
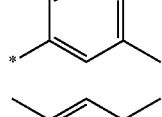
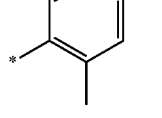
Formula 10-21
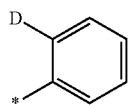
Formula 10-22
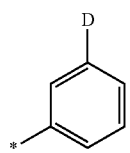
Formula 10-23
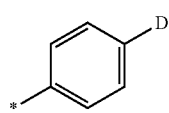
Formula 10-24
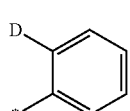
Formula 10-25
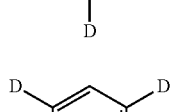
Formula 10-26
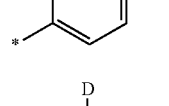
Formula 10-27
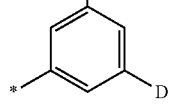
Formula 10-28
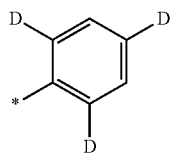
Formula 10-29
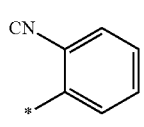
Formula 10-30
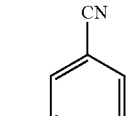
Formula 10-31
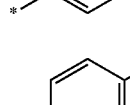
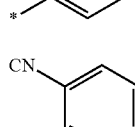
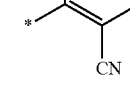

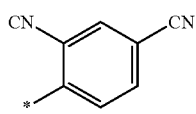
Formula 10-32
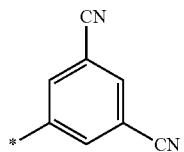
Formula 10-33
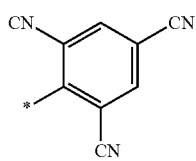
Formula 10-34
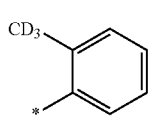
Formula 10-35
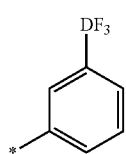
Formula 10-36
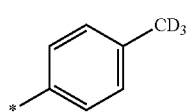
Formula 10-37
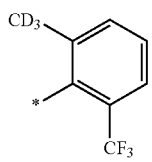
Formula 10-38
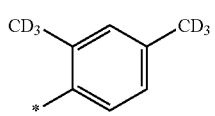
Formula 10-39
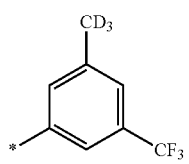
Formula 10-40
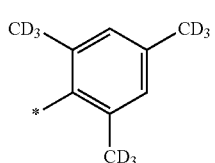
Formula 10-41
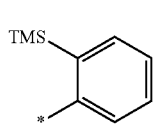
Formula 10-42
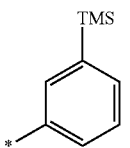
Formula 10-43
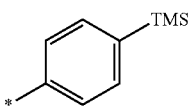
Formula 10-44
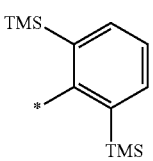
Formula 10-45
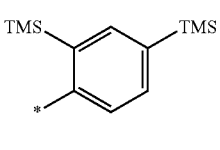
Formula 10-46
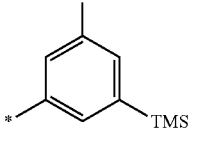
Formula 10-47
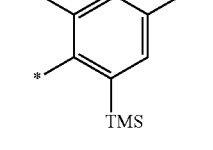
Formula 10-48
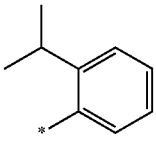
Formula 10-49
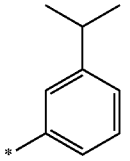
Formula 10-50
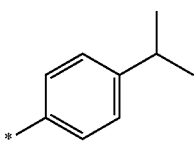
Formula 10-51
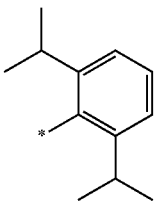
Formula 10-52

-continued

Formula 10-53
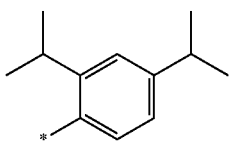

Formula 10-54
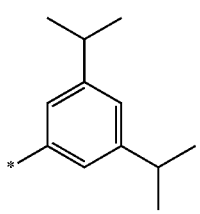

Formula 10-55
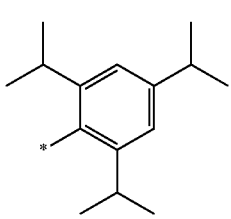

Formula 10-56
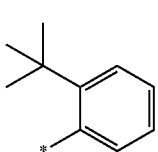

Formula 10-57
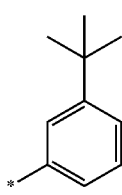

Formula 10-58
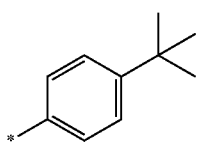

Formula 10-59
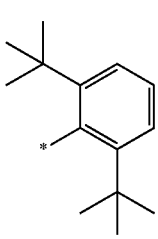

Formula 10-60
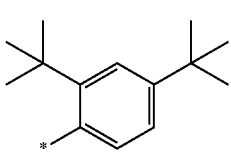

-continued

Formula 10-61
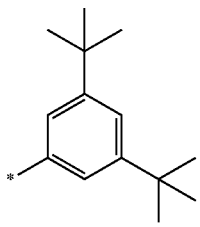

Formula 10-62
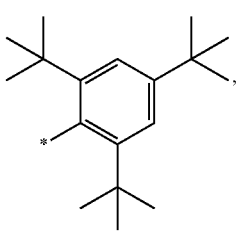

wherein * in Formulae 9-1 to 9-24 and 10-1 to 10-62 indicates a binding site to a neighboring atom.

7. The organometallic compound of claim 1, wherein
i) $X_{19}$ is $C(R_{19})$, $X_{20}$ is N, and at least one of $R_1$, $R_2$, $R_{11}$ to $R_{16}$, and $R_{19}$ is a deuterium-containing substituent;
ii) $X_{19}$ is N, $X_{20}$ is $C(R_{20})$, and at least one of $R_1$, $R_2$, $R_{11}$ to $R_{16}$, and $R_{20}$ is a deuterium-containing substituent; or
iii) $X_{19}$ and $X_{20}$ are each N, and at least one of $R_1$, $R_2$, and $R_{11}$ to $R_{16}$ is a deuterium-containing substituent, and
the deuterium-containing substituent is selected from:
deuterium; and
a $C_1$-$C_{20}$ alkyl group, a $C_1$-$C_{20}$ alkoxy group, and a phenyl group, each substituted with at least one deuterium.

8. The organometallic compound of claim 7, wherein
the deuterium-containing substituent is selected from:
deuterium; and
a methyl group, an ethyl group, an n-propyl group, an iso-propyl group, an n-butyl group, a sec-butyl group, an iso-butyl group, a tert-butyl group, an n-pentyl group, an iso-pentyl group, a 1-methylbutyl group, a 2-methylbutyl group, a neo-pentyl group, a 1,2-dimethylpropyl group, and a tert-pentyl group, each substituted with at least one deuterium.

9. The organometallic compound of claim 1, wherein
i) $X_{19}$ is $C(R_{19})$, $X_{20}$ is N, and at least one of $R_{12}$, $R_{14}$, and $R_{19}$ is a deuterium-containing substituent;
ii) $X_{19}$ is N, $X_{20}$ is $C(R_{20})$, and at least one of $R_{12}$, $R_{14}$, and $R_{20}$ is a deuterium-containing substituent; or
iii) $X_{19}$ and $X_{20}$ are each N, and at least one of $R_{12}$ and $R_{14}$ is a deuterium-containing substituent, and
the deuterium-containing substituent is selected from:
deuterium; and
a methyl group, an ethyl group, an n-propyl group, an iso-propyl group, an n-butyl group, a sec-butyl group, an iso-butyl group, a tert-butyl group, an n-pentyl group, an iso-pentyl group, a 1-methylbutyl group, a 2-methylbutyl group, a neo-pentyl group, a 1,2-dimethylpropyl group, and a tert-pentyl group, each substituted with at least one deuterium.

10. The organometallic compound of claim 1, wherein
the organometallic compound is represented by one of Formulae 1-1 to 1-3:

Formula 1-1

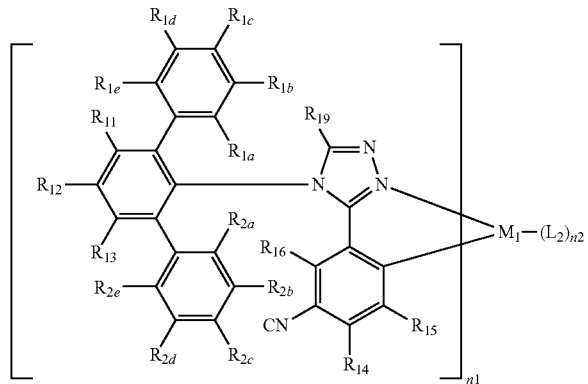

Formula 1(1)

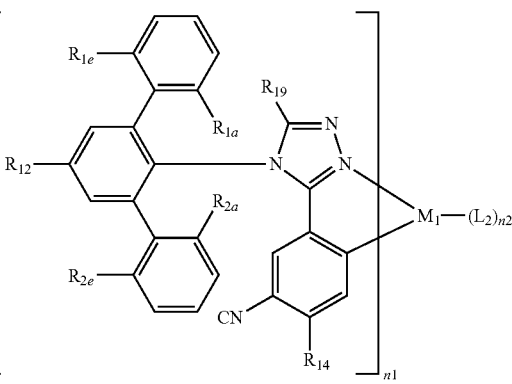

Formula 1-2

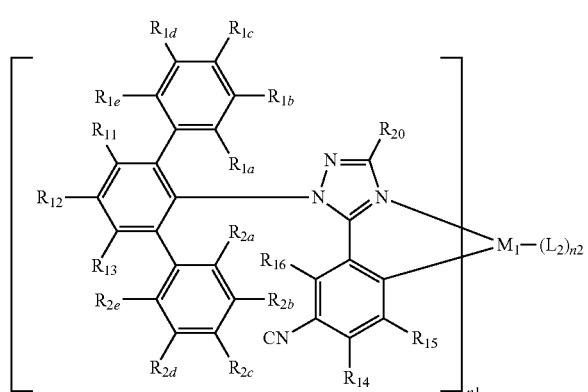

Formula 1(2)

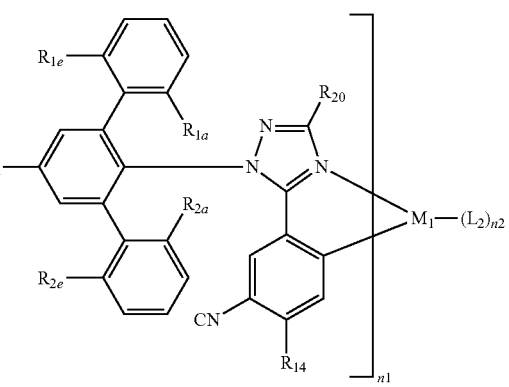

Formula 1-3

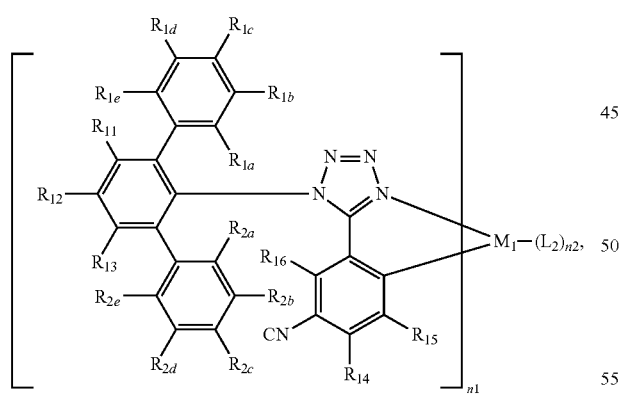

Formula 1(3)

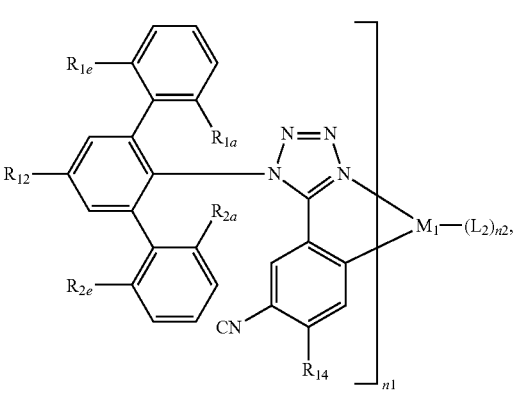

wherein, in Formulae 1-1 to 1-3, $M_1$, n1, $L_2$, n2, $R_{11}$ to $R_{16}$, $R_{19}$, and $R_{20}$ are each independently the same as described in claim 1, $R_{1a}$ to $R_{1e}$ are each independently the same as described in connection with $R_1$ in claim 1, and $R_{2a}$ to $R_{2e}$ are each independently the same as described in connection with $R_2$ in claim 1.

11. The organometallic compound of claim 1, wherein the organometallic compound is represented by one of Formulae 1(1) to 1(3):

wherein, in Formulae 1(1) to 1(3), $M_1$, n1, $L_2$, n2, $R_{12}$, $R_{14}$, $R_{19}$, and $R_{20}$ are each independently the same as described in claim 1, $R_{1a}$ and $R_{1e}$ are each independently the same as described in connection with $R_1$ in claim 1, and $R_{2a}$ and $R_{2e}$ are each independently the same as described in connection with $R_2$ in claim 1.

12. The organometallic compound of claim 1, wherein the organometallic compound is one of Compounds 1 to 10:

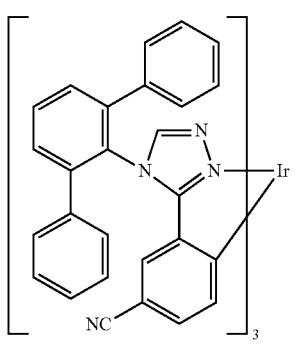
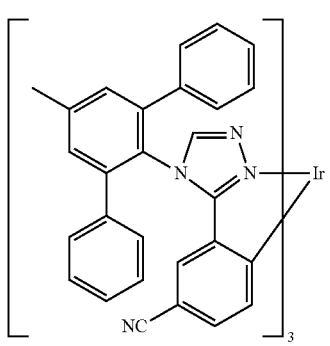
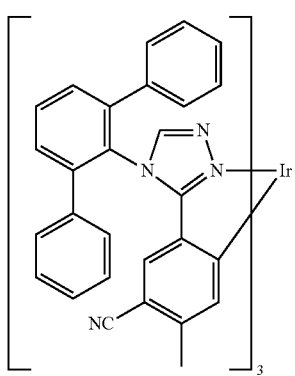
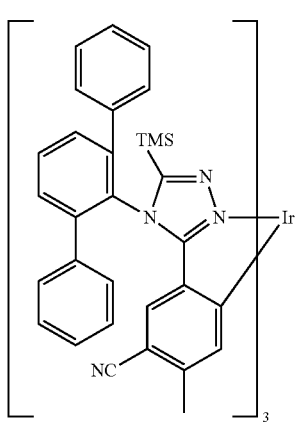
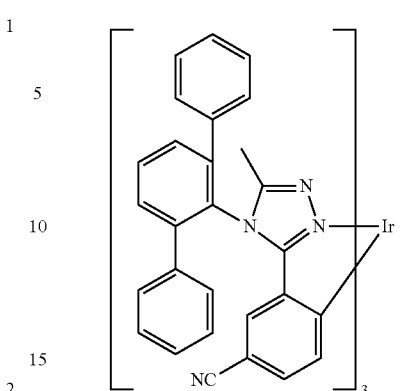
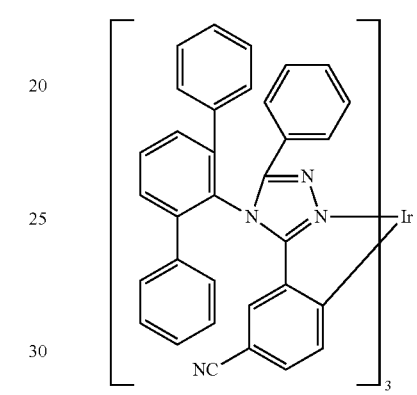
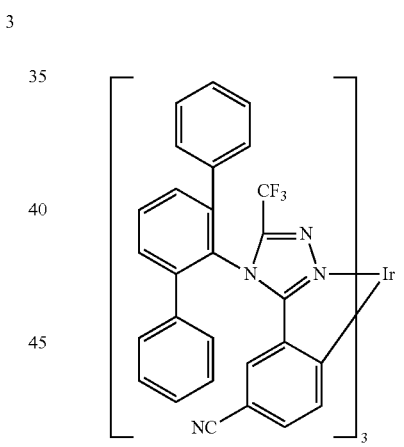
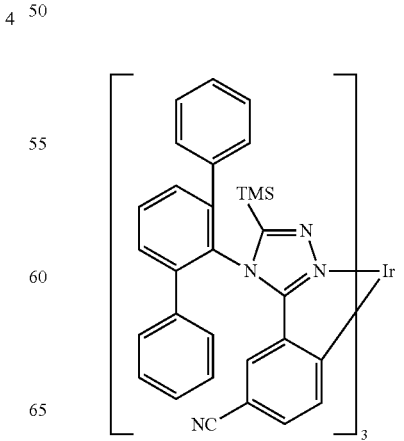

-continued

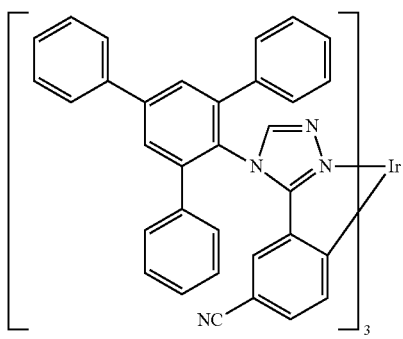

9

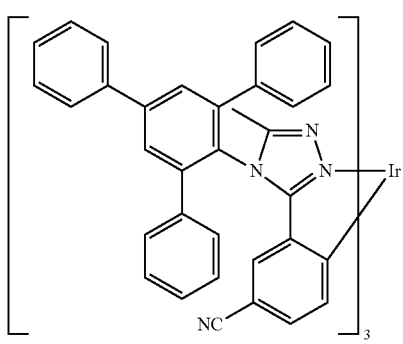

10

13. The organometallic compound of claim 1, wherein the organometallic compound has a natural population analysis (NPA) charge value of about 0.6 or less, and the NPA charge value is evaluated by a density functional theory (DFT) method using a Gaussian program that is structurally optimized at a level of B3LYP/6-31G(d,p).

14. The organometallic compound of claim 1, wherein the organometallic compound has an NPA charge value of about 0.4 to about 0.55, and the NPA charge value is evaluated by a DFT method using a Gaussian program that is structurally optimized at a level of B3LYP/6-31G(d,p).

15. An organic light-emitting device comprising:
a first electrode;
a second electrode; and
an organic layer disposed between the first electrode and the second electrode, wherein the organic layer comprises an emission layer,
wherein the organic layer comprises at least one of the organometallic compound of claim 1.

16. The organic light-emitting device of claim 15, wherein the emission layer comprises the organometallic compound or the composition.

17. The organic light-emitting device of claim 16, wherein the emission layer further comprises a host.

18. The organic light-emitting device of claim 17, wherein the host is selected from the following compounds:

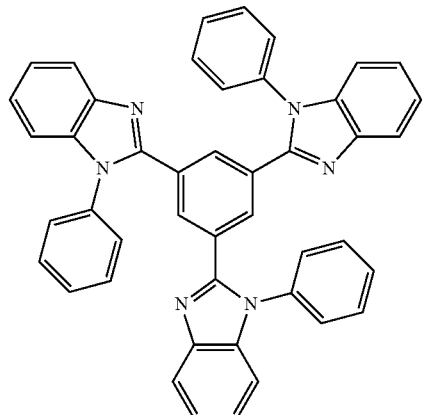

TPBi

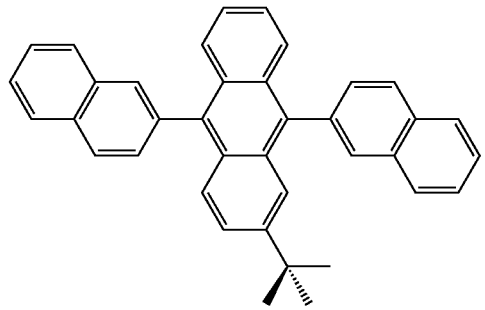

TBADN

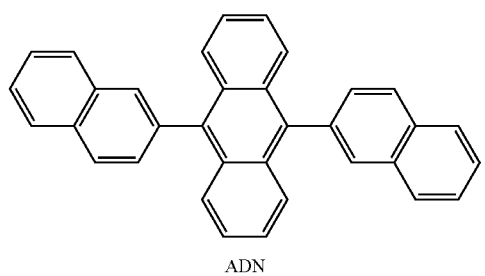

ADN

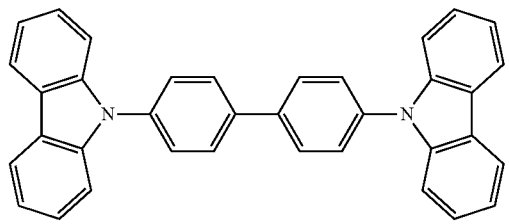

CBP

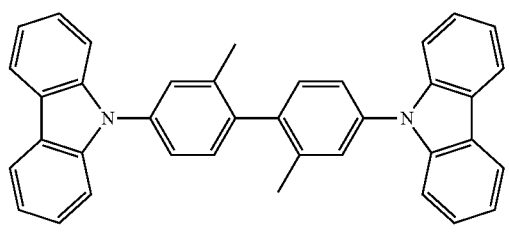

CDBP

-continued

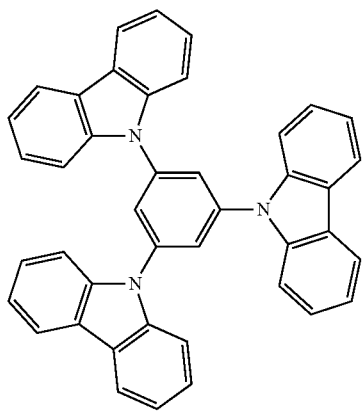

TCP

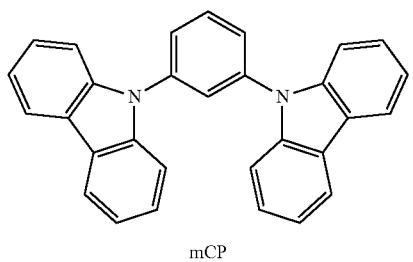

mCP

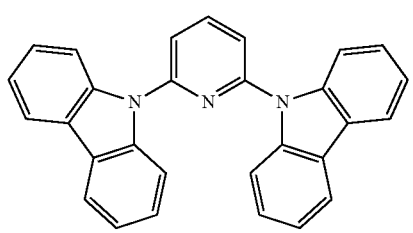

H50

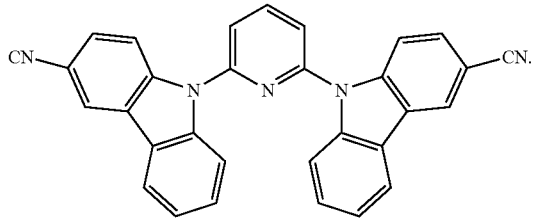

H51

19. A composition containing an organometallic compound, the composition comprising:
a first organometallic compound represented by Formula 1 and comprising at least one deuterium; and
a second organometallic compound represented by Formula 2:

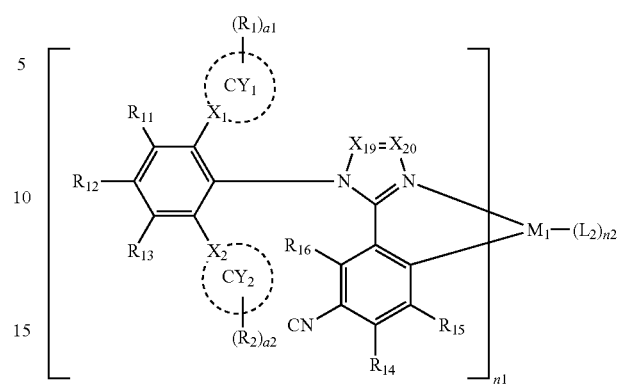

Formula 1

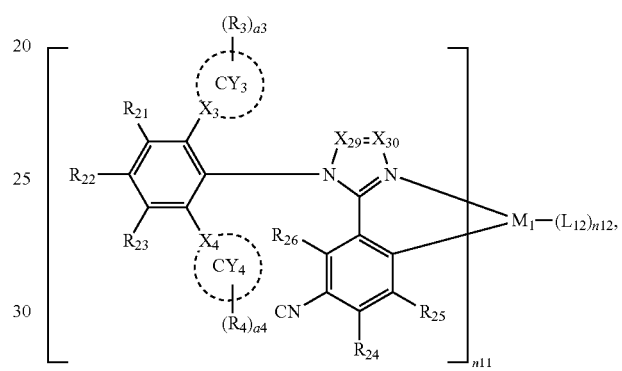

Formula 2 wherein, in Formulae 1 and 2,
$M_1$ and $M_{11}$ are each independently selected from a first-row transition metal of the Periodic Table of Elements, a second-row transition metal of the Periodic Table of Elements, and a third-row transition metal of the Periodic Table of Elements,
n1 and n11 are each independently 1, 2, or 3,
$L_2$ in Formula 1 is selected from ligands represented by Formulae 3A to 3C and 3E to 3F:

Formula 3A

Formula 3B

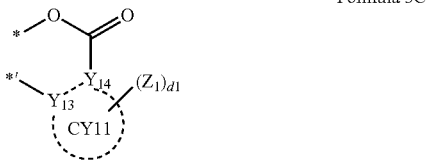

Formula 3C

Formula 3E

Formula 3F $L_{12}$ is a monodentate ligand or a bidentate ligand, n2 and n12 are each independently 0, 1, 2, 3, or 4, wherein, when n2 is two or more, two or more $L_2$ are identical to or different from each other, and when n12 is two or more, two or more groups $Li_2$ are identical to or different from each other, $X_1$ to $X_4$ are each independently carbon or nitrogen, $CY_1$ to $CY_4$ are each independently a $C_5$-$C_{30}$ carbocyclic group or a $C_2$-$C_{30}$ heterocyclic group, $X_{19}$ is N or $C(R_{19})$, and $X_{20}$ is N or $C(R_{20})$, provided that at least one of $X_{19}$ and $X_{20}$ is N, $X_{29}$ is N or $C(R_{29})$, and $X_{30}$ is N or $C(R_{30})$, provided that at least one of $X_{29}$ and $X_{30}$ is N, $R_1$, $R_2$, $R_{11}$ to $R_{16}$, $R_{19}$, and $R_{20}$ are each independently selected from hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_1$-$C_{60}$ aryl group, a substituted or unsubstituted $C_1$-$C_{60}$ aryloxy group, a substituted or unsubstituted $C_1$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —Si$(Q_3)(Q_4)(Q_5)$, —$B(Q_6)(Q_7)$, and —$P(=O)(Q_8)(Q_9)$, two or more neighboring groups selected from $R_1$, $R_2$, $R_{11}$ to $R_{13}$, $CY_1$, and $CY_2$ are optionally linked to form a substituted or unsubstituted $C_5$-$C_{30}$ carbocyclic group or a substituted or unsubstituted $C_2$-$C_{30}$ heterocyclic group, a1 and a2 are each independently an integer from 0 to 5, i) $X_{19}$ is $C(R_{19})$, $X_{20}$ is N, and at least one of $R_1$, $R_2$, $R_{11}$ to $R_{16}$, and $R_{19}$ is a deuterium-containing substituent; ii) $X_{19}$ is N, $X_{20}$ is $C(R_{20})$, and at least one of $R_1$, $R_2$, $R_{11}$ to $R_{16}$, and $R_{20}$ is a deuterium-containing substituent; or iii) $X_{19}$ and $X_{20}$ are each N, and at least one of $R_1$, $R_2$, and $R_{11}$ to $R_{16}$ is a deuterium-containing substituent, $R_3$, $R_4$, $R_{21}$ to $R_{26}$, $R_{29}$, and $R_{30}$ are each independently selected from hydrogen, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_1$-$C_{60}$ aryl group, a substituted or unsubstituted $C_1$-$C_{60}$ aryloxy group, a substituted or unsubstituted $C_1$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —Si$(Q_3)(Q_4)(Q_5)$, —$B(Q_6)(Q_7)$, and —$P(=O)(Q_8)(Q_9)$, two or more neighboring groups selected from $R_3$, $R_4$, $R_{21}$ to $R_{23}$, $CY_3$, and $CY_4$ are optionally linked to form a substituted or unsubstituted $C_5$-$C_{30}$ carbocyclic group or a substituted or unsubstituted $C_2$-$C_{30}$ heterocyclic group, a3 and a4 are each independently an integer from 0 to 5, $R_3$, $R_4$, $R_{21}$ to $R_{26}$, $R_{29}$, and $R_{30}$ are each a deuterium-free substituent;

wherein, in Formulae 3A so 3C and 3E to 3F, $Y_{11}$ is selected from O, N, $N(Z_1)$, $P(Z_1)(Z_2)$, and $As(Z_1)(Z_2)$, $Y_{12}$ is selected from O, N, $N(Z_3)$, $P(Z_3)(Z_4)$, and $As(Z_3)(Z_4)$, $CY_{11}$ is a $C_2$-$C_{30}$ heterocyclic group, $T_{11}$ is selected from a single bond, a double bond, *—$C(Z_{11})(Z_{12})$—*', *—$C(Z_{11})=C(Z_{12})$—*', *=$C(Z_{11})$—*', *—$C(Z_{11})$=*', *=$C(Z_{11})$—$C(Z_{12})$=$C(Z_{13})$—*', *—$C(Z_{11})$=$C(Z_{12})$—$C(Z_{13})$=*', *—$N(Z_{11})$—*', and a substituted or unsubstituted $C_5$-$C_{30}$ carbocylic group, a11 is an integer from 1 to 10, $Y_{13}$ to $Y_{14}$ are each independently carbon (C) or nitrogen (N), $Y_{13}$ and $Y_{14}$ are linked via a single bond or a double bond, $CY_{12}$ and $CY_{13}$ are each independently a $C_5$-$C_{30}$ carbocyclic group or a $C_2$-$C_{30}$ heterocyclic group, $A_1$ is P or As, $Z_1$ to $Z_4$ and $Z_{11}$ to $Z_{13}$ are each independently selected from hydrogen, deuterium, —F, —Cl, —Br, —I, a hydroxyl group, a cyano group, a nitro group an amino group, an amidino group, a hydrazine group, a hydrazone group, a carboxylic acid group or a salt thereof, a sulfonic acid group or a salt thereof, a phosphoric acid croup or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a subsumed or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, $-N(Q_1)(Q_2)$, $-Si(Q_3)(Q_4)(Q_5)$, $-B(Q_6)(Q_7)$, and $-P(=O)(Q_8)(Q_9)$, $Q_1$ to $Q_9$ are each independently selected from hydrogen, deuterium, $-F$, $-Cl$, $-Br$, $-I$, a hydroxyl group, a cyano group, a nitro group an amino group, an amidino group, a hydrazine group, a hydrazone group, a carboxylic acid group or a salt thereof, a sulfonic acid group or a salt thereof a phosphoric acid group or a salt thereof a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkyenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$, heteroaryl group, a $C_1$-$C_{60}$ heteroaryloxy group, a $C_1$-$C_{60}$ heteroarylthio group, a $C_2$-$C_{60}$ heteroaralkyl group, a monovalent non-aromatic condensed polycyclic group, and a monovalent non-aromatic condensed heteropolycyclic group, d1 and d2 are each independently an integer from 0 to 10, and

* and *' each indicate a binding site to $M_1$ in Formula 1.

20. The composition of claim 9, wherein a deuteration rate represented by Equation 2 is about 50% or more:

$$\text{deuteration rate } (\%) = n_{D2}/(n_{H2}+n_{D2}) \times 100, \quad \text{Equation 2}$$

wherein, in Equation 2, $n_{H2}$ represents the sum of a total number of hydrogens included in deuterium-containing substituents in the first organometallic compound and a total number of hydrogens included in a deuterium-free substituent of the second organometallic compound corresponding to the deuterium-containing substituent in the first organometallic compound, and $n_{D2}$ represents a total number of deuterium atoms included in the deuterium-containing substituents in the first organometallic compound.

* * * * *